(12) United States Patent
Sawada et al.

(10) Patent No.: US 7,671,518 B2
(45) Date of Patent: Mar. 2, 2010

(54) PIEZOELECTRIC VIBRATOR, METHOD FOR ADJUSTING PIEZOELECTRIC VIBRATOR, PIEZOELECTRIC ACTUATOR, TIMEPIECE, AND ELECTRONIC DEVICE

(75) Inventors: Akihiro Sawada, Matsumoto (JP); Shigeaki Seki, Matsumoto (JP); Susumu Kayamori, Matsumoto (JP)

(73) Assignee: Seiko Epson Corporation, Tokyo (JP)

( * ) Notice: Subject to any disclaimer, the term of this patent is extended or adjusted under 35 U.S.C. 154(b) by 1058 days.

(21) Appl. No.: 11/350,044

(22) Filed: Feb. 9, 2006

(65) Prior Publication Data

US 2006/0175929 A1    Aug. 10, 2006

(30) Foreign Application Priority Data

Feb. 10, 2005 (JP) ............................. 2005-034211
Dec. 9, 2005 (JP) ............................. 2005-356637

(51) Int. Cl.
*H01L 41/047* (2006.01)
*H02N 2/08* (2006.01)

(52) U.S. Cl. ................. 310/365; 310/312; 310/323.06; 310/323.16; 310/323.17

(58) Field of Classification Search ................. 310/323.01–323.21, 365, 366, 312, 328
See application file for complete search history.

(56) References Cited

U.S. PATENT DOCUMENTS

| | | | | |
|---|---|---|---|---|
| 4,377,765 A | * | 3/1983 | Kogure et al. ................ | 310/312 |
| 6,414,569 B1 | | 7/2002 | Nakafuku | |
| 6,885,615 B1 | * | 4/2005 | Miyazawa et al. .......... | 368/255 |
| 2002/0121499 A1 | | 9/2002 | Bradley et al. | |

FOREIGN PATENT DOCUMENTS

| | | | |
|---|---|---|---|
| EP | 0938143 A | | 8/1999 |
| EP | 1300586 A | | 4/2003 |
| JP | 63-120508 A | | 5/1988 |
| JP | H06-204778 A | | 7/1994 |
| JP | H10-32445 A | | 2/1998 |
| JP | H10-146070 A | | 5/1998 |
| JP | 2003-133885 | * | 5/2003 |
| JP | 2004-166324 A | | 6/2004 |
| WO | WO00-38309 | * | 6/2000 |

OTHER PUBLICATIONS

Machine translation of JP 2003-133885 generated by the JPO, May 2003.*
Text of EP1075079 used as translation of WO2000-038309 from the EPO, Jun. 2000.*

* cited by examiner

*Primary Examiner*—Walter Benson
*Assistant Examiner*—Derek J Rosenau
(74) *Attorney, Agent, or Firm*—Global IP Counselors, LLP

(57) ABSTRACT

Piezoelectric vibrators provided with an electrode that includes a drive electrode and adjustment electrodes formed in advance on part of the electrode; the drive electrode and adjustment electrodes that are initially electrically connected to each other are electrically cutoff and insulated from each other by cutting conductive parts between the drive electrode and adjustment electrodes, or the mutually insulated drive electrode and adjustment electrodes are electrically connected using solder, a wire, or another electrically conductive member, whereby the characteristic frequencies are adjusted.

10 Claims, 33 Drawing Sheets

PIEZOELECTRIC VIBRATOR, METHOD FOR ADJUSTING PIEZOELECTRIC VIBRATOR, PIEZOELECTRIC ACTUATOR, TIMEPIECE, AND ELECTRONIC DEVICE

BACKGROUND OF THE INVENTION

1. Field of the Invention

The present invention relates to a piezoelectric vibrator that vibrates due to the application of voltage to a piezoelectric element, a method for adjusting this piezoelectric vibrator, a piezoelectric actuator that includes this piezoelectric vibrator, a timepiece, and an electronic device.

2. Description of the Related Art

In conventional practice, piezoelectric vibrators that use piezoelectric elements have been used in oscillators and actuators and the like in electronic circuits. In such piezoelectric vibrators, the characteristic frequency is determined by the characteristics and dimensions of the material, but the characteristic frequency in each individual vibrator must be adjusted because of the tendency of the characteristics of the piezoelectric material to be nonuniform, and because of the occurrence of errors in the working dimensions of the piezoelectric vibrators.

One known method of adjusting the characteristic frequency is a method of sequentially cutting off pieces of a rectangular piezoelectric element several dozen microns at a time from the end in the length direction with a laser (Prior Art 1). In other words, the characteristic frequency is adjusted by reducing the length of the piezoelectric element.

Another known practice is to adjust the characteristic frequency by coating the piezoelectric vibrator with paint (Prior Art 2). In this method, the position where the paint is applied and the amount applied are calculated based on the determined resonance frequency of the piezoelectric vibrator, and paint is repeatedly applied to the vibrator by a paint ejecting device until a specific resonance frequency is achieved.

In actuators that include a piezoelectric vibrator, part of the piezoelectric vibrator describes an elliptical trajectory consisting of both longitudinal vibration and bending vibration, and when the driven object is brought into contact with this elliptically moving portion and is driven, the characteristic frequencies of both the longitudinal vibration and bending vibration must be adjusted to reach a specific relationship in order to drive the object at a high efficiency while using the resonance at both the longitudinal vibration and the bending vibration. In view of this, it has been proposed that the difference in resonance frequencies of longitudinal vibration and bending vibration be adjusted by removing the frequency-adjusted portion provided to the outer periphery of the cylindrical vibrator and reducing the diameter of the vibrator by cutting, polishing, dissolving, or the like (Prior Art 3).

[Prior Art 1] Japanese Patent Application Laid-Open No. 6-204778 ([0018]-[0020], FIG. 1)

[Prior Art 2] Japanese Patent Application Laid-Open No. 10-32445 ([0011], FIG. 1)

[Prior Art 3] Japanese Patent Application Laid-Open No. 10-146070 ([0093], FIGS. 1 and 3)

However, with a method for varying the dimensions of the vibrator by cutting off pieces of the piezoelectric element as described in Prior Art 1, a large amount of energy is required, and the Q value and other such vibration characteristics may degrade due to the power or heat applied to the piezoelectric vibrator. Also, the cycle time increases because time is required to cut off pieces of the piezoelectric element. Furthermore, since many steps are required for adjustment and it is difficult to cut the material from the front side of the piezoelectric element irradiated with a laser beam to the reverse side with accurate dimensions, problems are encountered in which the characteristic frequency cannot necessarily be adjusted to the specified range and the amount of adjustment is nonuniform.

In Prior Art 3, problems are encountered with degradation in the vibration characteristics, increases in the cycle time, and nonuniformities in the adjusted amounts, similar to Prior Art 1. Particularly, it is difficult to drive the piezoelectric actuator in a stable manner because the characteristic frequencies of both longitudinal vibration and bending vibration must be maintained in order to obtain the desired elliptical trajectory, and the vibration characteristics are extremely nonuniform if the characteristic frequencies are even slightly nonuniform. This nonuniformity in the vibration characteristics poses a crucial problem, particularly in vibrators for low output.

In the method in Prior Art 2, it is difficult to control the amount of paint ejected, and therefore the amounts of paint are nonuniform among different piezoelectric vibrators, and the adjustment results have so far been unsatisfactory. Moreover, since the vibration characteristics may degrade with a greater amount of paint, problems have been encountered in that the amount of paint is limited and the characteristic frequencies can only be adjusted within an extremely small range.

In view of such problems, an object of the present invention is to provide a piezoelectric vibrator, a method for adjusting a piezoelectric vibrator, a piezoelectric actuator including a piezoelectric vibrator, a timepiece, and an electronic device, wherein the adjusted amounts of the characteristic frequencies can be ensured with little reduction in the vibration characteristics, the characteristic frequencies can be reliably adjusted by reducing nonuniformities in the adjusted amounts of the characteristic frequencies, and individual differences pertaining to the characteristic frequencies can thereby be eliminated, all with a simple configuration.

SUMMARY OF THE INVENTION

The piezoelectric vibrator of the present invention is a piezoelectric vibrator that includes a piezoelectric element provided with electrodes, and that vibrates due to the application of voltage to the electrodes, wherein the electrodes are configured from a drive electrode to which voltage is applied and an adjustment electrode adjacent to the drive electrode, the adjustment electrode has a conductive part that is conductive with the drive electrode in the portion adjacent to the drive electrode, and the characteristic frequency is adjusted by electrically cutting the conductive part between the drive electrode side and the adjustment electrode side.

According to this invention, initially, the adjustment electrode is mutually conductive with the drive electrode in the conductive part, but the adjustment electrode is separated from the drive electrode by disconnecting the conductive part on the basis of the results of inspecting the characteristics of the vibrator, and the characteristic frequency is adjusted by reducing the area to which voltage is applied in the piezoelectric element by providing insulation between the drive electrode and the adjustment electrode. Specifically, the adjustment electrode provided to part of the electrodes is the area for adjusting the characteristic frequency in the piezoelectric element, and this area provides the amount whereby the characteristic frequencies are adjusted according to the position, size, and range of the adjustment electrode in the piezoelectric element. The electrodes can easily be patterned with high precision by etching or screen printing techniques, and nonuniformities in the adjusted amounts of the characteristic frequencies in the individual piezoelectric vibrators can be reduced, because providing the accurately patterned adjustment electrode in advance allows the adjusted amounts to remain virtually unaffected irrespective of where the cut is made in the conductive part provided to the portion of the adjustment electrode adjacent to the drive electrode. Therefore, the characteristic frequencies can be reliably and simply adjusted because the adjusted amounts can be perceived in advance, and individual differences pertaining to the characteristic frequencies can be eliminated to greatly improve reliability.

The characteristic frequencies can be adjusted based on the results of determining the vibration characteristics of the piezoelectric vibrators incorporated into a device. The characteristic frequencies can thereby be adjusted in a state similar to their state of use according to factors such as the structure of the supporting member for the piezoelectric vibrator, the conditions under which the supporting member is fastened, and the effects of heat at the time of incorporation, which factors are the cause of varying the characteristic frequencies.

Since the characteristic frequencies are adjusted by cutting only the electrodes provided to the piezoelectric elements, the process is simpler, there is much less damage to the vibrators, and there is virtually no degradation in the Q value (vibration attenuation) or other such vibration characteristics compared to cases in which the piezoelectric elements themselves are cut. Also, since only the electrode portions are cut, the adjustments can be made in a shorter cycle time with less equipment expenditure even if an end mill or an ultrasonic cutter is used for cutting. Using a laser to cut the conductive part has advantages of being able to instantaneously cut the conductive part with no contact, and is suitable when the vibrator is adjusted after being incorporated into a device.

The drive electrode and the adjustment electrode can be formed by a process in which the electrode formed, for example, by plating or sputtering on the piezoelectric element is removed in a line pattern by etching or the like. After this removal, a small section remains of the portion where the drive electrode and the adjustment electrode are adjacent, and this section is preferably used as the conductive part. Thus, if the conductive part is made from this small section, the cutting process can be performed in a very short amount of time when the conductive part is disconnected for adjustment, and therefore degradation in the vibration characteristics can be avoided and the cycle time and costs required for adjustment can be further reduced.

The piezoelectric vibrator of the present invention is a piezoelectric vibrator that includes a piezoelectric element provided with electrodes, and that vibrates due to the application of voltage to the electrodes, wherein the electrodes are configured from a drive electrode to which voltage is applied and an adjustment electrode adjacent to the drive electrode with an interposed space, and the characteristic frequency is adjusted as a result of providing a conductive member between the drive electrode and the adjustment electrode and establishing conduction between the drive electrode and the adjustment electrode by means of the conductive member.

A solder, lead wire, bonding wire, conductive paste, or the like can be used as the conductive member.

According to this invention, initially, the adjustment electrode and the drive electrode are insulated, but if a conductive member is provided based on the results of inspecting the characteristics of the vibrator, the adjustment electrode is made conductive (shorted, short-circuited) with the drive electrode by means of the conductive member, and the adjustment electrode is included in the range of voltage application by the conduction between the adjustment electrode and the drive electrode, whereby the characteristic frequency is adjusted in the same manner as in the above-described invention. If a conductive member is provided between the adjustment electrode and the drive electrode, the effect of the installation arrangement of the conductive member on the adjusted amount is minimized by the accurate formation of the adjustment electrode as previously described, and nonuniformities in the adjusted amounts of the characteristic frequencies in each individual piezoelectric vibrator can therefore be reduced. Accordingly, the characteristic frequencies can be reliably adjusted, and individual differences pertaining to characteristic frequencies can be eliminated to greatly improve reliability.

Also, since the characteristic frequencies are thus adjusted by establishing conduction between the electrodes provided to the piezoelectric elements, the process is simpler, there is much less damage to the vibrators, and there is virtually no degradation in vibration characteristics compared to cases in which the piezoelectric elements themselves are cut. The time cycle can then be shortened and equipment expenditures can be reduced.

The characteristic frequencies can be adjusted by cutting the conductive part as previously described while at the same time establishing conduction (shorting) between the drive electrode and the adjustment electrode described herein. For example, conduction can be established again between the drive electrode and the adjustment electrode using the conductive part after the conductive part is cut to insulate the drive electrode and the adjustment electrode.

In the piezoelectric vibrator of the present invention, it is preferable that a plurality of adjustment electrodes be provided.

According to this invention, adjustment electrodes are appropriately selected from the plurality of adjustment electrodes to be cut or shorted as previously described, whereby the characteristic frequencies can be adjusted in stages by the number of selected adjustment electrodes. The plurality of adjustment electrodes are disposed in alignment in a specific direction, for example, and the direction in which the adjustment electrodes are aligned is determined according to the direction of the longitudinal vibration, bending vibration, or other such characteristic vibration, for example.

The characteristic frequencies can be brought nearer to a stipulated value with a reduction in the adjusted amount provided by the adjustment electrodes, and a larger adjusted amount can be ensured as the number of adjustment electrodes is increased. Since the characteristic frequencies are adjusted in stages by these adjustment electrodes, the precision and yield rate of adjustment can be improved.

As previously described, since the effects that cutting and shorting have on the adjusted amounts are minimal and nonuniformities in the adjusted amounts are also small in the individual piezoelectric vibrators, nonuniformities are reduced even if the adjusted amounts of the selected adjustment electrodes accumulate, and the adjusted amounts in each stage of adjustment are in a specified range for each individual vibrator. Thereby, the characteristic frequencies can be simply and reliably adjusted in stages merely by selecting the adjustment electrodes.

In the piezoelectric vibrator of the present invention, it is preferable that the vibration trajectory be switched among a plurality of mutually differing operating modes, the piezoelectric element have a plurality of adjustment areas which are provided for each operating mode and in which voltage application and voltage non-application are switched according to the operating mode, the drive electrodes and the adjustment electrodes be provided individually to the adjustment areas, and the characteristic frequencies be adjusted in each operating mode.

According to this invention, the desired vibration characteristics can be achieved for each operating mode because the characteristic frequencies can be adjusted to specific stipulated values in each operating mode.

In the piezoelectric vibrator of the present invention, it is preferable that the vibration trajectory be switched among a plurality of mutually differing operating modes, the piezoelectric element have a plurality of adjustment areas which are provided for each operating mode and in which voltage application and voltage non-application are switched according to the operating mode, the drive electrodes and the adjustment electrodes be provided individually to the adjustment areas, and the difference in characteristic frequencies between the operating modes be adjusted by adjusting the characteristic frequencies.

According to this invention, since the difference in characteristic frequencies between the operating modes is adjusted, nonuniformities in vibration characteristics between the operating modes are eliminated, and it is possible to allow for differences in specific vibration characteristics between the operating modes.

In the vibrator of the present invention, it is preferable that the vibrator be substantially rectangular when viewed in a plane and perform longitudinal vibration and bending vibration, and the adjustment area corresponding to one operating mode and the adjustment area corresponding to the other operating mode be disposed in line symmetry in relation to a center line running in the longitudinal direction that passes through the centroid of the vibrator.

According to this invention, combining longitudinal vibration and bending vibration makes it possible to induce elliptical movement in part of the piezoelectric vibrator, the vibration trajectory can be switched by using the adjustment areas disposed in line symmetry in relation to the center line in the longitudinal direction of the vibrator in different ways according to the modes, and an elliptical movement can be created in which the trajectories are in line symmetry in relation to a center line in the longitudinal direction of the vibrator in one mode and the other mode, and the rotation occurs in opposite directions. Thereby, in the case of an actuator that transmits elliptical vibration in the piezoelectric vibrator to a driven object, the driven object can be driven in a specific forward direction and also can be driven in the direction opposite this forward direction by switching the trajectory and orientation of the elliptical movement. It can herein be assumed that the first operating mode is the forward-direction driving mode, and the second operating mode is the reverse-direction driving mode.

Since the adjustment area used during the first operating mode and the adjustment area used during the second operating mode are disposed in line symmetry in relation to a center line running in the longitudinal direction of the vibrator, the elliptical trajectory in the first operating mode and the elliptical trajectory in the second operating mode can be made to be symmetrical to each other, and the driving properties in both modes can be made to be substantially equal.

Also, since the adjustment areas in both operating modes are disposed in line symmetry, there is no need to separately determine the adjusted amounts of the characteristic frequencies in each of the operating modes. For example, determining the adjusted amount of the characteristic frequency in the adjustment area used during the first operating mode on the basis of a sample of the piezoelectric vibrator makes it possible to use this adjusted amount as the adjusted amount of the characteristic frequency in the adjustment area used during the second operating mode, and adjusting the characteristic frequency can therefore be simplified.

In the piezoelectric vibrator of the present invention, it is preferable that the piezoelectric vibrator vibrate in a plurality of vibrating modes, and the difference in the resonance frequencies among the plurality of vibrating modes be adjusted by adjusting the characteristic frequencies.

According to this invention, the difference in resonance frequencies in the plurality of vibrating modes is adjusted so as to maintain the desired amplitude in these vibrating modes, whereby elliptical movement can be achieved in part of the piezoelectric vibrator. Specifically, if the difference in resonance frequencies among the plurality of vibrating modes is too great, the effects of inducing bending vibration or other such secondary vibration due to longitudinal vibration or other such primary vibration, or the effects of inducing other primary vibration due to the first primary vibration may weaken, making it impossible to achieve elliptical movement. Conversely, if the difference in resonance frequencies between these vibrations is too small, it is difficult to control the frequencies because the drive frequency range is too small, and operation tends to be unstable. However, the trajectory of the elliptical movement can be made constant in each individual vibrator by appropriately adjusting the difference in resonance frequencies. A piezoelectric vibrator that fulfills specific vibration characteristics can thereby be supplied in a stable manner.

Also, since the driven object is driven with high efficiency by bringing the portion that describes an elliptical trajectory in the vibrator into contact with the driven object, the piezoelectric vibrator described herein can be used as an actuator.

As previously described, switching between application and non-application of voltage to the plurality of adjustment areas results in adjusting the difference in resonance frequencies among the plurality of vibrating modes for each operating mode when operating in the plurality of operating modes.

Also, when operating in the plurality of operating modes in this manner, and furthermore, when the difference in characteristic frequencies between the operating modes is adjusted, the difference in resonance frequencies of the plurality of vibrating modes between the operating modes may be adjusted.

In the piezoelectric vibrator of the present invention, it is preferable that the piezoelectric vibrator be formed into a plate shape and vibrate so that longitudinal vibration and bending vibration are superposed, and the difference in resonance frequencies in the longitudinal vibration and the bending vibration be adjusted by adjusting the characteristic frequencies.

As a result of stretching and compressing the piezoelectric element by applying voltage, the plate-shaped vibrator is caused to perform longitudinal vibration and bending vibration, and part of the vibrator moves in an elliptical trajectory when the longitudinal vibration and bending vibration both occur at each characteristic frequency.

According to this invention, the piezoelectric vibrator can be made thinner by forming the piezoelectric vibrator into a plate shape, and the thickness of the device into which the piezoelectric vibrator is incorporated can also be reduced.

Also, the difference between the resonance frequency in longitudinal vibration and the resonance frequency in bending vibration is adjusted so as to ensure the desired amplitude in both longitudinal vibration and bending vibration, whereby elliptical movement can be achieved in part of the piezoelectric vibrator. Specifically, if the difference between the resonance frequency in longitudinal vibration and the resonance frequency in bending vibration is too great, the effects of inducing bending vibration as secondary vibration may weaken, making it impossible to achieve elliptical movement. Conversely, if the difference between the resonance frequencies in longitudinal vibration and bending vibration is too small, it is difficult to control the frequencies because the drive frequency range is too small, and operation tends to be unstable. However, the trajectory of the elliptical movement can be made constant in each individual vibrator by appropriately adjusting the difference between resonance frequencies in longitudinal vibration and bending vibration. A piezoelectric vibrator that fulfills specific vibration characteristics can thereby be supplied in a stable manner.

If at least one of the characteristic frequencies of longitudinal vibration and bending vibration is adjusted, the difference in resonance frequencies between longitudinal vibration and bending vibration is adjusted. When the vibration frequencies of both longitudinal vibration and bending vibration are adjusted separately, labor is required and the vibration characteristics are markedly nonuniform if the resonance frequencies are even slightly nonuniform, and adjustment cannot be performed quickly, whereas when one characteristic frequency of either longitudinal vibration or bending vibration is adjusted, the result is that adjustment of the characteristic frequencies in longitudinal vibration and bending vibration is simply and quickly achieved.

Since the driven object is driven with high efficiency by bringing the portion of the vibrator that describes an elliptical trajectory into contact with the driven object, a highly efficient actuator that incorporates the piezoelectric vibrator can be achieved.

In the piezoelectric vibrator of the present invention, it is preferable that the piezoelectric vibrator be substantially rectangular when viewed in a plane, and the adjustment electrodes be provided to diagonal positions in the planar substantial rectangle.

According to this invention, a balance in vibration in the piezoelectric vibrator can be preserved by providing adjustment electrodes to diagonal positions in the rectangle.

In the piezoelectric vibrator of the present invention, it is preferable that the conductive part be cut by Joule heat generated when an electric current is passed through the piezoelectric vibrator.

The conductive part is hereby melted by Joule heat that arises due to the electrical resistance of the conductive part. The melting is instantaneous, and conduction is terminated if attempted simultaneously with the melting.

According to this invention, the conductive part is locally and instantaneously cut by using Joule heat, the load on the piezoelectric vibrator is extremely small, and therefore degradation in the vibration characteristics can be reliably prevented. Furthermore, operating efficiency can be satisfactory because the terminal of the electric current application device or the like can be brought into contact with the drive electrode side and the adjustment electrode side, with the conductive part positioned therebetween, to enable stable disconnection without contact with the conductive part. Also, reliability can be improved because the characteristics of the piezoelectric element are not affected by the shavings formed when the conductive part is cut off by a mill or a cutter, or by the heat generated when the conductive part is cut off by a laser. Furthermore, equipment expenditures can be greatly reduced compared to cutting with a laser, because cutting can be performed with a constant-voltage power source with a simple structure.

The method for adjusting a piezoelectric vibrator of the present invention is a method for adjusting the characteristic frequency of a piezoelectric vibrator that includes a piezoelectric element provided with electrodes, and that vibrates due to the application of voltage to the electrodes, wherein the electrodes are configured from a drive electrode to which voltage is applied and an adjustment electrode adjacent to the drive electrode, and the characteristic frequency is adjusted by electrically cutting off the drive electrode from the adjustment electrode, or establishing conduction between the adjustment electrode and the drive electrode.

According to this invention, the area in which voltage is applied in the piezoelectric element is varied to adjust the characteristic frequency by insulating the adjustment electrode from the drive electrode or making the adjustment electrode conductive with the drive electrode on the basis of the results of inspecting the characteristics of the vibrator. As previously described, the adjustment electrode is provided in advance and this adjustment electrode is easily patterned with high precision. Also, insulating the adjustment electrode from the drive electrode or making the adjustment electrode conductive with the drive electrode is ultimately limited to working the surface layer of the vibrator, and therefore nonuniformities in the characteristic frequencies between individual piezoelectric vibrators can be reduced without affecting the adjusted amounts of the characteristic frequencies. The characteristic frequencies can thereby be reliably adjusted.

Also, only the electrodes provided to the piezoelectric element are worked, and the piezoelectric element as such is not worked. Therefore, the process is simplified and damage to the vibrator can be greatly reduced. Also, the cycle time can be shortened and equipment expenditures can be reduced.

In the method for adjusting a piezoelectric vibrator of the present invention, it is preferable that the piezoelectric vibrator be adapted to operate in a plurality of operating modes with different vibrating trajectories by providing the piezoelectric element with a plurality of adjustment areas and switching between voltage application and voltage non-application to the adjustment areas, drive electrodes and adjustment electrodes be provided individually to the adjustment areas, and the characteristic frequencies be adjusted for each operating mode.

According to this invention, the desired vibration characteristics can be achieved for each operating mode because the characteristic frequency is adjusted to a specific stipulated frequency in each operating mode.

In the method for adjusting a piezoelectric vibrator of the present invention, it is preferable that the piezoelectric vibrator be adapted to operate in a plurality of operating modes with different vibrating trajectories by providing the piezoelectric element with a plurality of adjustment areas and switching between voltage application and voltage non-application to the adjustment areas, drive electrodes and adjustment electrodes be provided individually to the adjustment areas, and the characteristic frequencies be adjusted by adjusting the difference in characteristic frequencies between the operating modes.

According to this invention, since the difference in characteristic frequencies between the operating modes is adjusted, nonuniformities in vibration characteristics between the operating modes are eliminated, and it is possible to allow for differences in specific vibration characteristics between the operating modes.

In the method for adjusting a piezoelectric vibrator of the present invention, it is preferable that the piezoelectric vibrator vibrate in a plurality of vibrating modes, and the characteristic frequency be adjusted by adjusting the difference in resonance frequencies among the plurality of vibrating modes.

According to this invention, the difference in resonance frequencies in the plurality of vibrating modes is adjusted so as to ensure the desired amplitude in these vibrating modes, whereby elliptical movement can be achieved in part of the piezoelectric vibrator. Specifically, if the difference in resonance frequencies among the plurality of vibrating modes is too great, the effects of inducing bending vibration or other such secondary vibration due to longitudinal vibration or other such primary vibration, or the effects of inducing other primary vibration due to the first primary vibration may weaken, making it impossible to achieve elliptical movement. Conversely, if the difference in resonance frequencies between these vibrations is too small, it is difficult to control the frequencies because the drive frequency range is too small, and operation tends to be unstable. However, the trajectory of the elliptical movement can be made constant in each individual vibrator by appropriately adjusting the difference in resonance frequencies. A piezoelectric vibrator that fulfills specific vibration characteristics can thereby be supplied in a stable manner.

Also, since the driven object is driven with high efficiency by bringing the portion that describes an elliptical trajectory in the vibrator into contact with the driven object, the piezoelectric vibrator described herein can be used as an actuator.

As previously described, switching between application and non-application of voltage to the plurality of adjustment areas results in adjusting the difference in resonance frequencies among the plurality of vibrating modes for each operating mode when operating in the plurality of operating modes.

Also, when operating in the plurality of operating modes in this manner, and furthermore, when the difference in characteristic frequencies between the operating modes is adjusted, the difference in resonance frequencies of the plurality of vibrating modes between the operating modes may be adjusted.

In the method for adjusting a piezoelectric vibrator of the present invention, it is preferable that the adjustment electrode and the drive electrode be cut by passage of an electric current through the piezoelectric vibrator and generation of Joule heat.

According to this invention, the conductive part can be reliably cut by using Joule heat regardless of whether the load on the vibrator is extremely small, and reliability can be improved. Furthermore, since equipment expenditures are greatly reduced compared to when a laser is used, it is possible to provide an extremely effective method for cutting the electrodes.

The piezoelectric actuator of the present invention includes the above-described piezoelectric vibrator or a piezoelectric vibrator adjusted by the previously described adjustment method, and a driven object that is driven by the vibration of this piezoelectric vibrator.

According to this invention, including the above-described piezoelectric vibrator makes it possible to achieve the same operations and effects as those previously described. Specifically, it is possible to incorporate the characteristic frequency of the piezoelectric vibrator in a simple manner, and it is therefore possible to provide an actuator that exhibits highly efficient drive properties according to various drive conditions with stable quality.

Also, the desired elliptical movement in the section of contact of the piezoelectric vibrator with the driven object can be achieved and drive efficiency can be improved by adjusting the difference in characteristic frequencies among the plurality of vibrating modes as previously described.

In the piezoelectric actuator of the present invention, it is preferable that the driven object be driven in both a forward direction and a reverse direction in which the vibration trajectories of the piezoelectric vibrator are mutually different by switching the voltage application to the plurality of adjustment areas provided to the piezoelectric element, and the drive properties during driving in the forward direction and the drive properties during driving in the reverse direction be both adjusted by adjusting the characteristic frequency.

According to this invention, the characteristic frequency of the piezoelectric vibrator is adjusted during each driving in the forward direction and each driving in the reverse direction, and therefore the desired drive characteristics can be achieved during both driving in the forward direction and driving in the reverse direction.

Possible examples of elements that exhibit these drive characteristics include the electric current value of the piezoelectric element, the amount by which the driven object moves, and other such elements.

In the piezoelectric actuator of the present invention, it is preferable that the driven object be driven in both a forward direction and a reverse direction in which the vibration trajectories of the piezoelectric vibrator are mutually different by switching the voltage application to the plurality of adjustment areas provided to the piezoelectric element, and the difference between the drive properties during driving in the forward direction and the drive properties during driving in the reverse direction be adjusted by adjusting the characteristic frequency.

According to this invention, the difference in characteristic frequencies between driving in the forward direction and driving in the reverse direction is adjusted with each characteristic frequency of the piezoelectric vibrator, and it is therefore possible to eliminate nonuniformities in the drive characteristics arising between driving in the forward direction and driving in the reverse direction, and to create a difference in specific drive characteristics between driving in the forward direction and driving in the reverse direction.

The timepiece of the present invention includes the above-described piezoelectric actuator.

According to this invention, including the above-described piezoelectric actuator makes it possible to achieve the same operations and effects as those previously described.

The piezoelectric actuator can be incorporated into a calendar drive mechanism, for example. In this case, a gear is driven by a rotor that is turned by the vibration of the piezoelectric vibrator, and the date, month, and day can be displayed by the movement of a pointer by means of this gear. Accurate pointer movement is thereby simply obtained, and excellent productivity is achieved because the piezoelectric vibrator can be quickly adjusted. Moreover, it is possible to achieve the advantages of the piezoelectric actuator, namely, the lack of magnetic effects, the possibility of high responsiveness and low feed rate, the merits of small and thin size, high torque, and other such factors.

The electronic device of the present invention includes the above-described piezoelectric vibrator or a piezoelectric vibrator adjusted by the adjustment method previously described.

Here, the piezoelectric vibrator can be used as an oscillator installed in the circuit board of an electronic device, the zoom mechanism or auto-focus mechanism of a camera, and the like.

According to this invention, including the above-described piezoelectric vibrator makes it possible to achieve the same operations and effects as those previously described. Specifically, it is possible to provide an electronic device with excellent reliability because the characteristic frequencies of the piezoelectric vibrator are simply and reliably adjusted.

A piezoelectric vibrator can be provided by a simple method wherein an adjustment electrode for adjusting the area to which voltage is applied is provided in advance to part of the electrodes of the piezoelectric element, and either electricity is cut off between the adjustment electrode and a drive electrode to which voltage is applied, or the adjustment electrode is made conductive with the drive electrode to adjust the characteristic frequencies, whereby there is virtually no degradation in the vibration characteristics, the characteristic frequencies can be reliably adjusted with little non-uniformity in the adjusted amounts of the characteristic frequencies, and individual differences pertaining to the characteristic frequencies can be eliminated.

DESCRIPTION OF THE PREFERRED EMBODIMENTS

First Embodiment

Figure 1:
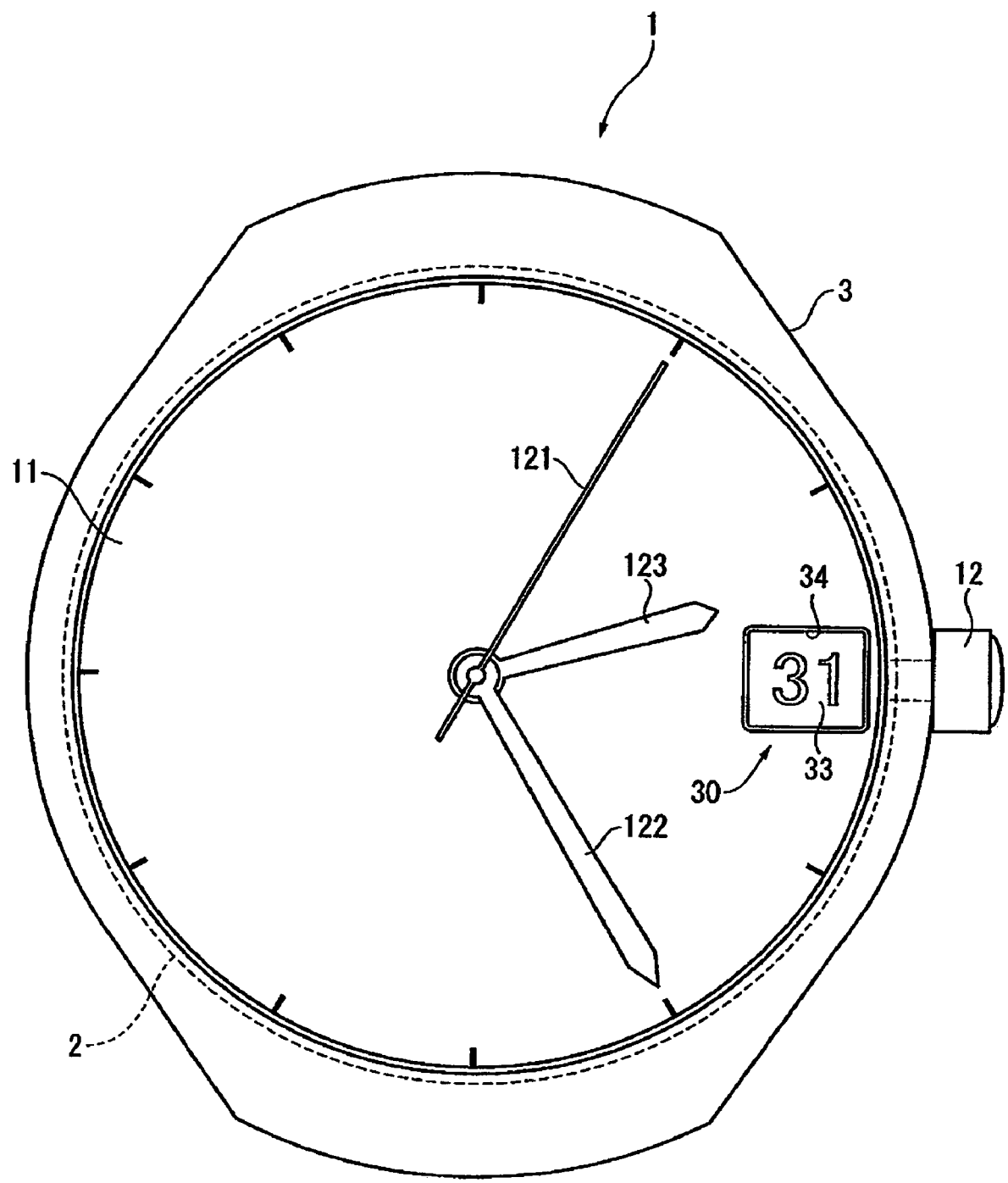
FIG. 1 is an external view of a timepiece in the first embodiment of the present invention.

The first embodiment of the present invention will now be described with reference to the diagrams.

In the descriptions of the second and subsequent embodiments, components similar to those of the first embodiment described below are denoted by the same reference numerals, and descriptions thereof are omitted or simplified.

(1. Schematic Configuration of Timepiece)

FIG. 1 is an external view of a timepiece 1 in the present embodiment.

The timepiece 1 is a wristwatch (watch) that includes a movement 2 as a drive device, and a case 3 for housing the movement 2. The type of this timepiece is an electronic timepiece (quartz), and the timepiece 1 of the present embodiment is configured as an analog quartz, with a dial 11 and a crown 12 mounted on the movement 2. A seconds hand 121, minute hand 122, and hour hand 123 are provided substantially in the middle of the dial 11. A substantially rectangular window 34 is provided in the 3:00 position of the dial 11, and the date (calendar) printed on a date indicator 33 is sequentially displayed through the window 34 by means of the rotation of the date indicator 33 provided on the back side of the dial 11.

The configuration for driving the seconds hand 121, the minute hand 122, and the hour hand 123 is similar to a normal analog quartz configuration, and includes a circuit board having a liquid crystal oscillator incorporated therein; a stepping motor having a coil, a stator, and a rotor; a drive train wheel; and a battery 24 (FIG. 2) as a power source. In this configuration, the stepping motor is driven by pulse signals generated by the liquid crystal oscillator and divided by means of a circuit block. The drive force of the stepping motor is then transmitted to the drive train wheel, whereby the seconds hand 121, the minute hand 122, and the hour hand 123 are driven. The number of stepping motors is not limited; for example, one may be provided for driving the seconds hand 121, and one may be provided for driving both the minute hand 122 and the hour hand 123, for a total of two stepping motors.

(2. Structure of Date Display Device)

Figure 2:
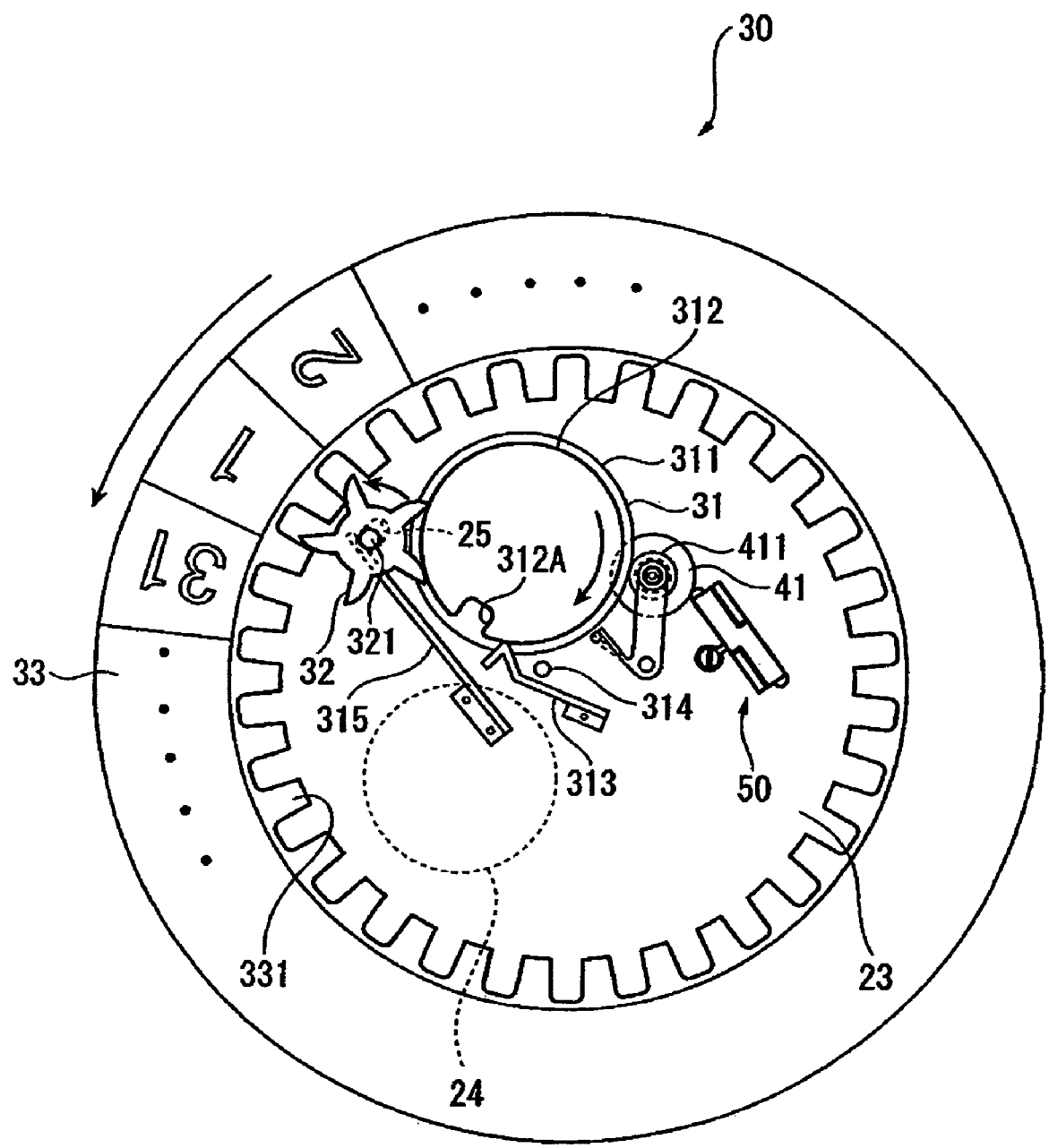
FIG. 2 is a plan view showing the date display device incorporated into the movement of the timepiece in the same embodiment.
Figure 3:
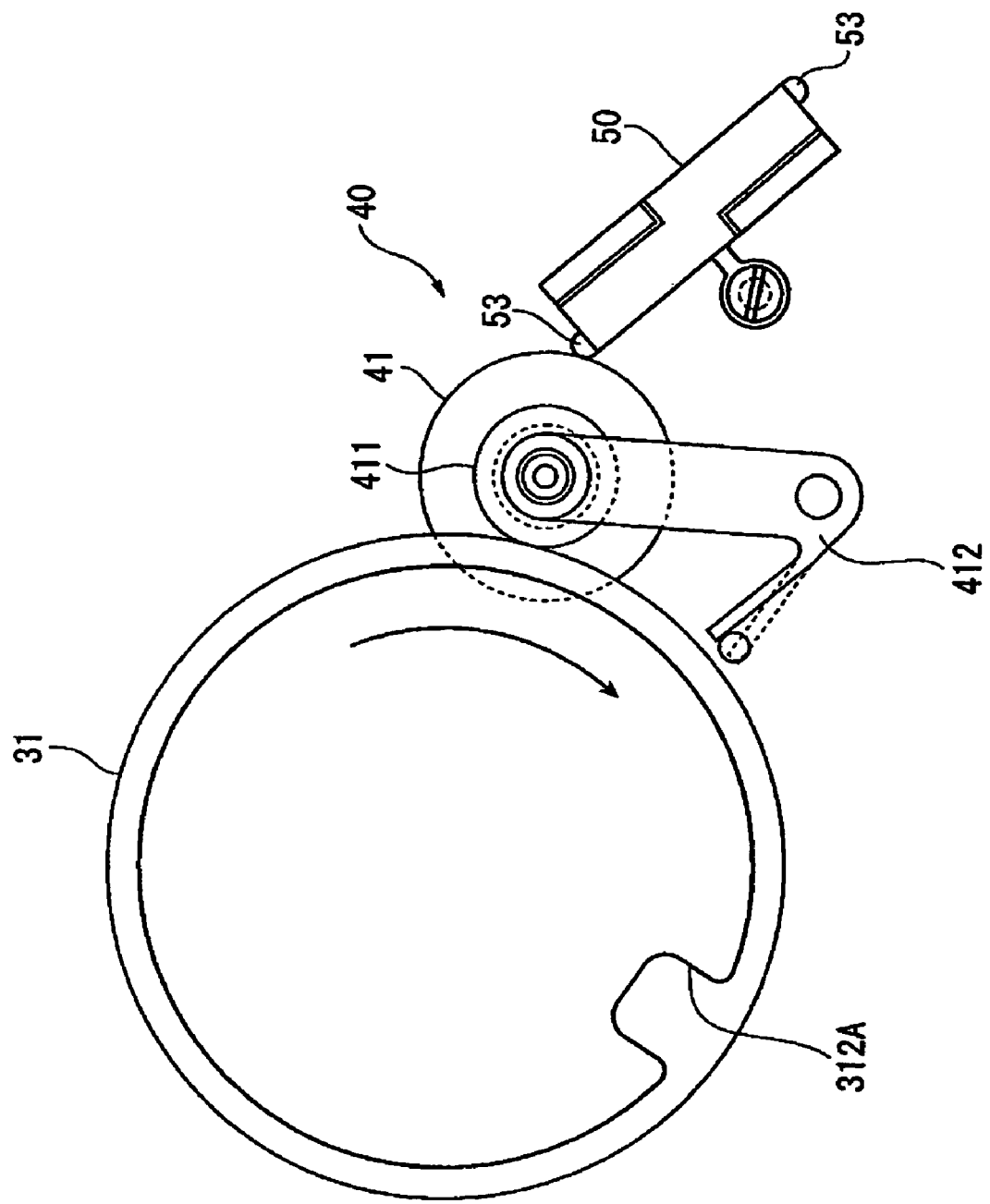
FIG. 3 is a partial enlarged view of FIG. 2, and is a plan view showing a piezoelectric actuator in the same embodiment.

FIG. 2 is a plan view of the movement 2 as seen from the dial 11 side, with a date display device 30 incorporated in the movement 2 shown herein. FIG. 3 is a partial enlarged view of FIG. 2.

The date display device 30 is configured from the above-described window 34 (FIG. 1), the date indicator 33, and an actuator 40 for driving the date indicator 33 via a date turning intermediate wheel 31 and a date turning wheel 32 as a reducing train wheel. The piezoelectric actuator 40, the date turning intermediate wheel 31, the date turning wheel 32, and the date indicator 33 are all provided on a main plate 23.

In FIG. 2, a battery 24 and a drive train wheel (not shown) that is connected to the stepping motor and that drives the pointers are provided on the back side of the main plate 23. The battery 24 supplies electricity to the stepping motor, the piezoelectric actuator 40, and the circuits of a printing device (not shown).

The date turning intermediate wheel 31 is configured from a large wheel 311 and a small wheel 312. The small wheel 312 has a cylindrical shape slightly smaller than the large wheel 311, and has a notch 312A with a substantially rectangular shape formed in the outer peripheral surface. The small wheel 312 is affixed so as to share a center with the large wheel 311. A gear 411 on top of a rotor 41 is meshed with the large wheel 311, and the date turning intermediate wheel 31 rotates in conjunction with the rotation of the rotor 41.

A plate spring 313 is provided on the main plate 23 on the side of the date turning intermediate wheel 31, and the proximal end of this plate spring 313 is fastened to the main plate 23, while the distal end is formed to be bent into a substantial V shape. The distal end of the plate spring 313 is provided to be capable of being inserted and withdrawn from the notch 312A of the date turning intermediate wheel 31. A contact 314 is disposed at a position near the plate spring 313, and this contact 314 is designed to come into contact with the plate spring 313 when the date turning intermediate wheel 31 rotates and the distal end of the plate spring 313 fits into the notch 312A. When a specific voltage is applied to the plate spring 313 and the plate spring comes into contact with the contact 314, the voltage is also applied to the contact 314. Consequently, the date turning state can be determined and the amount by which the date indicator 33 rotates in one day can be determined by determining the voltage of the contact 314.

The amount by which the date indicator 33 rotates is not limited to the use of the plate spring 313 or the contact 314, and another possibility is to utilize a component that determines the rotating state of the rotor 41 or the date turning intermediate wheel 31 and outputs specific pulse signals; specifically, a conventional photoreflector, a photointerrupter, an MR sensor, or other such various rotating encoders or the like.

The date turning wheel 32 has five gears and is meshed with an inner gear 331 of the date indicator 33. A shaft 321 is provided in the center of the date turning wheel 32, and this shaft 321 is inserted through a hole 25 formed in the main plate 23. The hole 25 is formed along the circumferential direction of the date indicator 33. The date turning wheel 32 and the shaft 321 are then urged upward and to the right in FIG. 2 by a plate spring 315 fastened to the main plate 23. The date indicator 33 is also prevented from wobbling by the urging action of the plate spring 315.

The date indicator 33 is a ring-shaped gear disposed on the outer periphery of the movement 2, and has an inner gear 331 formed in the inner periphery and makes one rotation every 31 days. The numerals "1" through "31" are printed around the edge of the date indicator 33.

The piezoelectric actuator 40 is configured from a rotor 41 for transmitting drive force to the date turning intermediate wheel 31, and a vibrator 50 for rotatably moving the rotor 41, as shown in FIG. 3.

The rotor 41 is disposed between the date turning intermediate wheel 31 and the vibrator 50, and is a diskoid rotating body that is turned by the changing of the date. A protuberance 53 on the vibrator 50 is in contact with the outer periphery of the rotor 41, whereby the vibration of the piezoelectric vibrator 50 is transmitted. The rotor 41 is urged towards the actuator 40 by a plate spring 412, and an appropriate frictional force is created between the protuberance 53 of the vibrator 50 and the side surface of the rotor 41, whereby the efficiency of transmitting the drive force of the piezoelectric actuator 40 becomes satisfactory.

(3. Structure of Vibrator)

Figure 4:
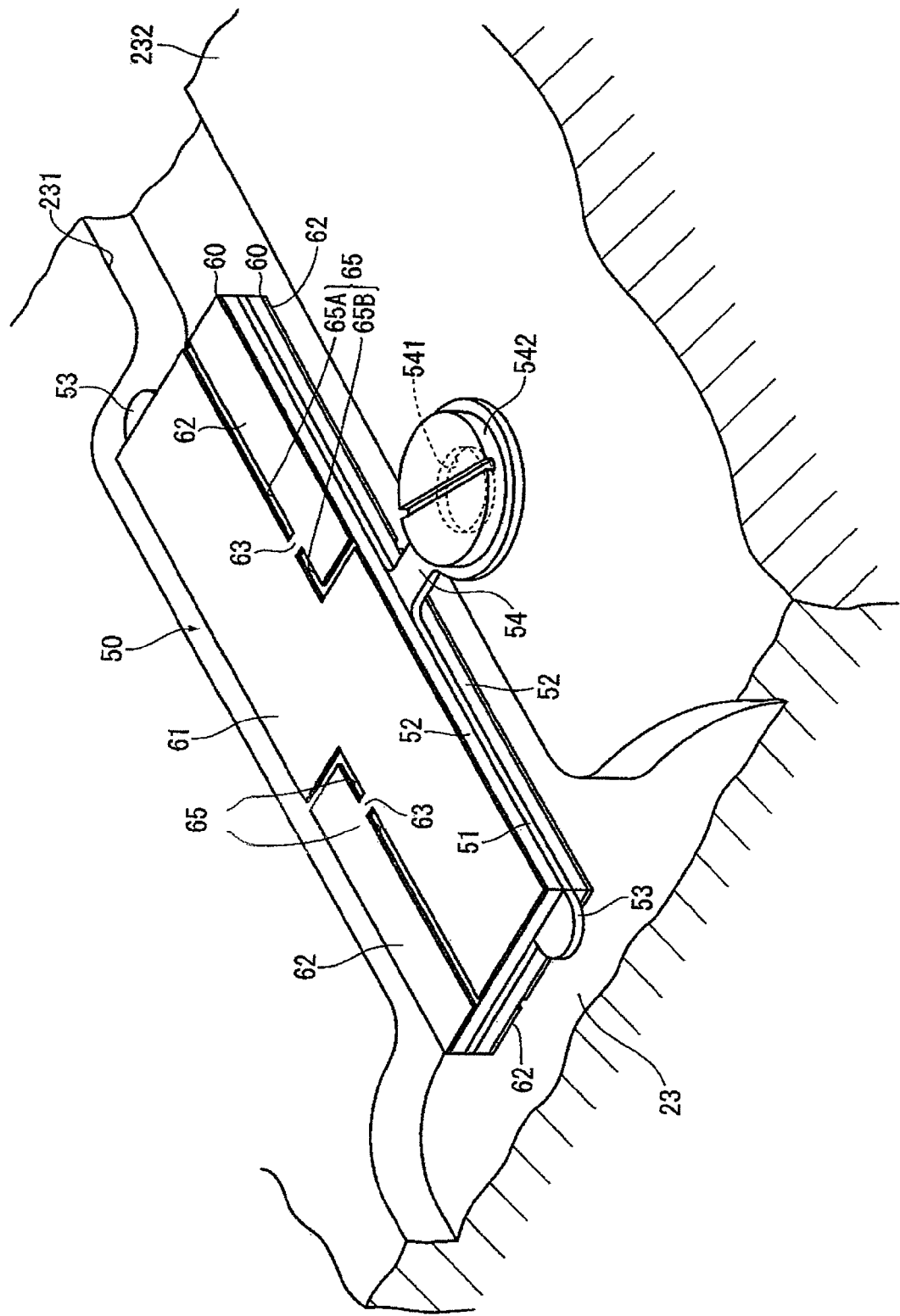
FIG. 4 is a perspective view of the piezoelectric vibrator in the same embodiment.

FIG. 4 is a diagram showing the vibrator 50.

The vibrator 50 includes a substantially rectangular reinforcing plate 51, and flat rectangular plate-shaped piezoelectric elements 52 provided to both the front and back sides of the reinforcing plate 51, wherein the reinforcing plate 51 and the piezoelectric elements 52 are stacked and are formed as a whole into a thin plate shape.

The reinforcing plate 51 is configured by rolling stainless steel or another such material, and on the widthwise sides, protuberances 53 in the shape of substantially arcuate convexities that are in contact with the rotor 41 are formed integrally with the rectangular portion. These protuberances 53 are formed at diagonal positions in the reinforcing plate 51.

Also, an arm 54 that protrudes in the width direction is formed integrally in substantially the middle of the lengthwise side of the reinforcing plate 51. The arm 54 extends at virtually a right angle to the longitudinal direction of the reinforcing plate 51, and a hole 541 is formed through the arm 54.

The piezoelectric elements 52 are firmly bonded to the rectangular portions on both sides of the reinforcing plate 51 using an epoxy-based resin or another such adhesive. The material of the piezoelectric elements 52 is not particularly limited, and possible examples include lead zirconate titanate (PZT (registered trademark)), liquid crystal, lithium niobate, barium titanate, lead titanate, lead metaniobate, polyvinylidene fluoride, lead zinc niobate, lead scandium niobate, and the like.

Electrodes made of nickel and gold or the like are then formed by plating, sputtering, vapor deposition, or another such method on both the front and back sides of the piezoelectric elements 52. The electrodes (not shown) formed on the back sides are stacked on and made conductive with the reinforcing plate 51.

The electrodes 60 formed on the side opposite the reinforcing plate 51 are partitioned into substantially rectangular shapes by grooves 65 formed by etching the diagonal portions at the corners of the rectangle, and adjustment electrodes 62 are disposed at the partitioned portions. The adjustment electrodes 62 are disposed at the diagonal positions opposite the pair of protuberances 53. Portions of the electrodes 60 are removed at the grooves 65. The portions of the electrodes 60 aside from the adjustment electrodes 62 are configured as a drive electrode 61 to which voltage is applied, and this drive electrode 61, though not shown, is made conductive with an alternating current voltage application device by a lead wire.

The drive electrode 61 and the adjustment electrodes 62 are patterned with high precision by etching. The adjustment electrodes 62 are similarly formed in the electrodes 60 on both sides of the reinforcing plate 51, and the reverse side adjustment electrode 62 is provided to a position on the back surface of the adjustment electrode 62 shown in FIG. 4. It is preferable that the drive electrode 61 have substantially the same length as the vibrator 50 in order to efficiently induce longitudinal vibration, and the drive electrode be formed into a crank shape that includes the nodes of both longitudinal vibration and bending vibration. The nodes of both longitudinal vibration and bending vibration are located near the center of the vibrator 50. The adjustment electrodes 62 are designed to induce bending vibration. Also, the surface area of the drive electrode 61 is formed to be greater than the surface area of the adjustment electrodes 62.

Part of the area between the drive electrode 61 and the adjustment electrodes 62 is not formed into a groove 65, and the small portion (the portion between the straight-line shaped groove 65A and the L-shaped groove 65B in FIG. 4) remaining in this part constitutes a conductive part 63 that is made conductive with the drive electrode 61 in the adjustment electrode 62. Specifically, since the drive electrode 61 and the adjustment electrodes 62 are made mutually conductive, applying voltage to the drive electrode 61 causes the voltage to be simultaneously applied to the adjustment electrodes 62, and the voltage is applied to the entire electrodes 60 as a result. Consequently, when voltage is applied between the drive electrode 61 and the electrodes (not shown) stacked on the reinforcing plate 51 on both sides of the reinforcing plate 51, the voltage is applied to the entire piezoelectric elements 52.

The width, length, and thickness of the piezoelectric elements 52, and also the frequency (drive frequency) of the voltage applied to the piezoelectric elements 52, are suitably set to simultaneously cause so-called longitudinal vibration (longitudinal primary vibration), wherein the piezoelectric elements 52 expand and contract in the longitudinal direction when voltage is repeatedly applied to the piezoelectric elements 52, and so-called bending vibration (bending secondary vibration), wherein the piezoelectric elements bend in a direction orthogonal to the longitudinal primary vibration at point symmetry to the planar center of the piezoelectric elements 52.

Figure 5:
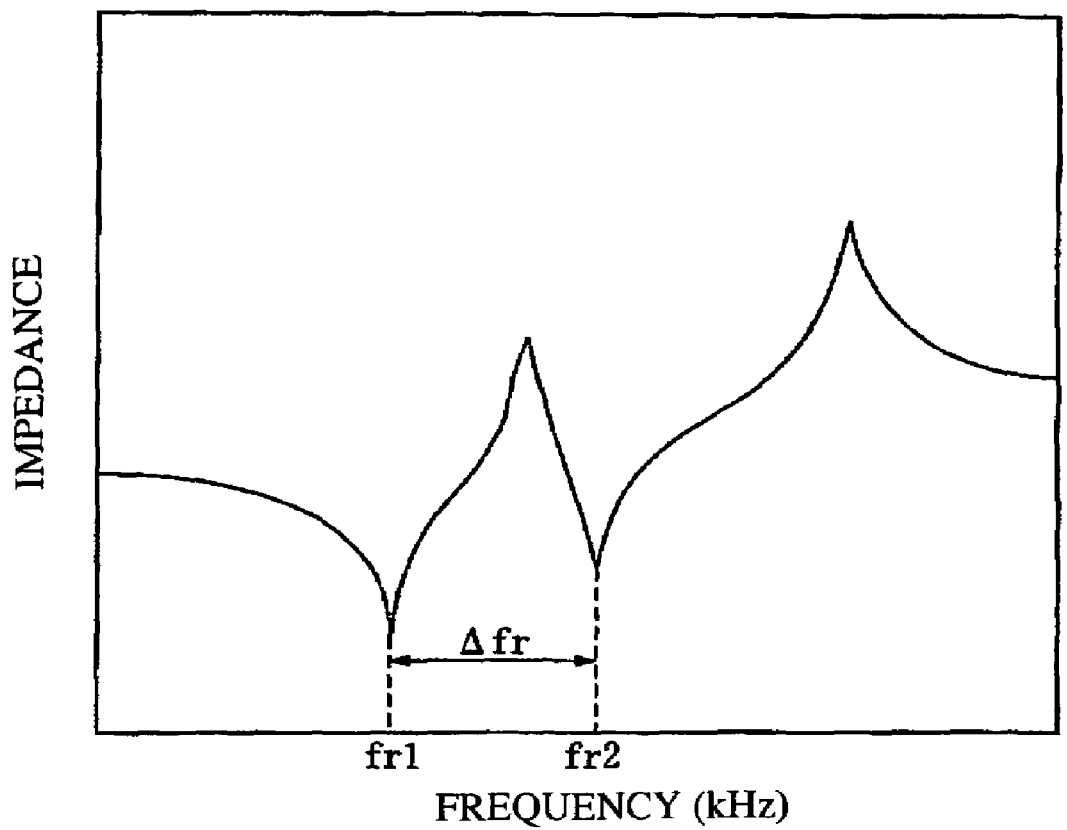
FIG. 5 shows the piezoelectric vibrator in the same embodiment, wherein (A) is a graph showing the relationship between drive frequency and impedance, and (B) is a graph showing the relationship of drive frequency to the amplitudes of longitudinal vibration and bending vibration.
Figure 5:
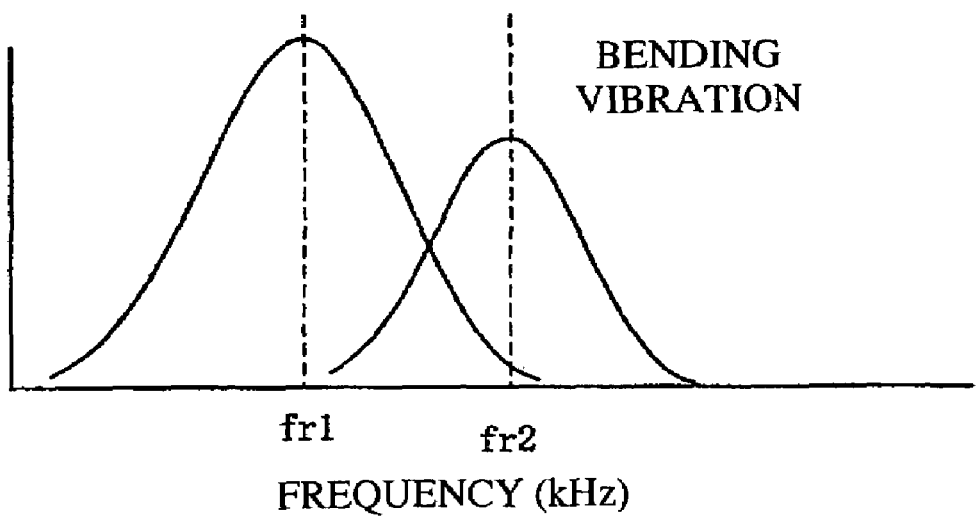

FIG. 5(A) shows the relationship between the drive frequency and impedance of the piezoelectric vibrator 50, and FIG. 5(B) shows the relationship of the drive frequency of the vibrator 50 to the amplitude of longitudinal vibration (longitudinal amplitude) and to the amplitude of bending vibration (bending amplitude).

As shown in FIG. 5(A), two points occur at which impedance reaches a minimum in relation to the drive frequency of the voltage applied to the piezoelectric elements 52. The lower point of these frequencies is the resonance point at which the amplitude of longitudinal vibration reaches a maximum, and the drive frequency at this resonance point is the longitudinal resonance frequency fr1. The higher point of these frequencies is the resonance point at which the amplitude of bending vibration reaches a maximum, and the drive frequency at this resonance point is the bending resonance frequency fr2.

The waveform of the voltage applied to the piezoelectric elements 52 is not particularly limited, and can be a sine wave, a rectangular wave, a trapezoidal wave, or the like, for example.

Referring to FIGS. 5(A) and (B), when the piezoelectric elements 52 are driven between the longitudinal resonance frequency fr1 and the bending resonance frequency fr2, the amplitude of both longitudinal vibration and bending vibration is maintained. The protuberances 53 thereby describe an elliptical trajectory during vibration. When the drive frequency is caused to change from the longitudinal resonance frequency fr1 to the bending resonance frequency fr2, the amplitude of bending vibration gradually becomes greater than the amplitude of longitudinal vibration, and change is induced in the orientation of the major axis of the elliptical trajectory described by the protuberances 53.

Also, setting the resonance frequency of longitudinal primary vibration and the resonance frequency of bending secondary vibration near to each other makes it possible to select the vibration frequency at which the amplitudes of both vibrations increase at the same time, which makes highly efficient driving possible.

If the value $\Delta fr$ of the longitudinal resonance frequency subtracted from the bending resonance frequency (fr2−fr1=$\Delta fr$) is too great, there is a reduction in the effects of inducing bending vibration as secondary vibration based on longitudinal vibration, and elliptical movement may not be achievable. If $\Delta fr$ is too small, it is difficult to control the frequency because the drive frequency range is too small, and operation tends to be unstable. Therefore, $\Delta fr$ should be appropriately adjusted. This will be described later.

Returning to FIG. 4, the vibrator 50 is disposed between a crest 231 and a supporting base 232 formed on the main plate 23, and is threadably fastened by the arm 54 extending over the supporting base 232. A screw hole for threading a screw 542 inserted through the hole 541 of the arm 54 is formed in the supporting base 232, and the reinforcing plate 51 and the drive electrode 61 are both made conductive with the voltage application device (not shown).

The vibrator 50 is disposed so that the distal end of one of the protuberances 53 is in contact with the outer periphery of the rotor 41.

The vibrator 50 with the structure described above is manufactured by affixing the piezoelectric elements 52 to the reinforcing plate 51, and is incorporated into the movement 2 by being fixed to the supporting base 232. However, nonuniformities in the characteristic frequencies of longitudinal vibration and bending vibration in individual vibrators 50 occur as a result of errors in shape, errors in affixing the piezoelectric elements 52 and the reinforcing plate 51, the material characteristics (Young's modulus, Poisson's ratio, density, and the like during rolling), the conditions of fixing to the supporting base 232 (fastening torque of the screw or the length of the arm 54), heat effects, and other such factors. If the characteristic frequencies are even slightly nonuniform, the vibration characteristics are markedly nonuniform. Consequently, in order to eliminate nonuniformities, it is essential to adjust the characteristic frequencies of longitudinal vibration and bending vibration in the vibrator 50.

(4. Method of Adjusting Characteristic Frequencies in Vibrator)

The characteristic frequencies in the vibrator 50 are adjusted by measuring $\Delta fr$, which is the difference between the bending resonance frequency and the longitudinal resonance frequency for the resonance frequencies corresponding to the characteristic frequencies, as will be described next, and then cutting the above-described conductive part 63 based on this $\Delta fr$. In other words, the adjustment electrodes 62 and the drive electrode 61 are insulated by cutting the conductive part 63 and separating the adjustment electrodes 62 from the drive electrode 61, which is the basis for adjusting the resonance frequencies in the vibrator 50.

The operation of adjusting the resonance frequencies in the vibrator 50 can be performed separately with each vibrator 50, but in the present embodiment, the operation is performed while the vibrator 50 is fastened to the main plate 23 and incorporated into the movement 2.

First, voltage is applied between the drive electrode 61 and adjustment electrodes 62, on the one hand, and the electrodes (not shown) stacked on the reinforcing plate 51, on the other hand, to vibrate the vibrator 50, and $\Delta fr$ is measured. The measured value of $\Delta fr$ is compared with a stipulated value of $\Delta fr$ to determine whether or not the conductive part 63 is to be cut. The stipulated value of $\Delta fr$ is determined from the torque needed to drive the rotor 41 and the date indicator 33, and other such factors.

In principle, the conductive part 63 is cut off from either of the adjustment electrodes 62 provided on both sides of the reinforcing plate 51, and also from either of the adjustment electrodes 62 provided at the diagonal portions of the rectangles of the electrodes 60.

Here, the adjustment electrodes 62 are insulated from the drive electrode 61 when the conductive part 63 is cut, the piezoelectric elements 52 do not expand and contract in the portions of the adjustment electrodes 62, and vibration on both sides of the vibrator 50 in the width direction restricted. Therefore, the characteristic frequency in bending vibration increases. Also, the characteristic frequency in longitudinal vibration does not change by much (the characteristic frequency in longitudinal vibration is determined by the length of the piezoelectric elements 52 in the longitudinal direction of the vibrator 50). Consequently, the difference $\Delta fr$ between the resonance frequencies of longitudinal vibration and bending vibration is increased by the cutting of the conductive part 63.

Specifically, $\Delta fr$ is adjusted by cutting the conductive part 63 of the adjustment electrodes 62.

Also, the amount by which $\Delta fr$ is adjusted by cutting the conductive part 63 can be varied according to the size, shape, positions, and range of the adjustment electrodes 62. In other words, the amount by which $\Delta fr$ is adjusted is set so that nonuniformities in $\Delta fr$ are eliminated, and the size shape, positions, and range of the adjustment electrodes 62 are determined so that the $\Delta fr$ adjustment thus set can be achieved.

For example, the drive electrode 61 to which voltage is applied becomes shorter as the adjustment electrodes 62 are lengthened in the longitudinal direction of the vibrator 50. Therefore, vibration in the vibrator 50 on both sides in the width direction during voltage application is restricted and the bending vibration frequency and $\Delta fr$ both increase, as previously described. The difference between cutting and not cutting the conductive part 63 thereby increases, and the $\Delta fr$ adjustment therefore increases.

As the adjustment electrodes 62 are shortened in the longitudinal direction of the vibrator 50, the restriction on vibration in the vibrator 50 on both sides in the width direction is lessened, and the bending resonance frequency and $\Delta fr$ are both reduced. The difference between cutting and not cutting the conductive part 63 thereby decreases, and the $\Delta fr$ adjustment therefore decreases.

The decision of whether or not to cut the conductive part 63 is then made so that $\Delta fr$ can be brought near the stipulated value on the basis of the measured value of $\Delta fr$ and the adjusted amount of $\Delta fr$.

Next, the method of cutting the conductive part 63 will be described.

Figure 6:
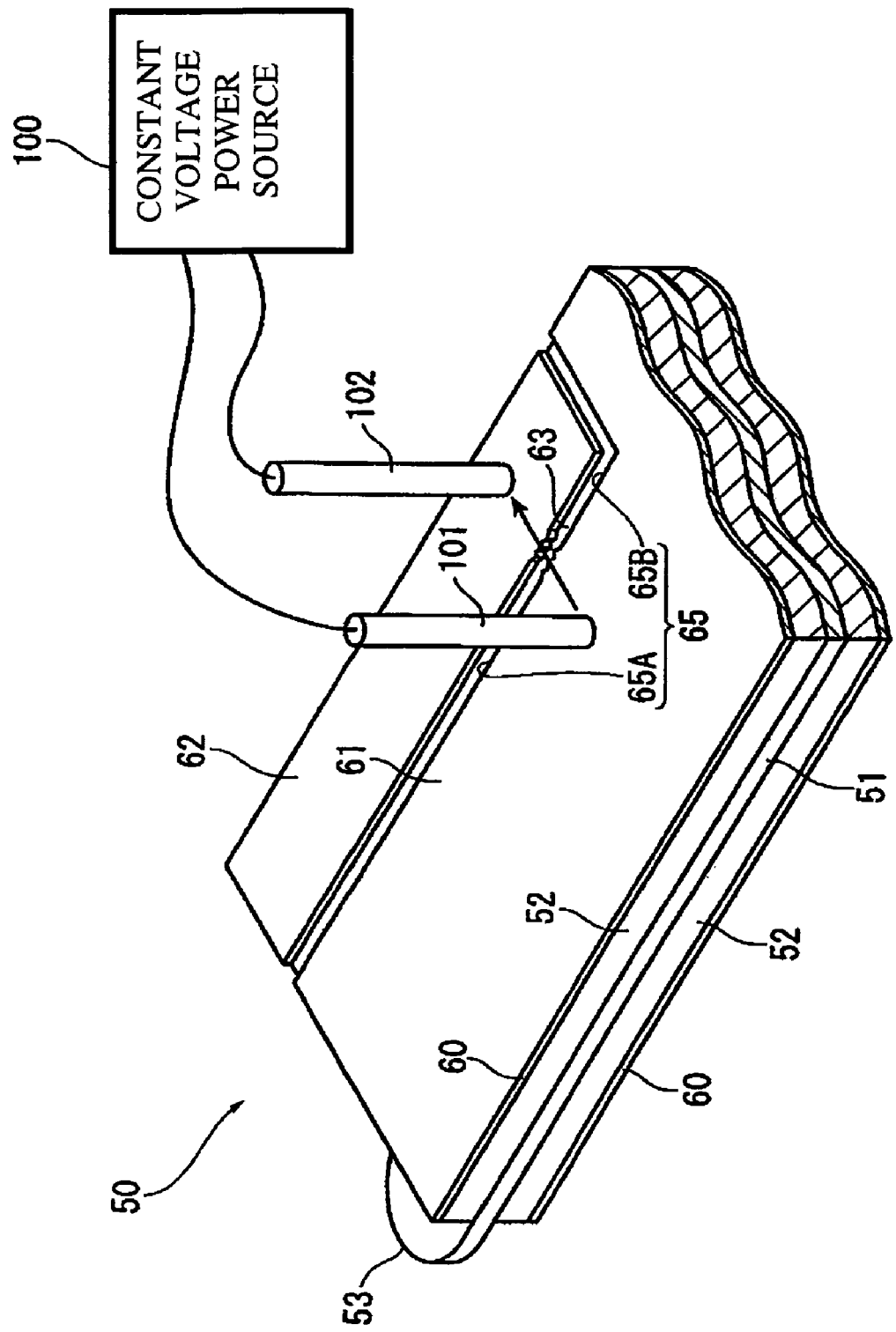
FIG. 6 is a diagram describing the cutting of the conductive part in the same embodiment.

FIG. 6 is a diagram showing the conductive part 63 as having been cut. Terminals 101 and 102 of a constant-voltage power source 100 are in contact with the drive electrode 61 and the adjustment electrode 62, respectively. When an electric current is applied between the terminals 101 and 102, the conductive part 63 is instantaneously melted by the Joule heat locally generated by the electrical resistance of the conductive part 63.

Since the conductive part 63 is cut instantaneously, and, moreover, since the conductive part 63 is only part of what is provided to the surface layer of the vibrator 50, there is virtually no damage to the entire vibrator 50 from cutting the conductive part 63. Also, cutting in each individual vibrator 50 is achieved in a stable manner because the adjustment electrodes 62 and drive electrode 61 on both sides of the conductive part 63 are accurately patterned.

Consequently, it is possible to prevent nonuniformities in the preset adjusted amount of $\Delta fr$ in the steps of adjusting the resonance frequencies of the vibrator 50.

Next, the effects that adjustment of $\Delta fr$ by cutting the conductive part 63 has on the vibration characteristics of the vibrator 50 will be examined. The impedance at the resonance point of longitudinal vibration is used herein as an index to indicate the degradation in vibration characteristics of the vibrator 50.

Figure 7:
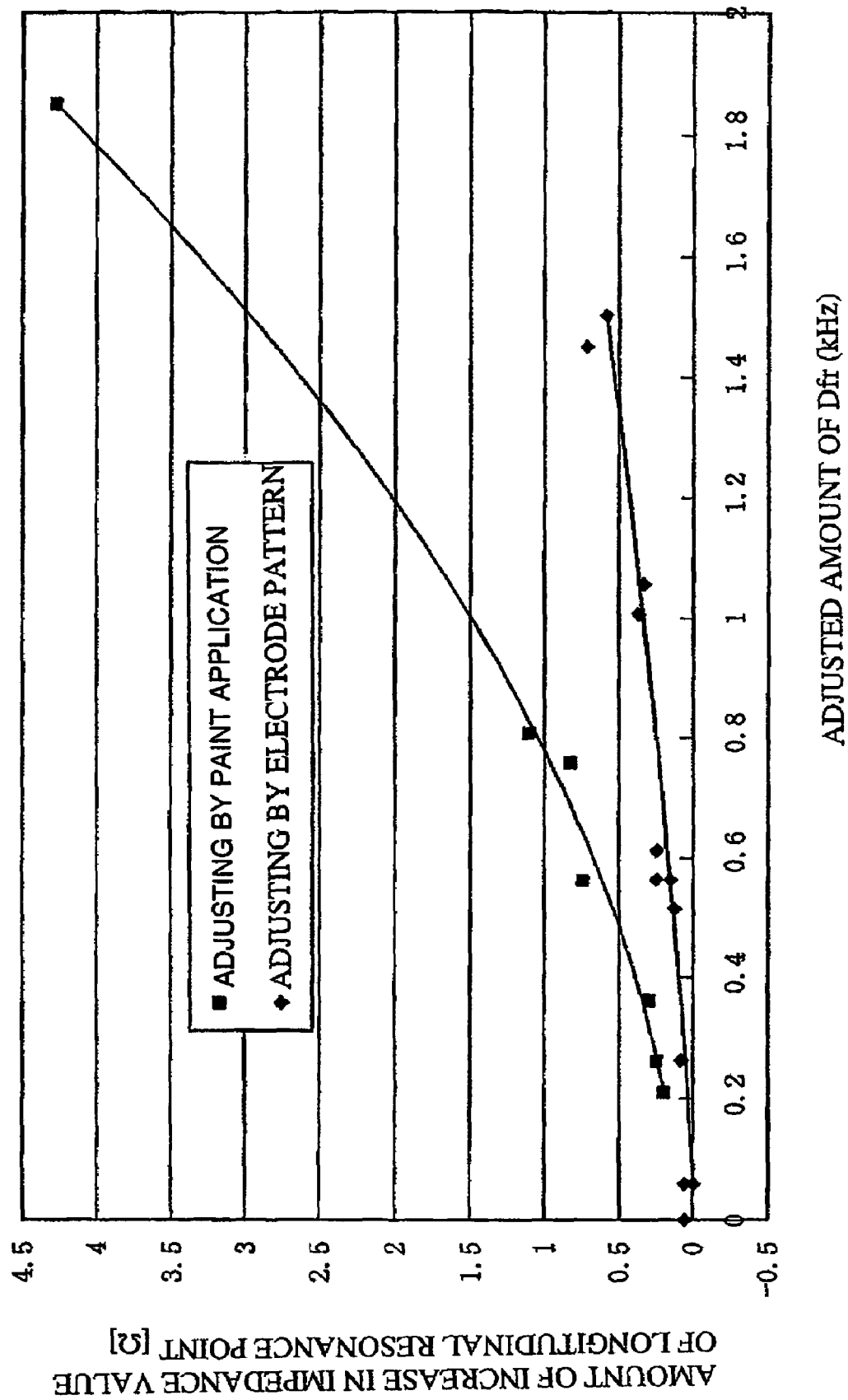
FIG. 7 is a graph showing the relationship between the amount of increase of impedance and the adjusted amount of the difference ($\Delta fr$) in the resonance frequencies of longitudinal vibration and bending vibration in the piezoelectric vibrator in the same embodiment.

FIG. 7 is a graph showing the relationship between the $\Delta fr$ adjustment and the impedance increase at the resonance point of longitudinal vibration.

First, as a comparative example of the present embodiment, the plot of "adjustment by paint coating" with black squares is a sample of vibrators 50 in which the $\Delta fr$ adjustment is varied by changing the weight balance when paint is applied to the surface of the vibrator 50 and the amount of paint applied is changed, wherein the impedance before and after adjusting $\Delta fr$ is measured, and the increase in the impedance value before and after the adjustment is shown.

It is apparent that as the $\Delta fr$ adjustment increases, the increase in impedance at the resonance point of longitudinal vibration greatly increases, and the vibration characteristics significantly degrade. Therefore, the method of adjusting $\Delta fr$ by applying paint in this manner cannot be employed. Also, in this method, problems are encountered in that it is difficult to control the location where the paint is applied in the vibrator 50, the amount applied, the range of application, and other such factors.

The plot of "adjustment by electrode pattern" with black diamonds in FIG. 7 is a sample of a plurality of vibrators 50 in which the $\Delta fr$ adjustment is varied by changing the dimensions of the adjustment electrodes 62 in the longitudinal direction of the vibrator 50 as in the present embodiment, wherein the impedance before and after adjusting Δfr is measured, and the increase in the impedance value before and after the adjustment is shown.

As shown in this plot, the amount of increase in impedance changes only slightly when the Δfr adjustment increases. Consequently, the Q value and other such vibration characteristics of the vibrator 50 also change only slightly. The difference is more distinct than with adjustment by paint application.

As described above, the superior effects of the present embodiment pertaining to the degradation in the vibration characteristics of the vibrator 50 were confirmed.

(5. Operation of Vibrator with Characteristic Frequencies Adjusted)

Figure 8:
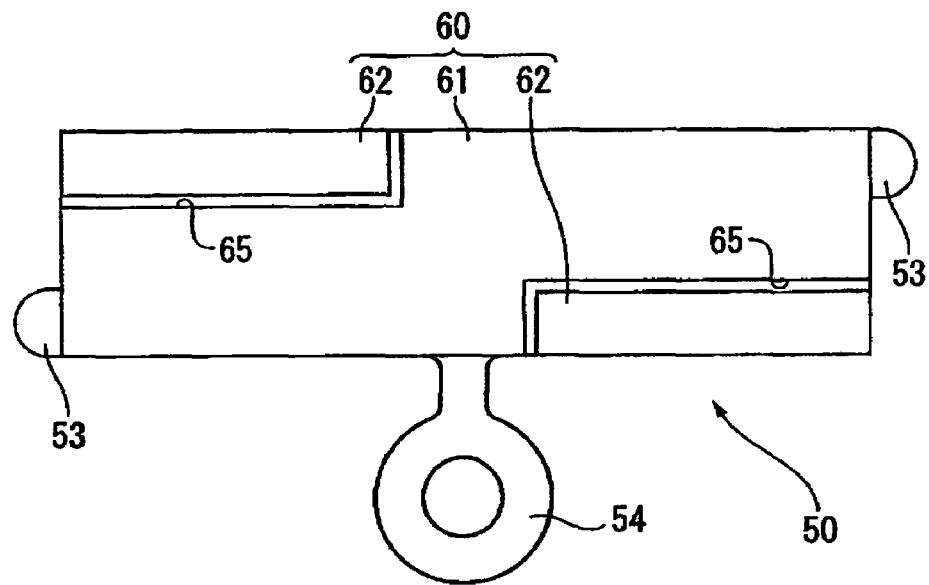
FIG. 8 is a plan view showing the operation of the piezoelectric vibrator in the same embodiment.
Figure 8:
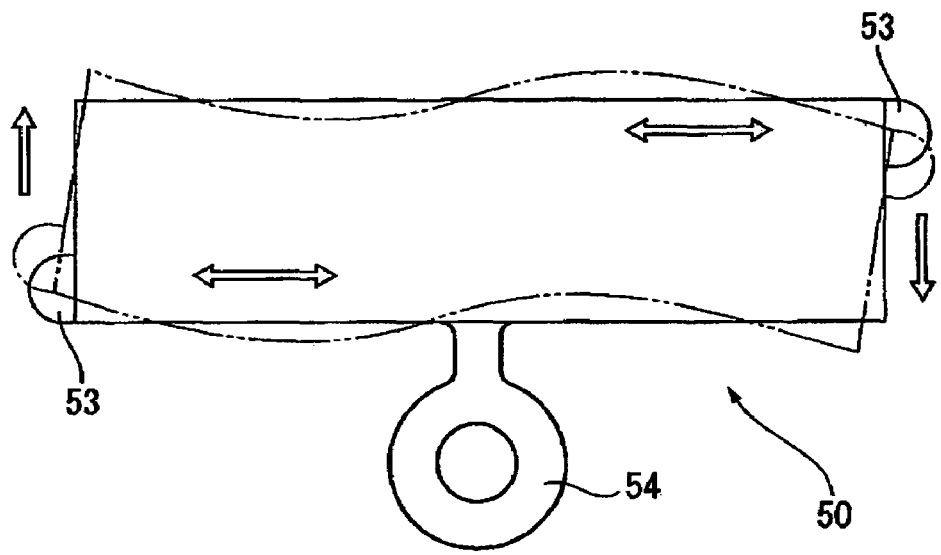
Figure 8:
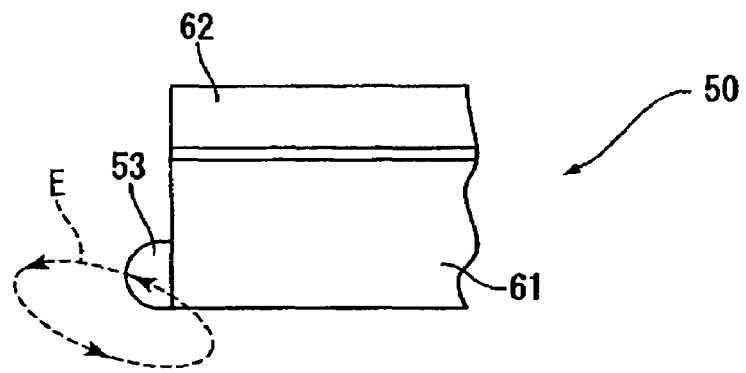

The vibrator 50 reaches the state shown in FIG. 8(A) when the conductive part 63 is cut by adjusting the characteristic frequencies as described above. In this state, the adjustment electrodes 62 and the drive electrode 61 are mutually insulated. As a result, when voltage is applied to the drive electrode 61, this voltage is not applied to the adjustment electrodes 62. Specifically, the range in which voltage is applied in the electrodes 60 changes before and after the conductive part 63 is cut.

FIG. 8(B) shows the operation of the vibrator 50. When voltage is applied between the drive electrode 61 and the electrodes (not shown) superposed on the reinforcing plate 51 by a voltage application device (not shown), the portion of the piezoelectric elements 52 that has the drive electrode 61 expands and contracts in the longitudinal direction, and the vibrator 50 is caused to perform longitudinal vibration. As a result of this longitudinal vibration, a moment is created in a direction intersecting the longitudinal direction of the vibrator 50 to induce bending vibration. The protuberances 53 of the vibrator 50 describe an elliptical trajectory E as shown in FIG. 8(C) due to this combination of longitudinal vibration and bending vibration. Since voltage is not applied to the adjustment electrodes 62, and the portions of the piezoelectric elements 52 with the adjustment electrodes 62 provided do not actively expand and contract, the characteristic frequency of bending vibration increases due to the restrictive force on bending vibration on both sides of the vibrator 50 in the width direction.

Specifically, as a result of appropriately adjusting the size of Δfr by cutting the conductive part 63, elliptical movement of the protuberances 53 can be achieved with a specific elliptical trajectory E in each individual vibrator 50.

The rotor 41 is then rotatably driven in a specific direction due to the protuberances 53 repeatedly pushing on the rotor 41 (FIG. 3) at a specific drive frequency.

Furthermore, when the rotational movement of the rotor 41 is transmitted to the date turning intermediate wheel 31, and the teeth of the date turning wheel 32 engage with the notch 312A, the date turning wheel 32 is rotated by the date turning intermediate wheel 31. The date indicator 33 is then turned one tooth each day by the date turning wheel 32, and the calendar is displayed as a result of the fact that the date-indicating numerals disposed around the edge of the date indicator 33 are displayed sequentially through the window 34. If calendar information is stored in a circuit block, the calendar is automatically corrected at the end of the month on the basis of the stored information.

According to the first embodiment described above, the following effects are obtained.

(1) In the vibrator 50 constituting the date display device 30, the adjustment electrodes 62 are formed in advance on part of the electrodes 60, and the drive electrode 61 and the adjustment electrodes 62 are mutually insulated by cutting the conductive part 63, whereby the characteristic frequencies of longitudinal vibration and bending vibration can be adjusted simply and reliably. Individual differences in the vibrators 50 pertaining to characteristic frequency can thereby be eliminated and the reliability of the actuator 40 into which the vibrator 50 is incorporated can be greatly improved. Consequently, the reliability of the movement 2 or of the calendar display in the timepiece 1 can be greatly improved.

Adjustment can be performed quickly because Δfr is varied by adjusting the characteristic frequency in bending vibration of the vibrator 50, and there is no need to separately adjust the characteristic frequencies of longitudinal vibration and bending vibration.

(2) The conductive part 63 can be easily formed by mask formation when the drive electrode 61 and the adjustment electrodes 62 are formed. The characteristic frequencies can then be adjusted merely by cutting the conductive part 63 provided as an electrode to the surface of the piezoelectric elements 52, and since no power or heat is applied to the entire vibrator 50, the Q value and other such vibration characteristics can be prevented from decreasing. Also, the cycle time can be simply shortened compared to when work is performed on the piezoelectric elements 52 themselves.

(3) Nonuniformities in the Δfr adjustment in the individual vibrators 50 can be reduced because the adjustment electrodes 62 and the drive electrode 61 are accurately patterned, and there is virtually no effect on the Δfr adjustment irrespective of the manner in which the conductive part 63 is cut. Therefore, the preset Δfr adjustment does not change before and after the steps in which Δfr is adjusted, and the characteristic frequencies can be more simply and reliably adjusted by adjusting Δfr.

(4) The load on the vibrator 50 can be greatly reduced because the conductive part 63 is cut locally and instantaneously by using Joule heat. Furthermore, operating efficiency can be made satisfactory because the conductive part 63 is not cut directly, and cutting can achieved in a stable manner without contact with the conductive part 63 by bringing the terminals 101 and 102 into contact with the drive electrode 61 and the adjustment electrodes 62 on both sides of the conductive part 63.

Also, reliability can be improved because the characteristics of the piezoelectric elements are not degraded by shavings when the conductive part 63 is cut off by a mill or a cutter, or by heat generated when the conductive part is cut off by a laser. Furthermore, equipment expenditures can be greatly reduced compared to cutting with a laser, because the conductive part 63 can be cut with a constant-voltage power source having a simple structure.

(5) Since the characteristic frequencies are adjusted while the vibrator 50 is fixed to the supporting base 232 and incorporated into the movement 2, the characteristic frequencies can be prevented from shifting in accordance with factors such as the conditions under which the vibrator 50 is fixed to the supporting base 232. It is thereby possible to correct nonuniformities in the characteristic frequencies of the vibrator 50 in a near-service state.

(6) Since the vibrator 50 is formed into a thin plate shape, it is possible to reduce the thickness of the movement 2 into which the vibrator 50 is incorporated. Also, a balance of vibration in the vibrator 50 is maintained because the adjustment electrodes 62 are provided on diagonals of the rectangle shape in the piezoelectric elements 52.

(7) Furthermore, in the vibrator 50, Δfr is adjusted so as to maintain the amplitudes of longitudinal vibration and bending vibration, whereby elliptical movement can be achieved in the protuberances 53 of the vibrator 50. The trajectory E of the elliptical movement can be made constant in each individual vibrator 50 by appropriately adjusting Δfr as previously described, and vibrators 50 that fulfill specific vibration characteristics can be supplied in a stable manner.

(8) As described above, since the resonance frequencies of the vibrator 50 can be incorporated in a simplified manner, an actuator 40 that exhibits highly efficient driving properties can be provided with stable quality.

Also, since the actuator 40 is incorporated into the movement 2 of the timepiece 1 as part of the date display device 30, the rotation of the date indicator 33 can be made accurate, and the vibrator 50 can be quickly adjusted, allowing for excellent productivity. Moreover, it is possible to achieve the advantages inherent in the actuator 40 provided with the piezoelectric elements 52; specifically, the lack of magnetic effects, the possibility of high responsiveness and low feed rate, the merits of small and thin size, high torque, and other such factors.

Second Embodiment

Next, the second embodiment in the present invention will be described.

The present embodiment differs from the first embodiment in that a plurality of adjustment electrodes are provided to the diagonal portions of the rectangle of the vibrator.

Figure 9:
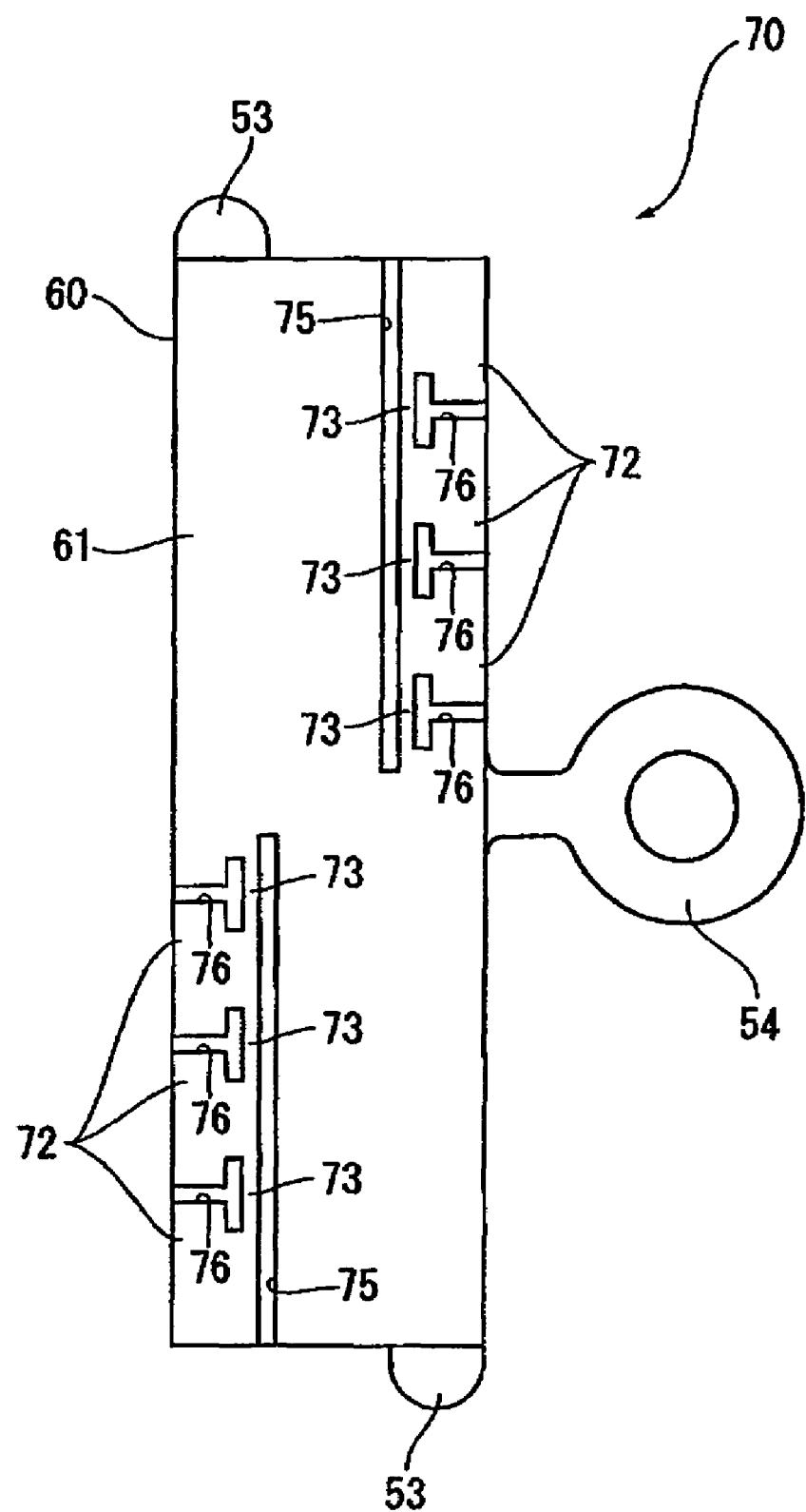
FIG. 9 is a plan view of the piezoelectric vibrator in the second embodiment of the present invention.

FIG. 9 is a plan view of a vibrator 70 in the present embodiment.

In the vibrator 70, the electrode 60 provided on the surface of the piezoelectric element is partitioned at the diagonal portions of the rectangle by linear grooves 75 and T-shaped grooves 76, and three adjustment electrodes 72 are formed at each diagonal portion.

Specifically, the linear grooves 75 extend from the two short sides of the vibrator 70 in the longitudinal direction to the middle of the vibrator 70 in the width direction.

Also, the T-shaped grooves 76 are aligned in sets of three extending from the ends of the vibrator 70 in the width direction along a direction orthogonal to the longitudinal direction near to the linear grooves 75. The presence of these linear grooves 75 and T-shaped grooves 76 allows three adjustment electrodes 72 each to be formed in alignment in the longitudinal direction of the vibrator 70 at the diagonal portions of the vibrator 70.

The portions between the linear grooves 75 and the T-shaped grooves 76 constitute conductive parts 73 for making the adjustment electrodes 72 conductive with the drive electrode 61.

These conductive parts 73 are supplied with an electric current and melted as in the previous embodiment as necessary. In this case, the conductive parts 73 are easily melted because the sidebar portions in the T shapes of the T-shaped grooves 76 extend substantially parallel to the linear grooves 75.

In this vibrator 70, it is possible to adjust the characteristic frequencies of longitudinal vibration and bending vibration by arbitrarily selecting from the plurality of provided adjustment electrodes 72, and cutting the conductive parts 73 according to the selected adjustment electrodes 72.

Figure 10:
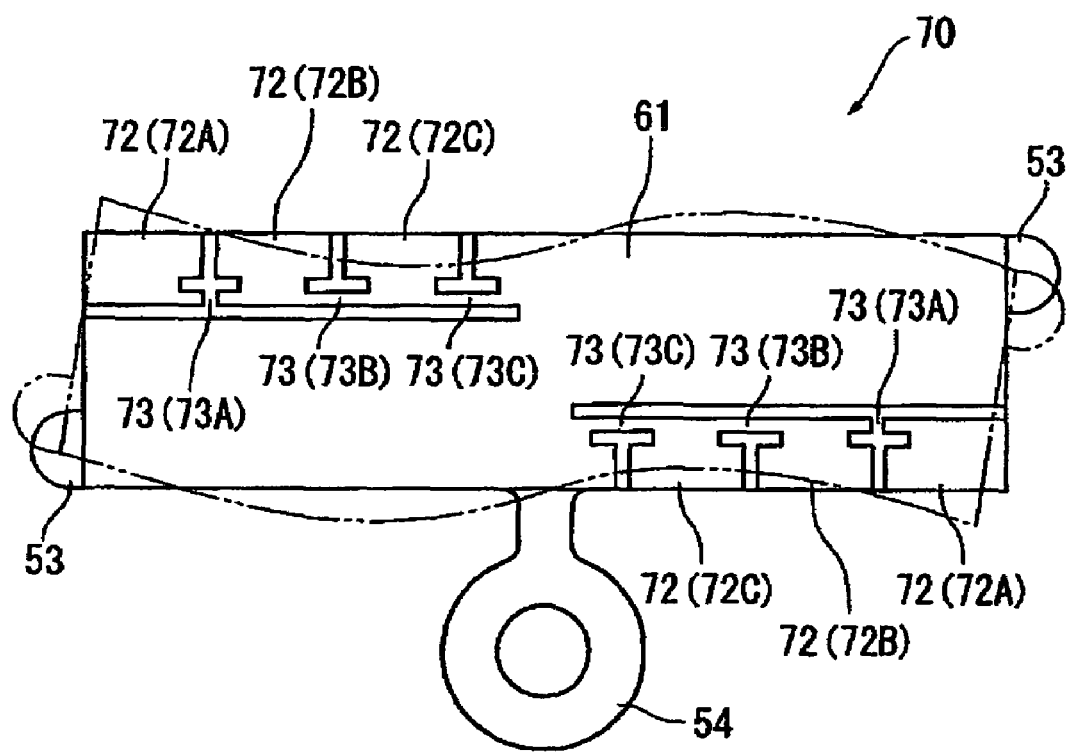
FIG. 10 is a plan view showing the operation of the piezoelectric vibrator in the same embodiment.
Figure 10:
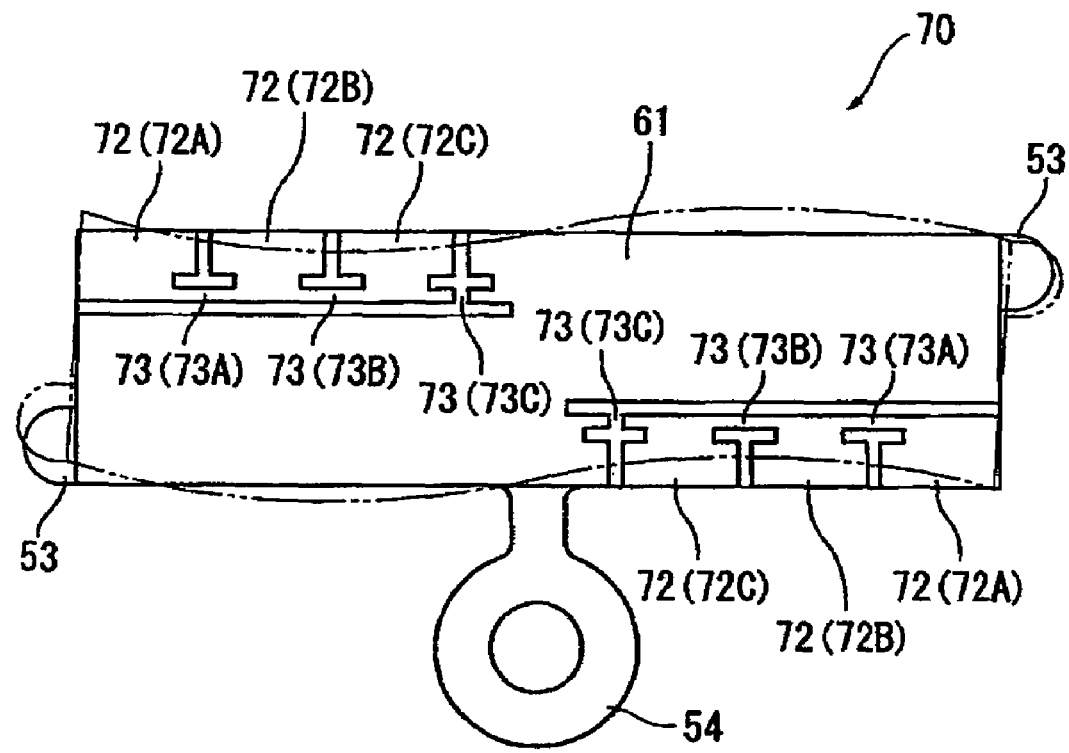

For reference, FIGS. 10(A) and (B) show two examples of different selections of adjustment electrodes 72. Specifically, in FIG. 10(A), only the adjustment electrodes 72A disposed on the short sides of the vibrator 70 are selected from the three sets of adjustment electrodes 72A through 72C disposed at the diagonals of the vibrator 70, and the adjustment electrodes 72A are mutually insulated from the drive electrode 61 by cutting the conductive parts 73A. In FIG. 10(B), all three sets of adjustment electrodes 72A through 72C are selected, and all of these adjustment electrodes 72A through 72C are mutually insulated from the drive electrode 61 by cutting the conductive parts 73C. In this case, there is no need to cut the conductive parts 73B and 73A.

When voltage is applied to the vibrator 70 shown in FIGS. 10(A) and (B), longitudinal vibration and bending vibration are induced in the vibrator 70, as shown by the imaginary lines.

In this case, the adjustment electrodes 72A through 72C are aligned in the longitudinal direction of the vibrator 70, the state shown in FIG. 10(B) has more adjustment electrodes 72 selected (three in 72A through 72C) than the state shown in FIG. 10(A), and there are more areas where vibration is restricted without the application of voltage on both sides of the vibrator 70 in the width direction, which results in a greater characteristic frequency of bending vibration.

Figure 11:
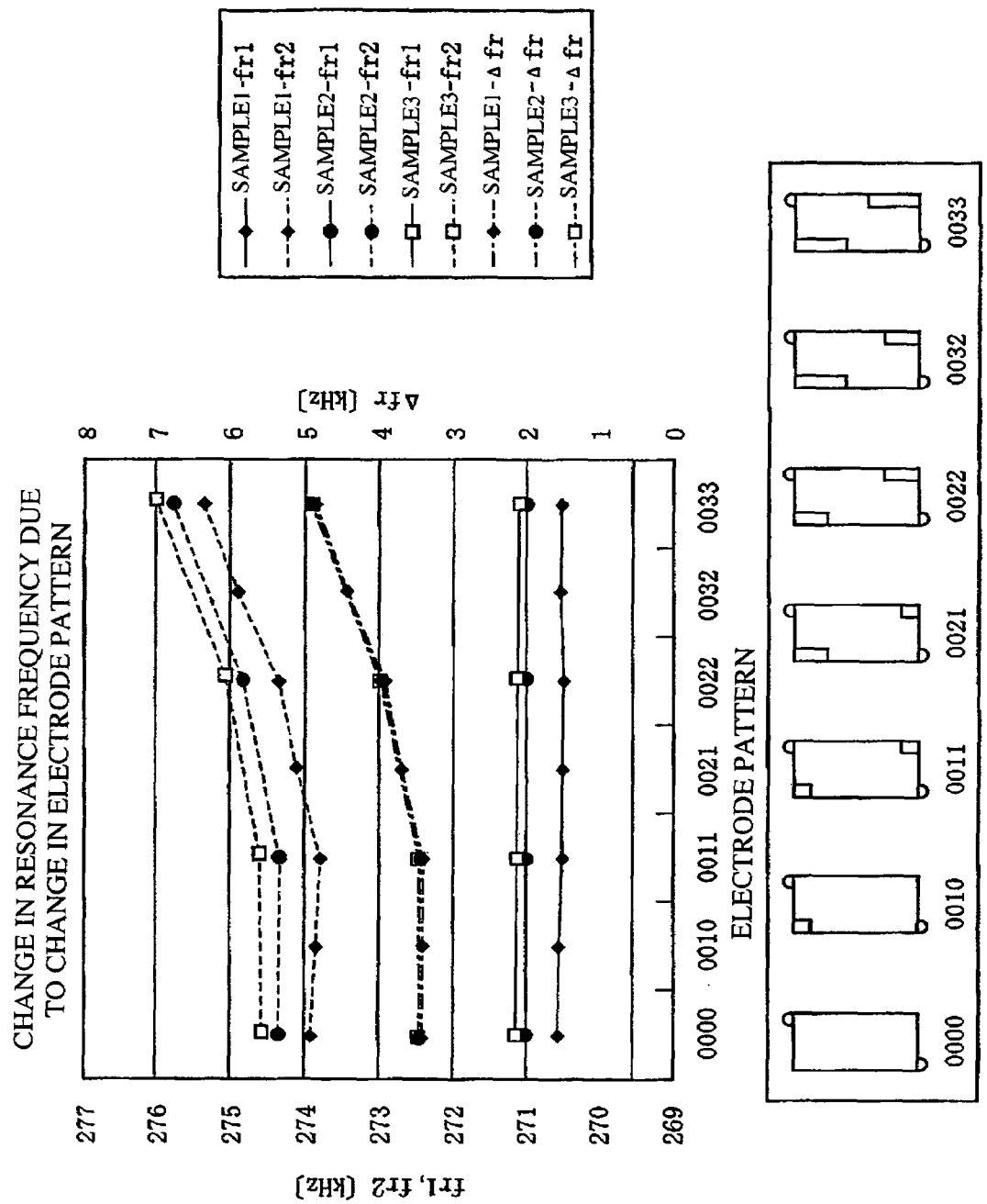
FIG. 11 is a diagram showing the manner in which the resonance frequency varies according to the selection of adjustment electrodes for three samples of the piezoelectric vibrator in the same embodiment.

For states that also include those shown in FIGS. 10(A) and (B), the lower column "electrode pattern" in FIG. 11 is a schematic depiction of seven combinations of selected adjustment electrodes 72. Specifically, "0000" indicates that not a single adjustment electrode 72 is selected, and "0010", "0011", "0021", "0022", "0032" and "0033" denote that the number of selected adjustment electrodes 72 increases in increments of one in an alternating manner between the diagonals of the vibrator 70. The state shown in FIG. 10(A) corresponds to "0011", and the state shown in FIG. 10(B) corresponds to "0033".

The graph shown in FIG. 11 is a plot of three samples (samples 1-3) of the vibrator 70 obtained by measuring the longitudinal resonance frequency fr1 and the bending resonance frequency fr2 in the seven selections in the lower column of FIG. 11, and Δfr, the difference (fr2−fr1) between the two.

As can be perceived from this graph, when the number of selected adjustment electrodes 72 increases, the longitudinal resonance frequency fr1 changes only slightly and remains substantially constant while bending resonance frequency fr2 increases, causing Δfr to increase.

The number, size, and direction of alignment of the adjustment electrodes 72 are determined so as to appropriately adjust nonuniformities in Δfr in the vibrator 70. Specifically, as previously described, since the adjustment electrodes 72 patterned with high precision on the electrodes 60 are set in advance, nonuniformities in the Δfr adjustment in each individual vibrator 70 are small. The patterning for achieving the desired Δfr adjustment can be easily set because nonuniformities are small even if the Δfr adjustments in each of the adjustment electrodes 72 are cumulative, and it is possible to ensure substantially reliable Δfr adjustments.

The manner in which Δfr varies depending on the selection of adjustment electrodes 72 was described above. Following is a description of the manner in which Δfr is adjusted according to the selection of adjustment electrodes 72 for a vibrator 70 from a lot, and the manner in which nonuniformities in the resonance frequencies are corrected for each individual vibrator 70.

Figure 12:
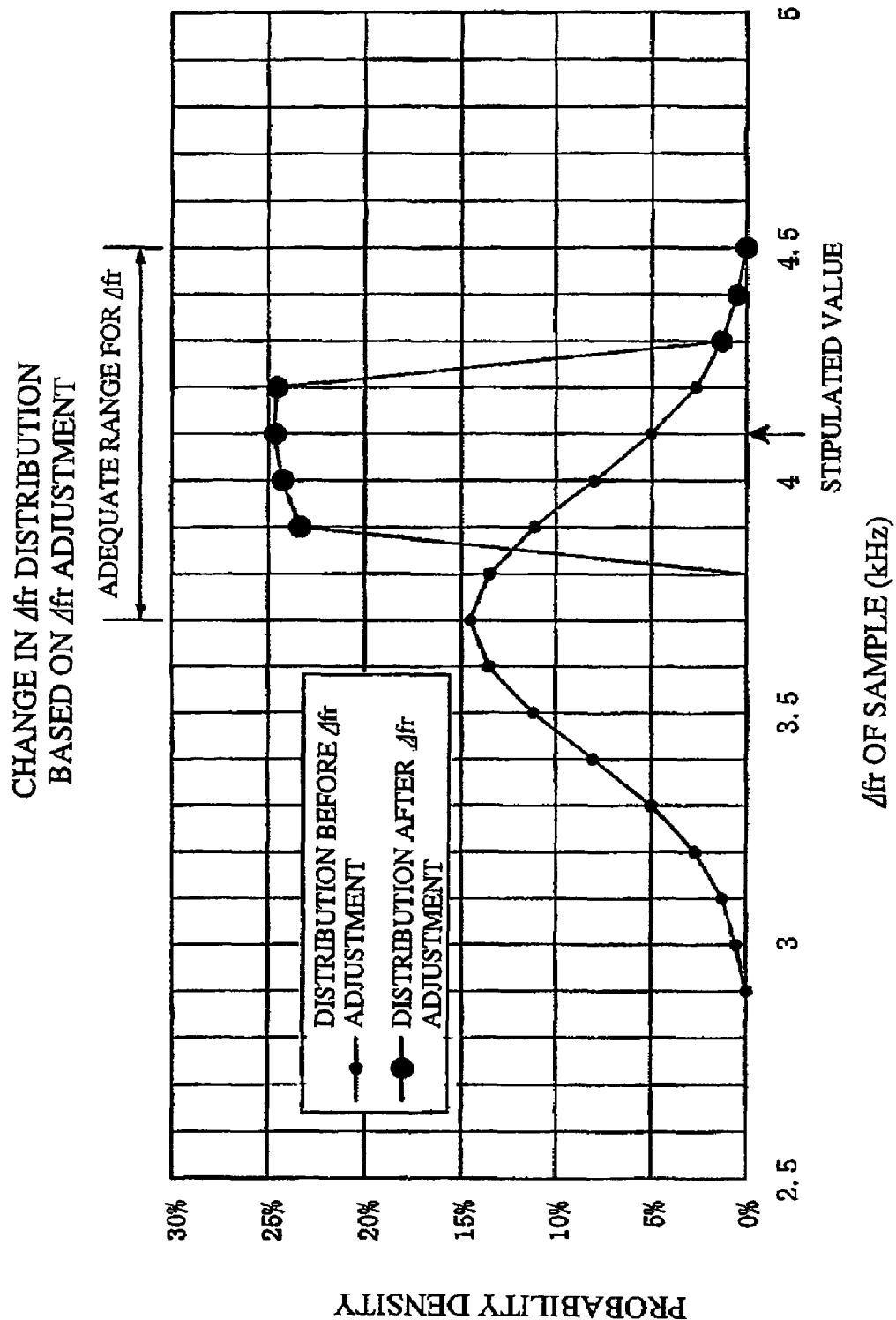
FIG. 12 is a diagram showing the distribution of $\Delta fr$ before and after adjusting the difference ($\Delta fr$) between the longitudinal resonance frequency and the bending resonance frequency for the piezoelectric vibrators in a lot in the same embodiment.

FIG. 12 shows the change in Δfr distribution according to the Δfr adjustment, wherein the plot of small dots is the distribution of Δfr before the Δfr is adjusted, and the plot of large circles is the distribution of Δfr after the Δfr is adjusted. Before adjustment, nonuniformities occur in Δfr in a wide range of 2.9 to 4.5 kHz.

In the adjustment steps in each individual vibrator 70, Δfr is measured to determine the adjustment electrodes 72 to be selected, and only the selected adjustment electrodes 72 are made conductive with the drive electrode 61 by melting the conductive parts 73, similar to the first embodiment.

When adjusting Δfr as shown in FIG. 12, the dimensions of the adjustment electrodes 72 in the longitudinal direction of the vibrator 70 are set so as to obtain the desired adjusted amounts of Δfr in view of the measurement results in FIG. 11. The length ratio of the adjustment electrodes 72A, 72B, and 72C is appropriately set to 3:1:1, for example.

Adjustment is then performed in three stages, wherein the state in which no adjustment electrodes 72 are selected is denoted by "0000'", and the states in which one, two, and three adjustment electrodes 72 are selected at the diagonals of the vibrator 70 are respectively denoted by "0011'", "0022'", and "0033'". Specifically, the selection believed to be nearest to the results of measuring Δfr in each individual vibrator 70 and the stipulated values of Δfr (4.1 kHz in this case) are determined by either "0011'", "0022'", or "0033'".

The adjustment electrodes 72 to be selected are determined as follows.

Figure 13:
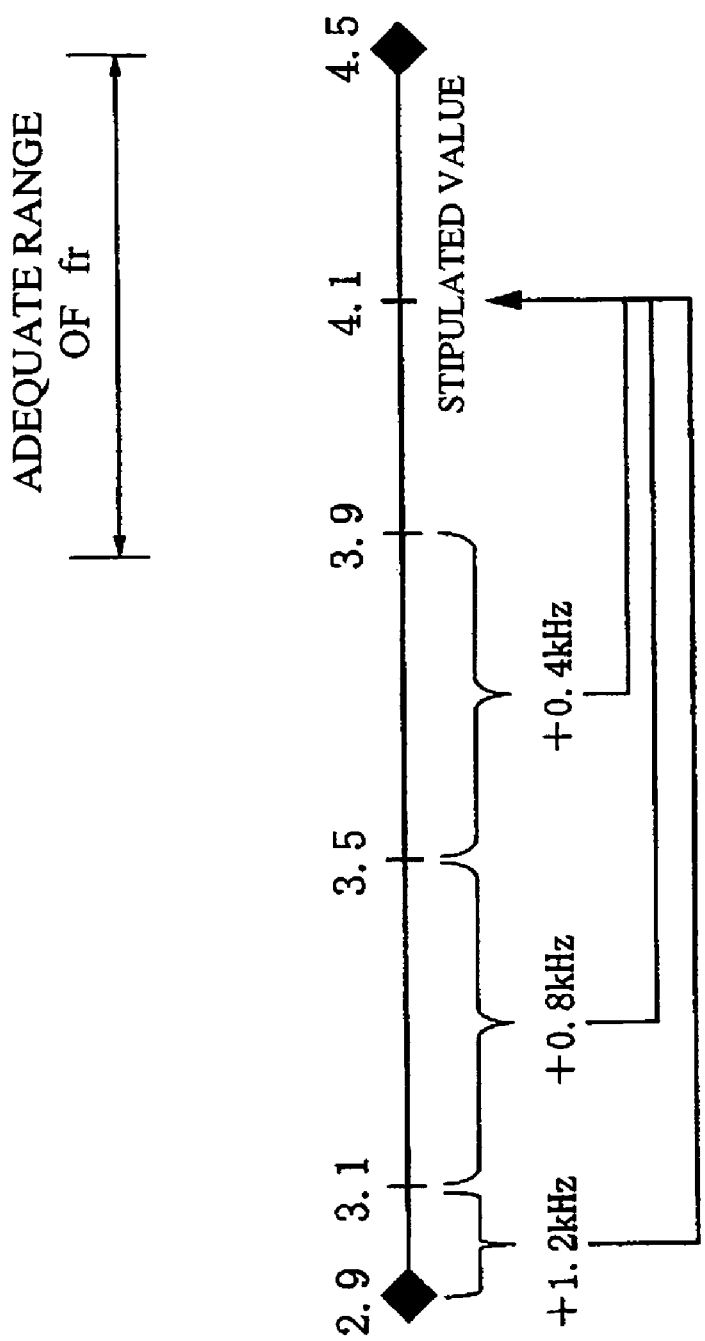
FIG. 13 is a diagram showing the $\Delta fr$ adjustment in FIG. 12.

FIG. 13 shows the horizontal axis in FIG. 12, and describes the manner in which the adjustment electrodes 72 are selected and caused to converge to a stipulated value of 4.1 kHz for the nonuniformities in Δfr before adjustment in a range of 2.9 to 4.5 kHz.

The stipulated value 4.1 kHz is determined by taking into account the rotational speed, torque, electricity consumption, and other factors when the rotor 41 and the date indicator 33 (FIG. 3) are driven. The range of allowable nonuniformities is 4.1 kHz±0.4 kHz; that is, a range of 0.8 kHz, with 4.1 kHz as the stipulated mean value, is the adequate range for Δfr. The adequate value of Δfr varies depending on the product specifications, and is not limited to the numerical value given here.

In the vibrator 70, the Δfr adjustment that corresponds to the selection of the adjustment electrodes 72 is estimated in advance in the steps of setting the patterning of the adjustment electrodes 72, as previously described. In the state of "0011'" in which one adjustment electrode 72 is selected at each diagonal, Δfr increases by 0.4 kHz from before adjustment to after. In the state of "0022'" in which two adjustment electrodes 72 are selected at each diagonal, Δfr increases by 0.8 kHz. In the state of "0033'" in which three adjustment electrodes 72 are selected at each diagonal, Δfr increases by 1.2 kHz.

In the steps of adjusting Δfr, if the measured Δfr is a value in the range of 3.7 to 4.5 kHz, the adjustment steps are completed without selecting any adjustment electrodes 72 (the aforementioned state of "0000'") since this is within the adequate range of the stipulated value 4.1 kHz±0.4 kHz.

Next, if the measured Δfr is within the range of 3.5 to 3.9 kHz, the state of "0011'" is assumed in order to approach the stipulated value 4.1 kHz. As previously described, since the Δfr adjustment is 0.4 kHz in the selection of "0011'", Δfr is distributed in the range 3.9 to 4.5 kHz and is a value within the adequate range. Similarly, if Δfr is within the range 3.1 to 3.5 kHz, the state of "0022'" is assumed, Δfr is increased by 0.8 kHz, and Δfr is brought to a value within the adequate range. If Δfr is within the range 2.9 to 3.1 kHz, the state of "0033'" is assumed, and Δfr is increased by 1.2 kHz and is brought to a value in the adequate range.

As a result of adjusting Δfr in this manner, Δfr in all of the vibrators 70 in the sample lot is kept within a narrow range (the adequate range of Δfr in FIG. 12) of ±0.4 kHz around the stipulated value 4.1 kHz, as shown in FIG. 12.

According to the second embodiment described above, the following effects are obtained in addition to the operating effects described in the first embodiment.

(9) Since a plurality of adjustment electrodes 72 are provided and it is possible to selectively make these adjustment electrodes 72 conductive with the drive electrode 61, the characteristic frequencies of the vibrator 70 can be adjusted in stages according to the selection of the adjustment electrodes 72. Since adjustment electrodes 72 are provided at three locations at the diagonals of the vibrator 70, the characteristic frequencies can be efficiently brought close to the stipulated values. Specifically, it is possible to improve the precision of adjusting the characteristic frequencies and to improve the yield rate.

Third Embodiment

Next, the third embodiment of the present invention will be described.

In the present embodiment, unlike the first and second embodiments, the adjustment electrodes and the drive electrode are insulated in advance, and are also made conductive via a conductive member.

Figure 14:
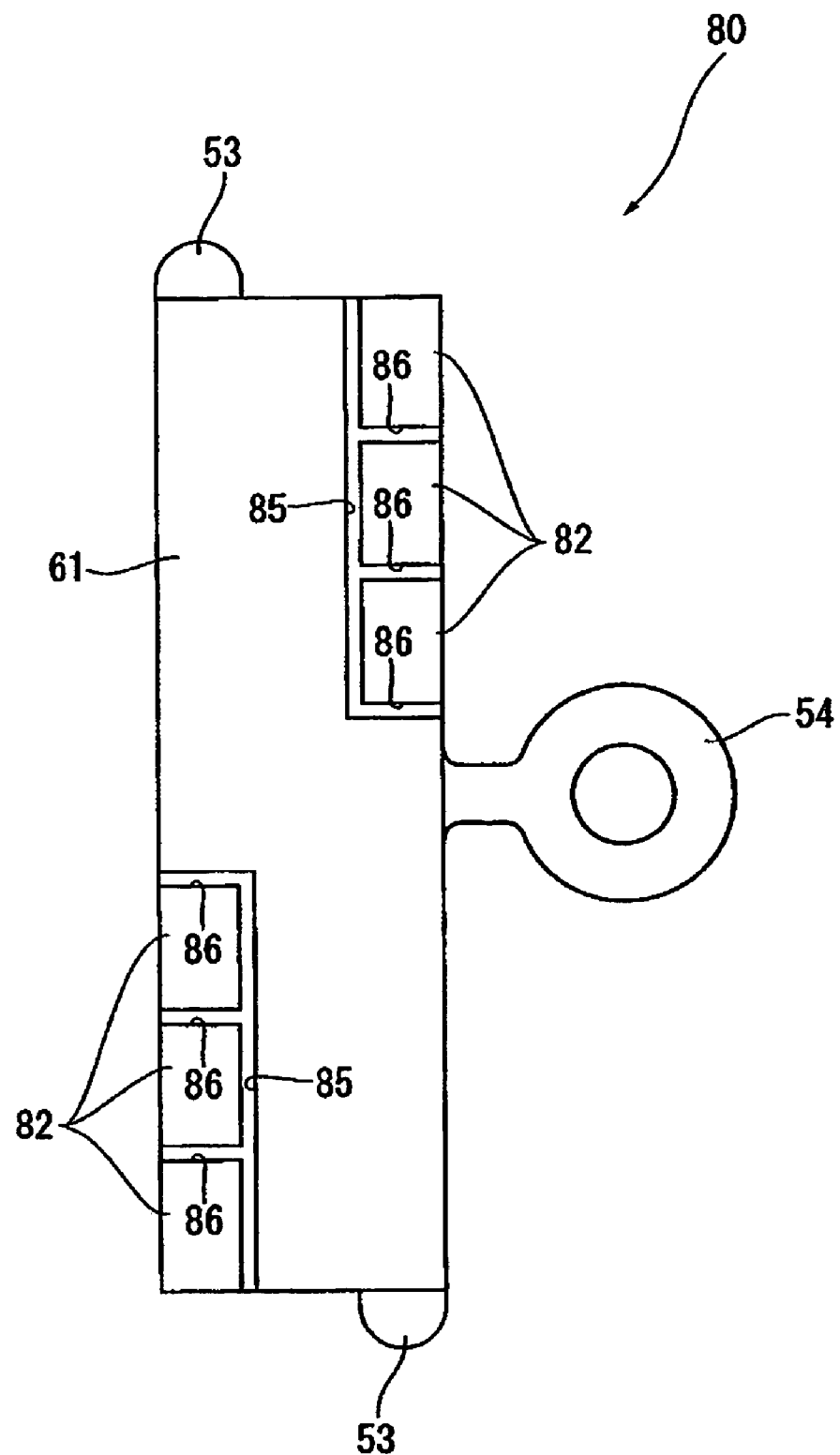
FIG. 14 is a plan view of a piezoelectric vibrator in the third embodiment of the present invention.

FIG. 14 is a plan view of a vibrator 80 in the present embodiment.

In the vibrator 80, the drive electrode 61 and the adjustment electrodes 82 are completely separated and mutually insulated in advance by grooves 85 and 86, and there are no conductive parts 73 from the previous embodiment. Specifically, the linear grooves 85 extend from the two short sides of the vibrator 80 in the longitudinal direction, three grooves 86 extend from the ends of the vibrator 80 in the width direction towards each of these grooves 85, and three adjustment electrodes 82 are aligned in the longitudinal direction of the vibrator 80 at both diagonal portions of the vibrator 80.

The present embodiment is similar to the previous embodiments in that the adjustment electrodes 82 are areas in the electrodes 60 for varying the voltage application areas, and the characteristic frequencies are adjusted according to the state of conduction between the adjustment electrodes 82 and the drive electrode 61.

Figure 15:
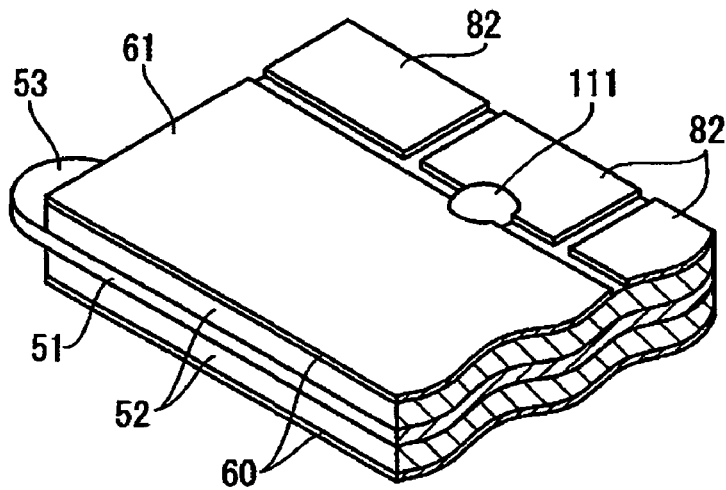
FIG. 15 shows three devices for making the adjustment electrodes conductive with the drive electrode in the same embodiment.
Figure 15:
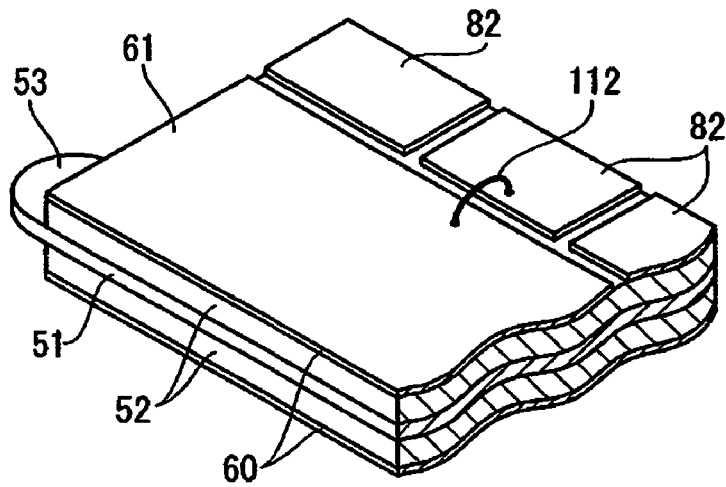
Figure 15:
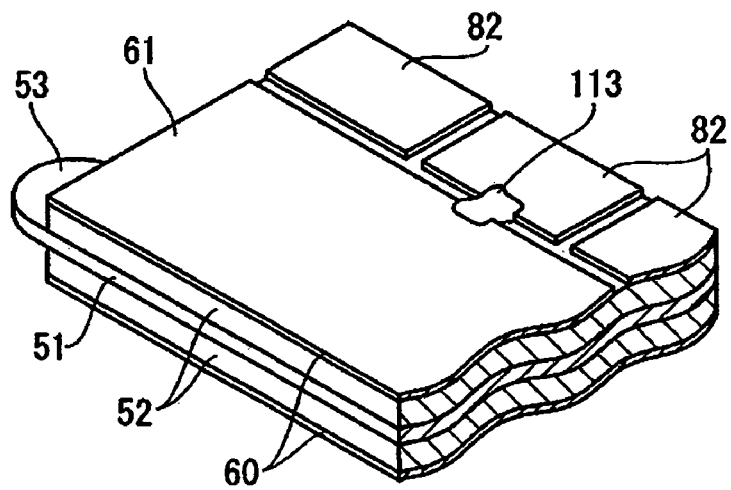

In the present embodiment, the adjustment electrodes 82 are insulated in advance from the drive electrode 61, so electrically conductive members such as a solder 111, a wire 112, and an electrically conductive paste 113 are used as devices for establishing conduction as shown in FIGS. 15(A) through (C).

Specifically, the solder 111, the wire 112, and the electrically conductive paste 113 are disposed between the drive electrode 61 and the adjustment electrodes 82, whereby the adjustment electrodes 82 are made conductive (short-circuited, shorted) with the drive electrode 61 by means of the solder 111, the wire 112, and the electrically conductive paste 113. A lead wire, sputtering, and other such means may also be used to establish conduction between the adjustment electrodes 82 and the drive electrode 61.

The conduction of the adjustment electrodes 82 with the drive electrode 61 is achieved only with the selected adjustment electrodes 82. When the adjustment electrodes 82 are selected, the measured value of Δfr and the stipulated value of Δfr are compared on the basis of the adjusted amounts of Δfr estimated by the three-step selection of the adjustment electrodes 82, and the selection of the adjustment electrodes 82 is determined so that the measured Δfr can be brought close to the stipulated value, similar to the second embodiment.

Thus, the criteria for the selected adjustment electrodes 82 are the same in the present embodiment and the second embodiment, but since the configurations differ in terms of whether the selected adjustment electrodes 72 and adjustment electrodes 82 are made conductive with or insulated from the drive electrode 61, the way in which the adjustment electrodes 72 and 82 are selected differs as described below even when voltage is applied within the same range in the electrodes 60.

Figure 16:
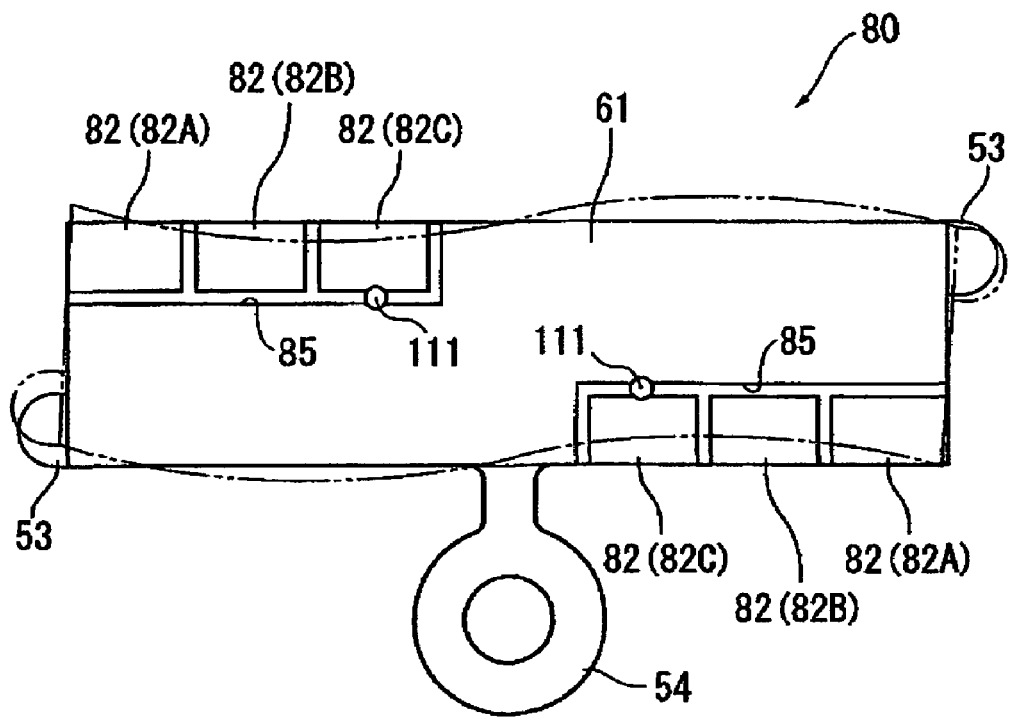
FIG. 16 is a plan view showing the operation of the piezoelectric vibrator in the same embodiment.
Figure 16:
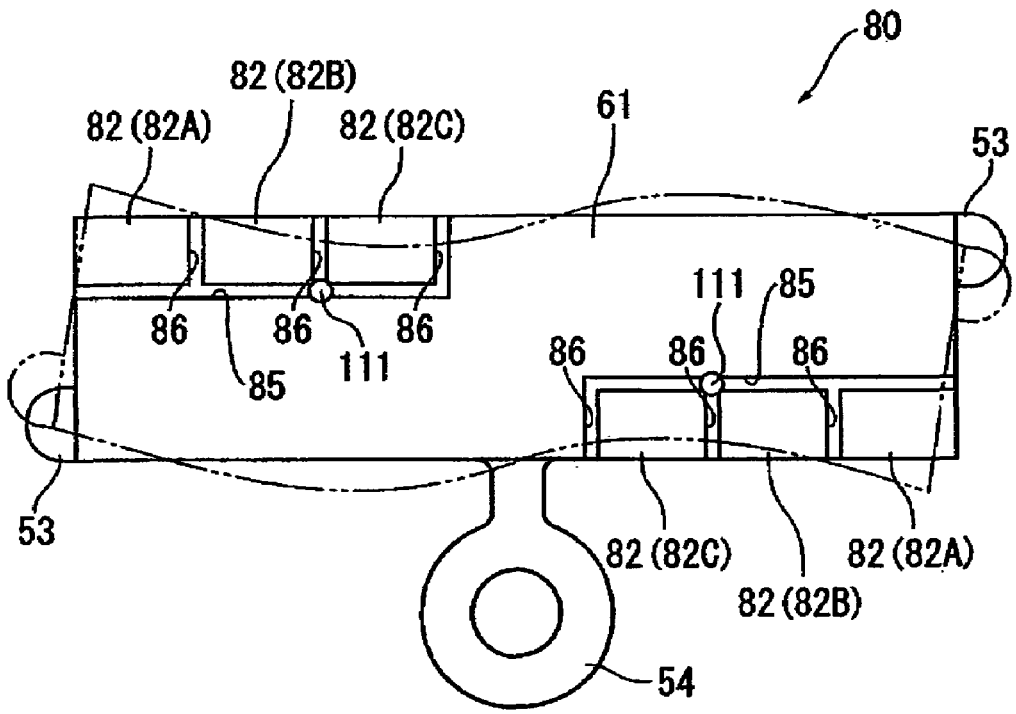

FIGS. 16(A) and (B) show two examples that differ in terms of selection of the adjustment electrodes 82.

In FIG. 16(A), only the adjustment electrodes 82C disposed at the sides opposite the short sides of the vibrator 80 are selected from among the adjustment electrodes 82 aligned along the diagonal portions of the vibrator 80, and solder 111 is placed in droplets in the grooves 85 between the adjustment electrodes 82C and the drive electrode 61. In this case, the two adjustment electrodes 82A and 82B disposed near the short sides of the vibrator 80 remain insulated from the drive electrode 61, and therefore voltage is not applied. The vibrator 80 herein is identical to the vibrator 70 in the second embodiment in which the conductive parts 73B (see FIG. 10) of the adjustment electrodes 72B are cut, in terms of the range of voltage application to the electrodes 60. Unlike the vibrator 80 of the present embodiment, two adjustment electrodes 72A and 72B are selected in the vibrator 70, and the conductive parts 73B are cut.

In FIG. 16(B), the adjustment electrodes 82B that are in the exact middle with respect to the adjustment electrodes 82C disposed opposite the short sides of the vibrator 80 are selected from among the adjustment electrodes 82 aligned along the diagonal portions of the vibrator 80, and the two adjustment electrodes 82B and 82C are made conductive with the drive electrode 61 by means of the solder 111. The solder 111 is placed in droplets in the portion where the grooves 85 connect to the grooves 86 formed between the two adjustment electrodes 82B and 82C, and therefore the two adjustment electrodes 82B and 82C can be simultaneously made conductive with the drive electrode 61 by dropping the solder 111 in one location. In the state shown in FIG. 16(B), voltage is not applied solely to the adjustment electrodes 82A disposed on the short sides of the vibrator 80. The vibrator 80 in FIG. 16(B) is similar to the vibrator 70 shown in FIG. 10(A) in the second embodiment in terms of the range of voltage application to the electrodes 60. Unlike the vibrator 80 in the present embodiment, only the adjustment electrodes 72A are selected in the vibrator 70, and the conductive parts 73A are cut.

Comparing FIGS. 16(A) and (B), the number of adjustment electrodes 82 to which voltage is not applied on both sides of the vibrator 80 in the width direction is greater (two, 82A and 82B) in the state shown in (A) than in the state shown in (B), and the restrictive force on bending vibration is also greater. Therefore, the characteristic frequency of bending vibration is greater than in (B).

According to the third embodiment, the following effects are obtained in addition to the effects (5) through (9) previously described.

(10) In the vibrator 80, the mutually insulated adjustment electrodes 82 and drive electrode 61 are provided in advance, and the adjustment electrodes 82 are made conductive with the drive electrode 61 by means of solder 111, a wire 112, a electrically conductive paste 113, or the like based on the results of inspecting the characteristics of the vibrator 80, whereby the characteristic frequencies can be adjusted simply and reliably. Since the adjustment electrodes 82 are patterned accurately as previously described, and the effect of providing the solder 111 or the like between the adjustment electrodes 82 and the drive electrode 61 on the characteristic frequencies is extremely small, nonuniformities in the adjusted amounts of the characteristic frequencies in each individual vibrator 80 can be reduced. Therefore, the characteristic frequencies can be more simply and reliably adjusted and individual differences pertaining to the characteristic frequencies can be eliminated to greatly improve reliability.

Also, since placement of the solder 111, the wire 112, or the like is merely an operation performed on the surface of the vibrator 80, the characteristic frequencies can be adjusted far more easily than cases such as when the piezoelectric elements 52 are cut, and degradation in the vibration characteristics can be prevented because damage to the vibrator 80 is minimal. Furthermore, the cycle time can be shortened, and equipment expenditures can be reduced.

The characteristic frequencies can also be adjusted by both cutting the conductive parts 73 as described in the second embodiment and establishing conduction (shorting) between the drive electrode 61 and the adjustment electrodes 82 as described in the present embodiment. For example, after the conductive parts 73 in the second embodiment are cut and the drive electrode 61 and adjustment electrodes 72 are insulated, a solder 111 or the like can be used as necessary to reestablish conduction between the temporarily insulated drive electrode 61 and adjustment electrodes 72. This technique can be used if the conductive parts 73 are mistakenly cut for more adjustment electrodes 72 than were originally planned.

Fourth Embodiment

Next, the fourth embodiment of the present invention will be described. In the piezoelectric actuator of the present embodiment, the manner of dividing the electrodes of the vibrator is different than that of the previous embodiments, and the driven object is capable of being driven in both a forward direction and a reverse direction. The piezoelectric actuator of the present embodiment may be incorporated into the lens driving mechanism of a camera, the drive mechanism and position correcting mechanism of a mobile toy, the drive mechanism of a windup timepiece, the calendar mechanism of a timepiece, or the like.

Figure 17:
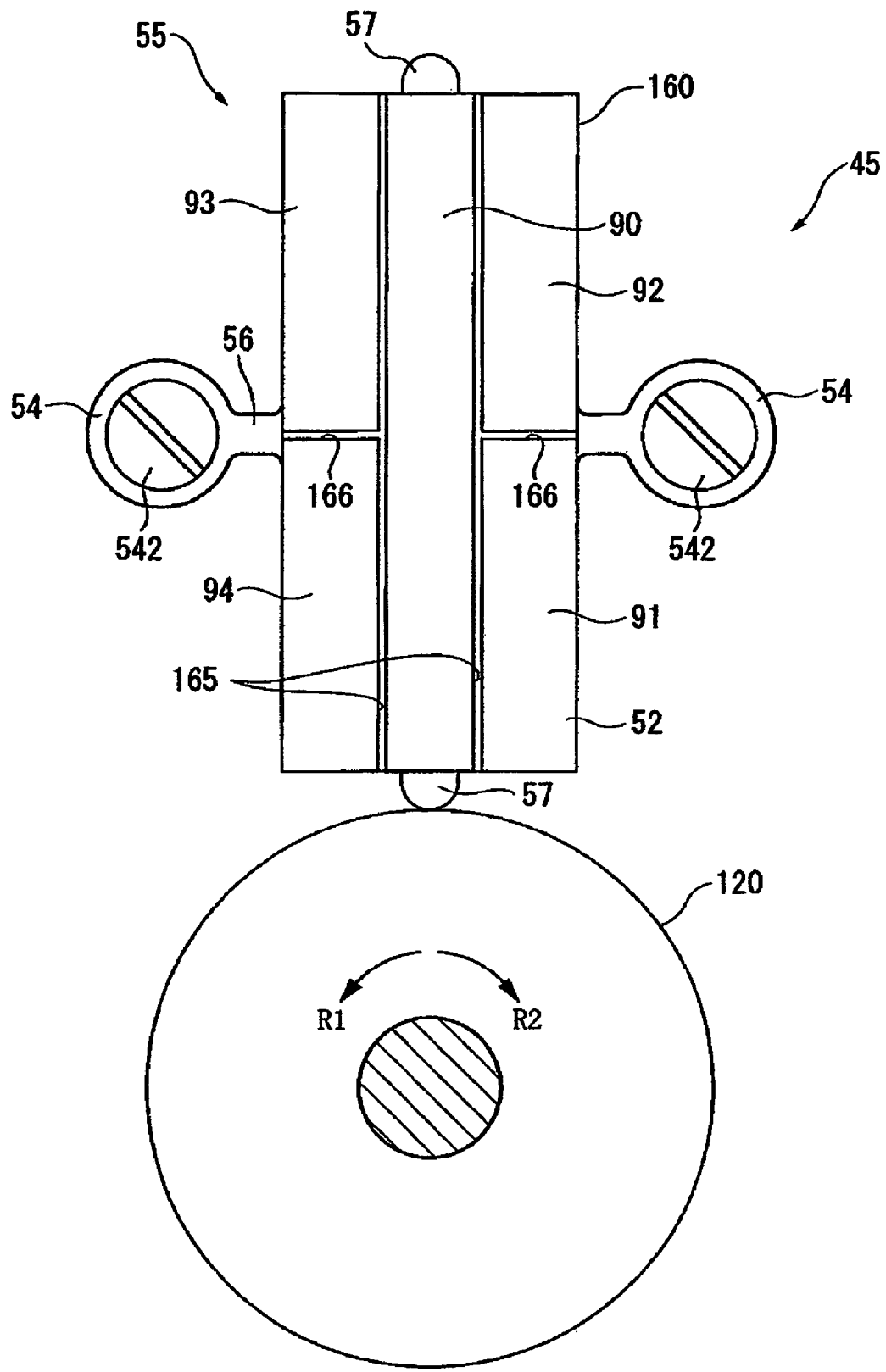
FIG. 17 is a plan view showing the piezoelectric actuator in the fourth embodiment of the present invention.

FIG. 17 is a plan view schematically depicting a piezoelectric actuator 45 in the present embodiment.

The actuator 45 includes a vibrator 55, and a rotor 120 as a driven object.

The rotor 120 is a diskoid rotating body, and a protuberance 57 of the vibrator 55 is in contact with the outer peripheral end face thereof.

In the vibrator 55, a piezoelectric element 52 and a reinforcing plate 56 are stacked and formed into an overall rectangular thin plate shape in substantially the same manner as the vibrator 50 (FIG. 4) of the first embodiment. The protuberance 57 in contact with the rotor 120 is formed substantially in the middle of the short side of the reinforcing plate 56, and arms 54 of the reinforcing plate 56 are formed on either side of the vibrator 55 in the width direction.

Also, an electrode 160 provided on the surface of the piezoelectric element 52 of the vibrator 55 is divided into five parts by the carving of grooves 165 and 166. Specifically, two grooves 165 are formed in the electrode 160 in the longitudinal direction, and the electrodes on both sides in the width direction from among the electrodes divided into three substantially equal parts by the grooves 165 are themselves divided into two equal parts each by the grooves 166 extending in the transverse direction of the piezoelectric element 52. These grooves 165 and 166 result in the formation of a longitudinal area 90 for primarily inducing longitudinal vibration, provided in the longitudinal direction substantially in the middle of the piezoelectric element 52; a pair of bending areas 91 and 93 for primarily inducing bending vibration, at one diagonal of the piezoelectric element 52 on both sides of the longitudinal area 90; and a pair of bending areas 92 and 94 for primarily inducing bending vibration, at the other diagonal of the piezoelectric element 52.

Figure 18:
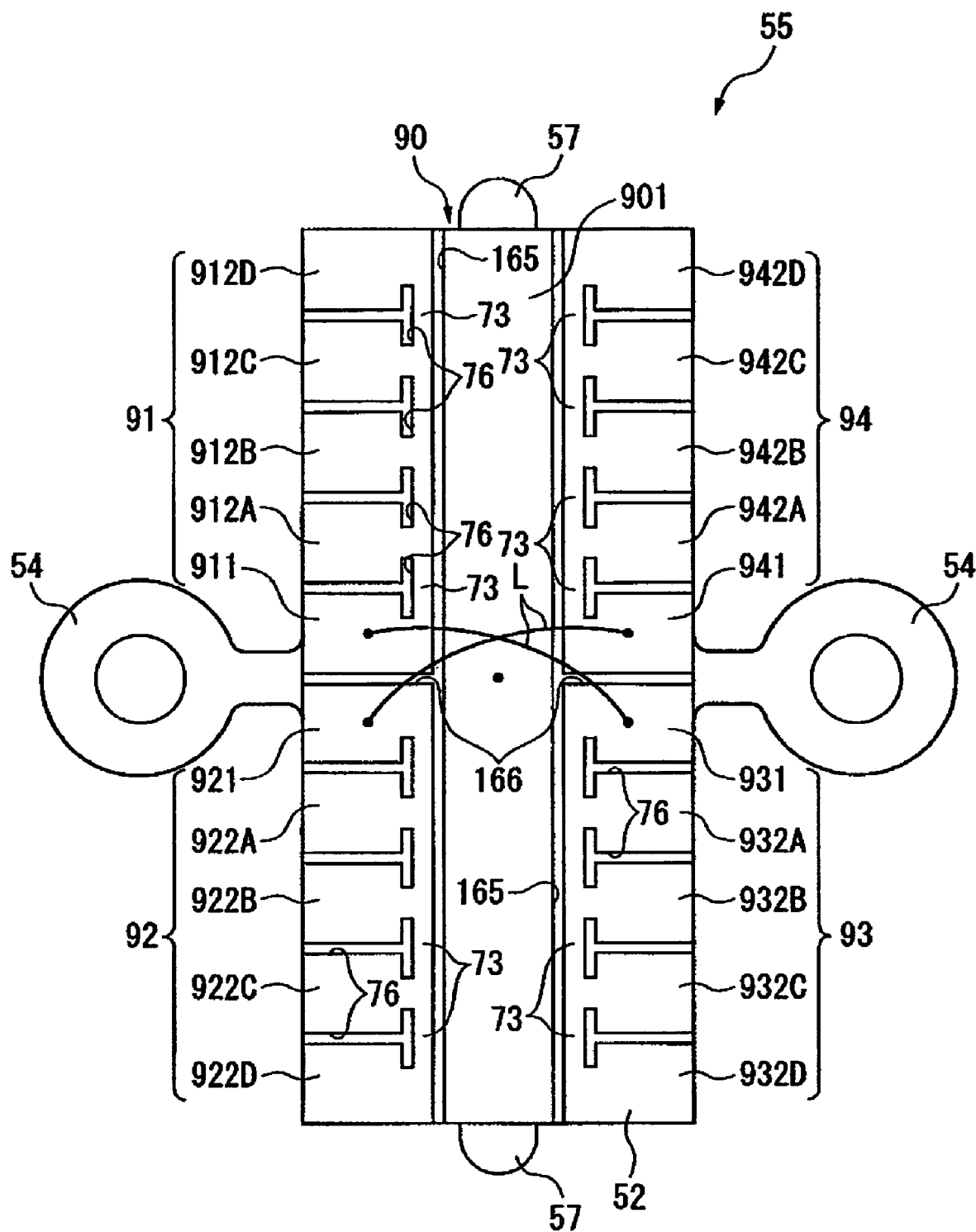
FIG. 18 is a plan view of the piezoelectric vibrator in the same embodiment.

FIG. 18 shows the configuration of the vibrator 55 in more detail. A drive electrode 901 is provided over the entire longitudinal area 90.

The bending area 91 is partitioned into five sections by four T-shaped grooves 76 extending in the width direction of the piezoelectric element 52. One drive electrode 911 connected to a lead wire L is formed on the section nearest the center of the vibrator 55, and four adjustment electrodes 912A through 912D are formed respectively in the four remaining sections. The T-shaped grooves 76 extend from the ends of the vibrator 55 in the width direction near to the grooves 165, and the portions between the grooves 165 and the T-shaped grooves 76 each constitute conductive parts 73 for making the adjustment electrodes 912A through 912D conductive with the drive electrode 911. The conductive parts 73 are supplied with an electric current and melted as necessary, similar to the second embodiment. In other words, the bending area 91 constitutes the adjustment area for the characteristic vibration of the vibrator 55.

The other bending areas 92, 93, and 94 are also areas for adjusting the characteristic vibration of the vibrator 55, similar to the bending area 91. Drive electrodes 921, 931, and 941 are formed near the center of the vibrator 55, and four adjustment electrodes 922A through 922D, 932A through 932D, and 942A through 942D are formed on each of these bending areas 92, 93, and 94.

The drive electrode 911 and a drive electrode 931 are connected to each other by a lead wire L, and a drive electrode 921 and a drive electrode 941 are also connected to each other by a lead wire L. The drive electrodes and the adjustment electrodes provided to the bending areas 91 through 94 are connected to a voltage application device (not shown) via these lead wires L. The drive electrode 901 is also connected to the voltage application device by a lead wire (not shown). Also, the reinforcing plate 51 is connected to the ground.

In this piezoelectric actuator 45, the rotor 120 shown in FIG. 17 can be rotatably driven in both a forward direction R1 and a reverse direction R2 by separately using the bending areas 91 and 93 and the bending areas 92 and 94. Specifically, the piezoelectric actuator 45 has a forward mode and a reverse mode as operating modes, and operates in either the forward mode or the reverse mode.

FIG. 19(A) shows the driven state in the forward direction R1, and FIG. 19(B) shows the driven state in the reverse direction R2. Specifically, when voltage is applied to the piezoelectric element 52 that features the longitudinal area 90 and the bending areas 91 and 93, primarily longitudinal vibration is induced in the longitudinal area 90, and primarily bending vibration is induced in the bending areas 91 and 93 as shown in FIG. 19(A). Specifically, as a result of voltage application to the bending areas 91 and 93, the expansion and contraction of the piezoelectric element 52 on both sides of the piezoelectric element 52 in the width direction becomes imbalanced in the behavior of the entire vibrator 55, and therefore a moment is created in the direction orthogonal to the longitudinal direction of the piezoelectric element 52 to induce bending vibration, and the vibrator 55 operates in a mixed mode involving both longitudinal vibration and bending vibration. The protuberances 57 of the vibrator 55 thereby describe an elliptical trajectory E1 that is inclined in relation to a center line C in the longitudinal direction running through the center of the vibrator 55. The rotor 120 is then rotated in the forward direction R1 by the pressure from the protuberances 57.

When voltage is applied to the bending areas 92 and 94 instead of the bending areas 91 and 93, the bending areas 91 and 93 and the bending areas 92 and 94 are disposed in line symmetry in relation to the center line C, so the elliptical trajectory E2 described by the protuberances 57 rotates in the opposite direction in line symmetry in relation to the center line C with respect to the previous elliptical trajectory E1, as shown in FIG. 19(B). At this time, the rotor 120 is rotatably driven in the reverse direction R2 by the pressure from the protuberances 57.

The number, size, and direction of alignment of the adjustment electrodes in the bending areas 91 through 94 are determined so that nonuniformities in $\Delta fr$ in the vibrator 55 are appropriately adjusted, and the drive electrodes and adjustment electrodes in the bending areas 91 through 94 are patterned with high precision to achieve a specific adjustment to $\Delta fr$. In the bending areas 91 through 94 of the present embodiment, the drive electrodes and the adjustment electrodes are formed to be substantially the same size, but the four adjustment electrodes 912A through 912D may be provided with a length ratio or the like.

Figure 20:
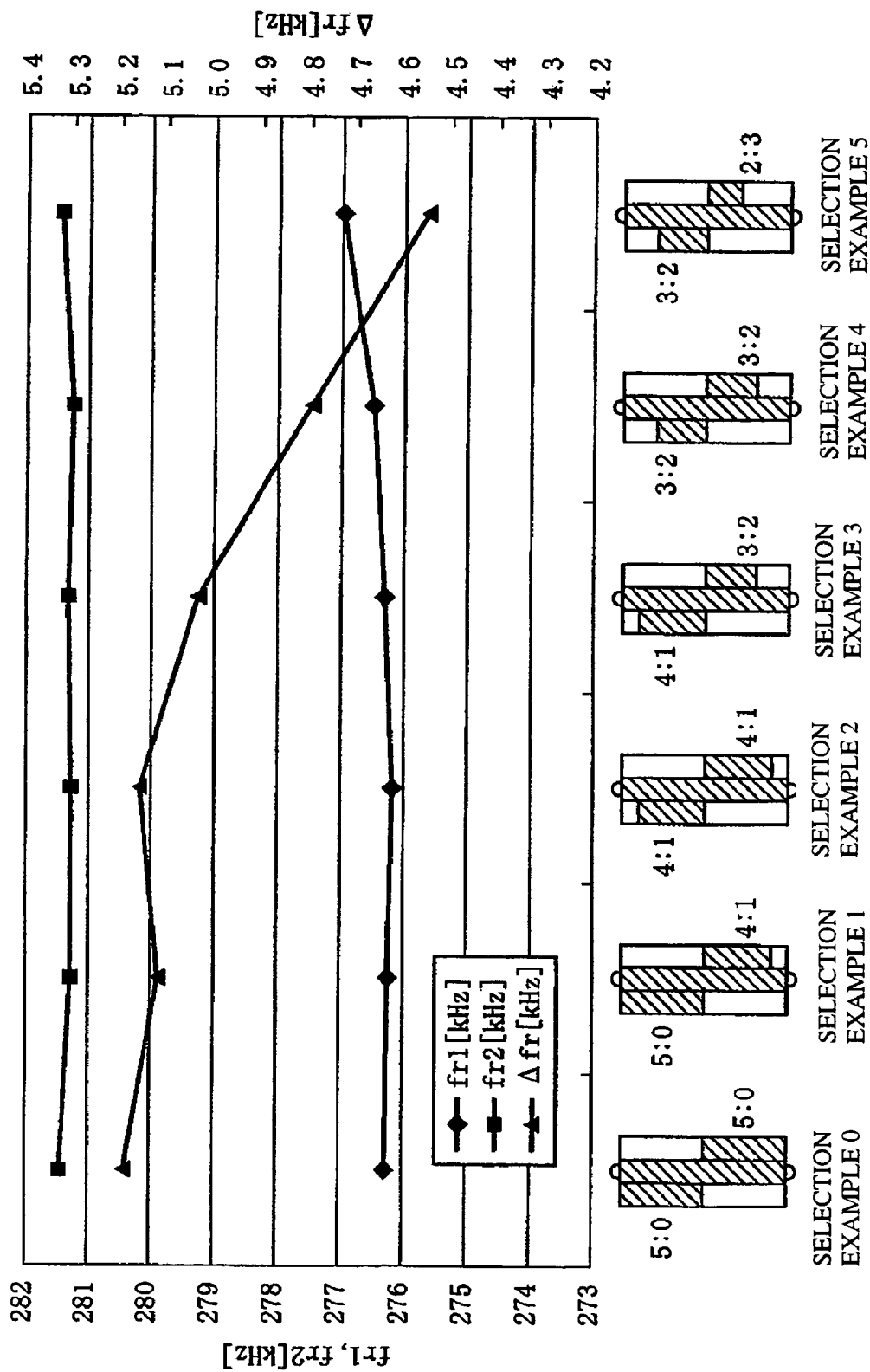
FIG. 20 is a diagram showing the manner in which the characteristic frequencies vary according to the selection of adjustment electrodes in a sample of a piezoelectric vibrator in the same embodiment.

In order to obtain this $\Delta fr$ adjustment, the characteristic frequencies were measured using the selection of adjustment electrodes shown in FIG. 20. Specifically, FIG. 20 shows the manner in which the characteristic frequencies vary according to the selection of adjustment electrodes by the melting of the conductive parts 73 (FIG. 18) in a sample of a vibrator 55.

The lower column in FIG. 20 is a schematic depiction of six combinations of selected adjustment electrodes 912A through 912D and 932A through 932D. Specifically, "selection example 0" denotes a state in which none of the adjustment electrodes 912A through 912D and 932A through 932D are selected, and "selection example 1" denotes that the adjustment electrode 912D farthest from the drive electrode 911 in the bending area 91 is selected and insulated from the drive electrode 911, and the ratio of voltage application areas to voltage non-application areas in the bending area 91 is 4:1. "Selection example 2," "selection example 3," "selection example 4," and "selection example 5" denote that the number of selected adjustment electrodes selected increases in increments of one in an alternating manner between the diagonals of the vibrator 55.

The graph shown in FIG. 20 is a plot obtained by measuring the longitudinal resonance frequency fr1, the bending resonance frequency fr2, and the difference $\Delta fr$ (fr2−fr1) between the two frequencies for a sample of a vibrator 55 in the six selection examples 0 through 5 in the lower column of FIG. 20. According to this graph, $\Delta fr$, which was 5.2 kHz before adjustment (selection example 0), tends to gradually decrease with each selection example 0 through 5.

The way in which the adjustment electrodes 912A through 912D and 932A through 932D are selected is not limited to these selection examples 0 through 5, and the $\Delta fr$ adjustment can be estimated based on these selection examples 0 through 5. Neither is the selection limited to FIG. 20, and the $\Delta fr$ adjustment may be set based on the measured data of a plurality of samples of the vibrator 55.

Also, FIG. 20 shows only a case of selection being made from the adjustment electrodes 912A through 912D and 932A through 932D in the bending areas 91 and 93, which are the areas for adjusting the forward operation, but the corresponding relationship between the way in which the adjustment electrodes are selected and the characteristic frequencies in this case is also valid for cases in which a selection is made from the adjustment electrodes 922A through 922D and 942A through 942D in the bending areas 92 and 94, which are the areas for adjusting the reverse operation. Specifically, since the bending areas 91 and 93 and the bending areas 92 and 94 are disposed in line symmetry in relation to the center line C (FIG. 19) of the vibrator 55, the vibration trajectory of the vibrator 55 when voltage is applied to the bending areas 91 and 93, and the vibration trajectory of the vibrator 55 when voltage is applied to the bending areas 92 and 94, are also in substantial line symmetry in relation to the center line C of the vibrator 55. It can be deduced that if a selection is made from the adjustment electrodes 922A through 922D and 942A through 942D in the bending areas 92 and 94 similar to the selection examples 0 through 5 shown in FIG. 20, that the characteristic frequencies of the vibrator 55 also vary in substantially the same manner as in the graph in FIG. 20.

In this vibrator 55, the difference $\Delta fr$ between the longitudinal resonance frequency fr1 and the bending resonance frequency fr2 of the vibrator 55 is adjusted in the same manner as in the second embodiment, but the piezoelectric actuator 45 of the present embodiment is capable of being driven in both the forward direction R1 (forward mode) and the reverse direction R2 (reverse mode), and $\Delta fr$ is therefore adjusted in both the forward mode and the reverse mode. In the present embodiment, the $\Delta fr$ is not adjusted separately for the forward and reverse operating modes, and the characteristic frequencies are adjusted so that the difference $\Delta fr$ between the forward mode and the reverse mode is not lost.

Figure 19:
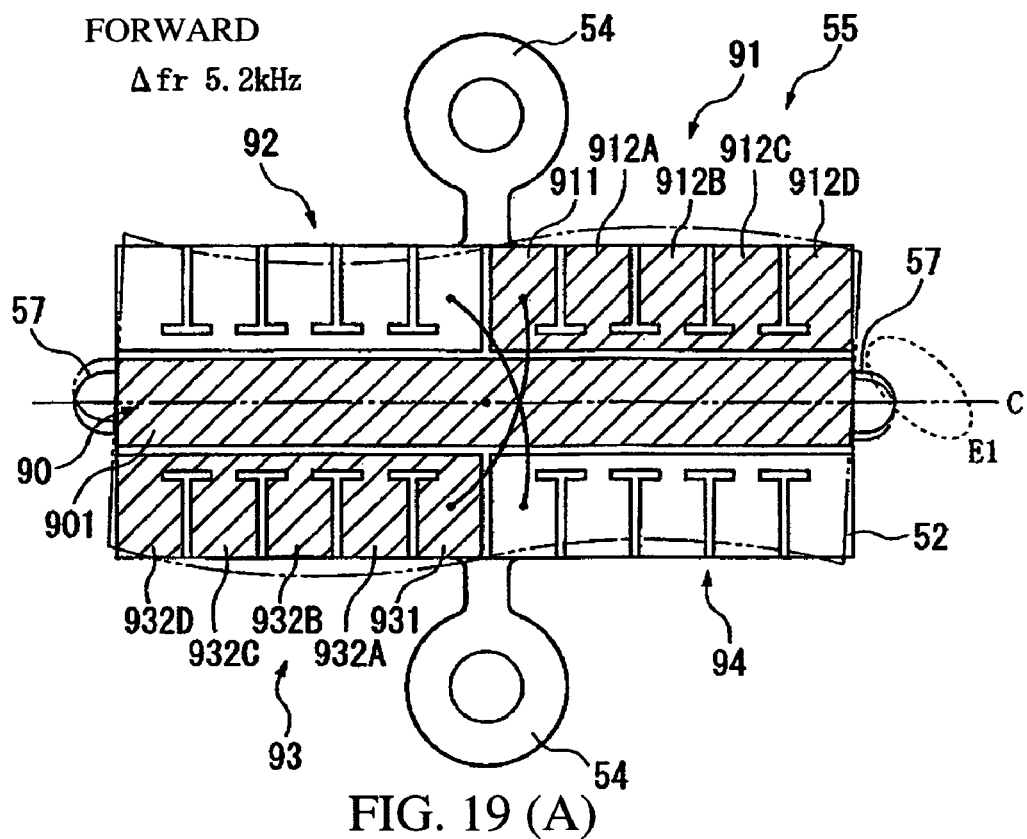
FIG. 19(A) is a diagram showing a piezoelectric vibrator in a forward mode in the same embodiment, and (B) is a diagram showing a piezoelectric vibrator in a reverse mode in the same embodiment.
Figure 19:
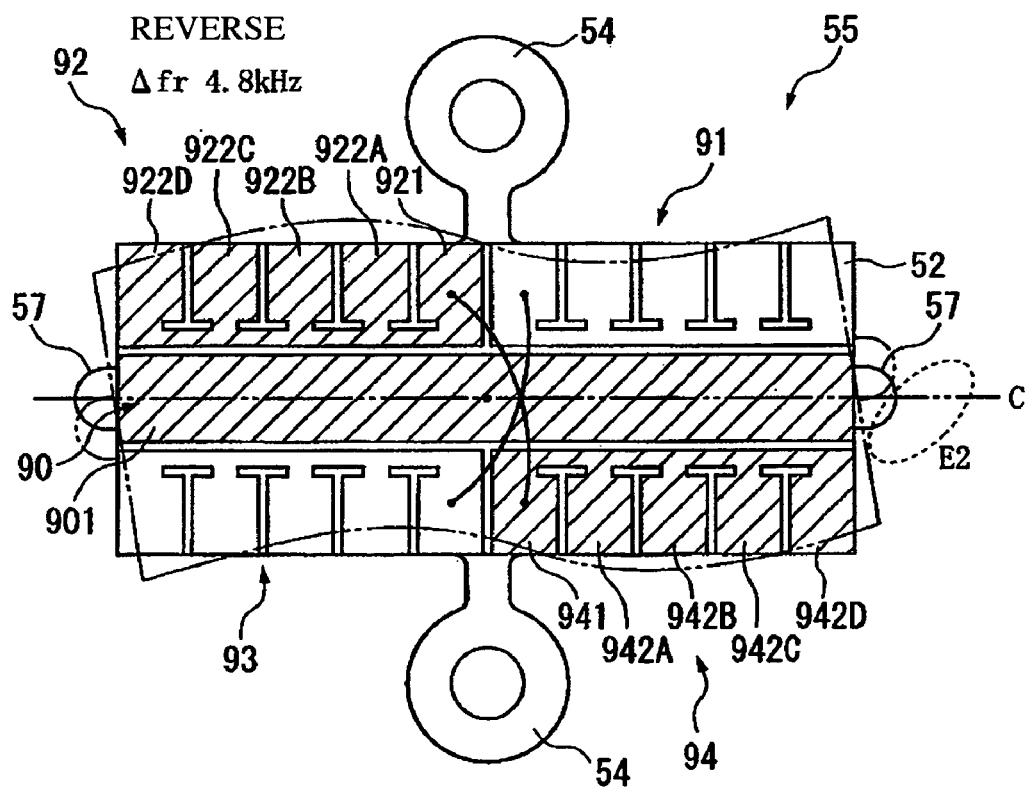

One example of adjusting the characteristic frequencies for the vibrator 55 is shown herein. FIG. 19 shows the vibrator 55 before adjustment. In the forward mode shown in FIG. 19(A), $\Delta fr$ is 5.2 kHz, while in the reverse mode shown in FIG. 19(B), $\Delta fr$ is 4.8 kHz, and the drive characteristics are nonuniform during the forward and reverse modes. As shown in FIG. 20 above, when the area of voltage application decreases due to the selection of the adjustment electrodes in the bending areas 91 and 93, the tendency of $\Delta fr$ to decrease is perceived, so $\Delta fr$ in the reverse mode is used as the stipulated value, and $\Delta fr$ in the forward mode is reduced.

The adjusted amounts of $\Delta fr$ set for each way of selecting the adjustment electrodes 912A through 912D and 932A through 932D in the bending areas 91 and 93 are used herein. Specifically, as shown in FIG. 20, using the same selection method as in selection examples 1 through 5 makes it possible to adjust $\Delta fr$ in stages from about 5.1 kHz to about 4.55 kHz, and to determine in stages the amount by which $\Delta fr$ has changed in comparison with the value before adjustment, that is, the $\Delta fr$ adjustment.

In the example shown in FIG. 19, the selection of the adjustment electrodes 912A through 912D and 932A through 932D in the bending areas 91 and 93 is determined, and $\Delta fr$ is adjusted in the forward mode so as to decrease, whereby $\Delta fr$ in the forward mode (5.2 kHz) can be brought closer to $\Delta fr$ in the reverse mode (4.8 kHz). Selection example 4 can herein be used, in which the $\Delta fr$ adjustment is about 0.4 kHz, and the conductive parts 73 are melted based on selection example 4.

Figure 21:
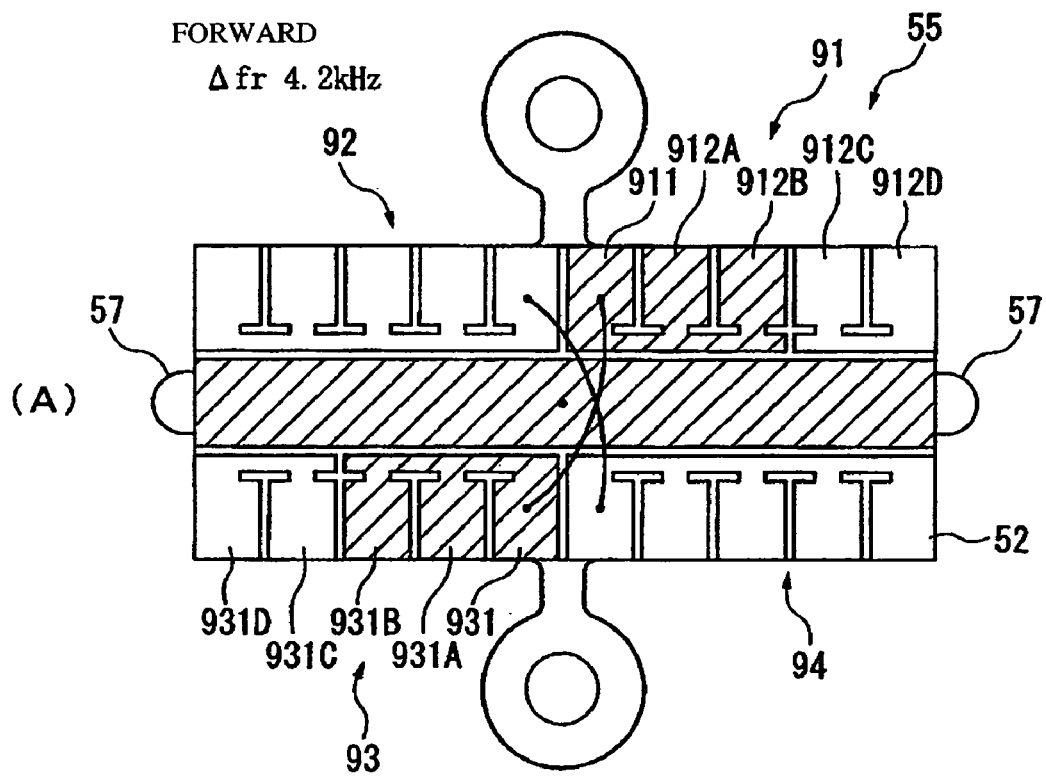
FIG. 21(A) is a diagram showing the state after the characteristic frequencies are adjusted in the piezoelectric vibrator in FIG. 19(A), and (B) shows a piezoelectric vibrator during the reverse mode, similar to FIG. 19(B)
Figure 21:
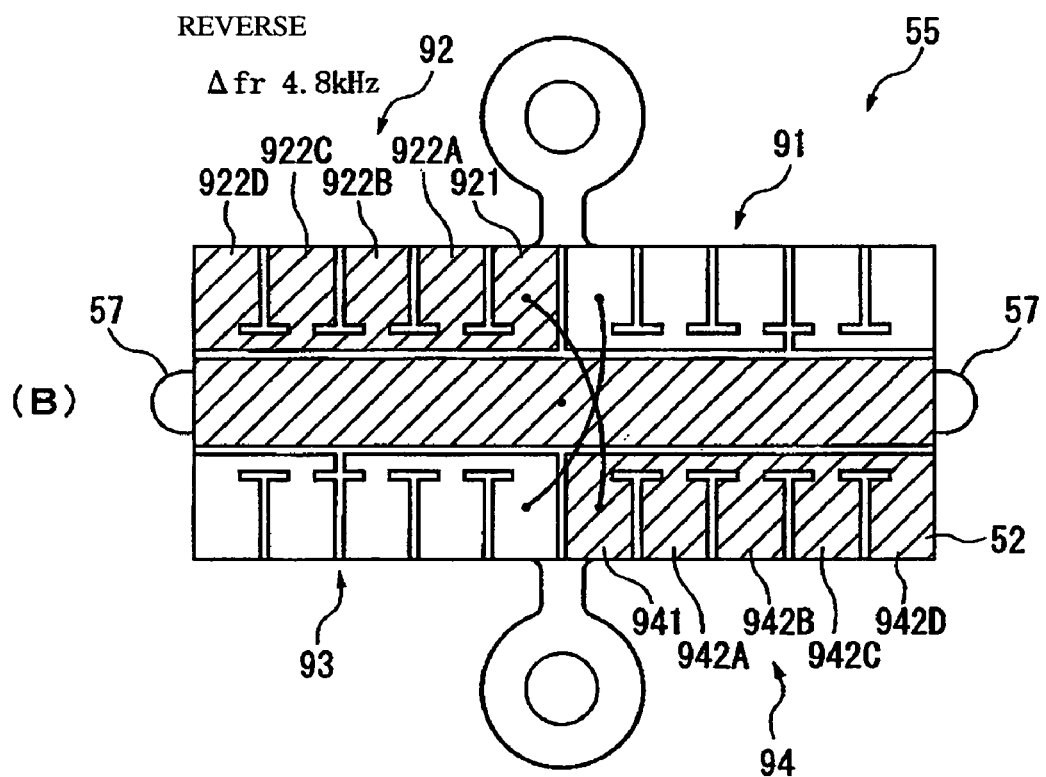

FIG. 21 shows a vibrator 55 wherein the characteristic frequencies are adjusted by such a procedure. As a result of adjusting the characteristic frequencies, $\Delta fr$ in the forward mode becomes 4.8 kHz, the same as $\Delta fr$ in the reverse mode, and the nonuniformities in the drive characteristics of the actuator 45 between the forward and reverse modes are eliminated.

The procedure for adjusting the characteristic frequencies of the vibrator 55 described with reference to FIGS. 19 and 21 is not limited to one example, and the necessary adjusted amounts of $\Delta fr$ according to each individual vibrator 55 can be obtained and suitably adjusted. Also, unlike the previous description, $\Delta fr$ in the reverse mode may be adjusted so as to match $\Delta fr$ in the forward mode, in which case the characteristic frequencies during the reverse mode are adjusted by selecting the adjustment electrodes in the bending areas 92 and 94 according to the reverse mode. Specifically, one of the $\Delta fr$ values from either the forward mode or the reverse mode can be adjusted using the other $\Delta fr$ value as a stipulated value.

The $\Delta fr$ value in the forward mode and the $\Delta fr$ value in the reverse mode may be completely different, and the difference in $\Delta fr$ between the forward and reverse modes can be maintained within a specific suitable range.

According to the present embodiment, the following effects are obtained in addition to the effects described in the second embodiment.

(11) In a piezoelectric actuator 45 having a forward mode in which the rotor 120 rotates in the forward direction R1, and a reverse mode in which the rotor 120 rotates in the reverse direction R2, $\Delta fr$ in the forward mode is adjusted by making the adjustment electrodes 912A through 912D conductive with the drive electrode 911 in the bending area 91 provided to the vibrator 55, or by the making the adjustment electrodes 932A through 932D conductive with the drive electrode 931 in the bending area 93. Also, $\Delta fr$ in the reverse mode is adjusted by making the adjustment electrodes 922A through 922D conductive with the drive electrode 921 in the bending area 92, or by making of the adjustment electrodes 942A through 942D conductive with the drive electrode 941 in the bending area 94. Since $\Delta fr$ is adjusted so as to eliminate the difference in $\Delta fr$ between the forward and reverse modes, nonuniformities in the drive characteristics between the forward and reverse modes can be eliminated. The rotor 120 can thereby be rotatably driven at a specific speed with accuracy in both the forward direction R1 and the reverse direction R2.

(12) Also, since the bending areas 91 and 93 and the bending areas 92 and 94 are disposed in line symmetry in relation to the center line C of the vibrator 55, determining the $\Delta fr$ adjustment for one of the bending areas 91 and 93 that correspond to the forward mode or the bending areas 92 and 94 that correspond to the reverse mode on the basis of a sample of the vibrator 55 makes is possible to assume that $\Delta fr$ used during the other operating mode will be substantially the same. Specifically, the adjusted amounts of $\Delta fr$ in the forward and reverse modes need not be determined separately, and the adjustment of the characteristic frequencies can be simplified.

Fifth Embodiment

Next, the fifth embodiment of the present invention will be described. The present embodiment operates in a forward mode and a reverse mode similar to the fourth embodiment, but differs in part from the vibrator of the fourth embodiment in the distribution of electrodes.

Figure 22:
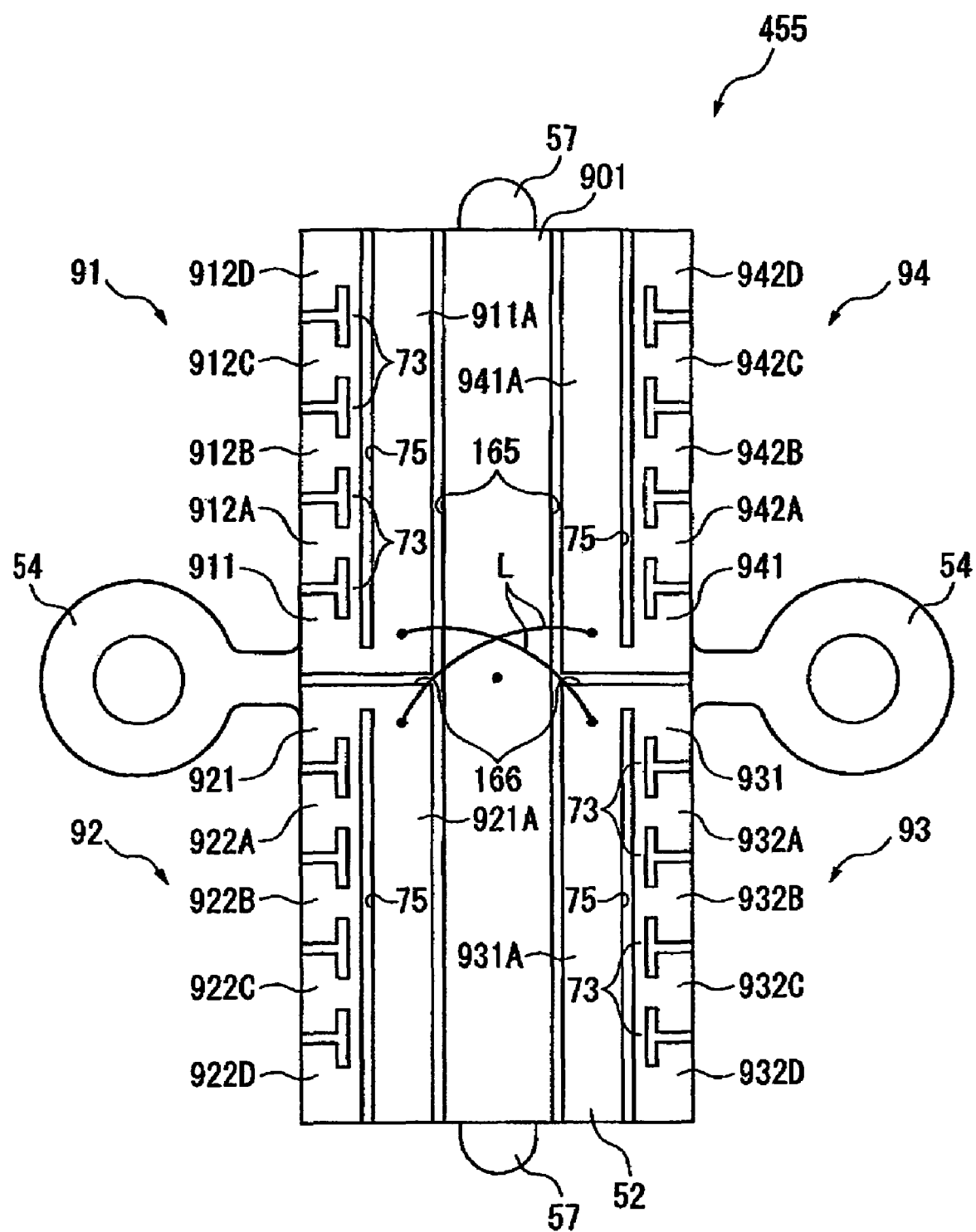
FIG. 22 is a plan view showing the piezoelectric actuator in the fifth embodiment of the present invention.

FIG. 22 shows a vibrator 455 in the present embodiment. In the vibrator 455, bending areas 91 and 93 and bending areas 92 and 94 are disposed similar to those in the vibrator 55 (FIG. 18) of the fourth embodiment, but the bending areas 91 through 94 are divided substantially in two by the linear grooves 75 formed in the longitudinal direction, and drive electrodes 911A, 921A, 931A, and 941A extending in the longitudinal direction of the vibrator 455 are formed in the areas on the drive electrode 901 side in the bending areas 91 through 94.

In the bending areas 91 through 94, one drive electrode 911 and four adjustment electrodes 912A through 912D are formed in each of the areas on the outer sides of the drive electrodes 911A, 921A, 931A, and 941A, similar to the fourth embodiment.

The drive electrodes 911A, 921A, 931A, and 941A are provided with lead wires L, and the electrodes in the bending areas 91 through 94 are connected to a voltage application device (not shown) by means of these lead wires L.

Figure 23:
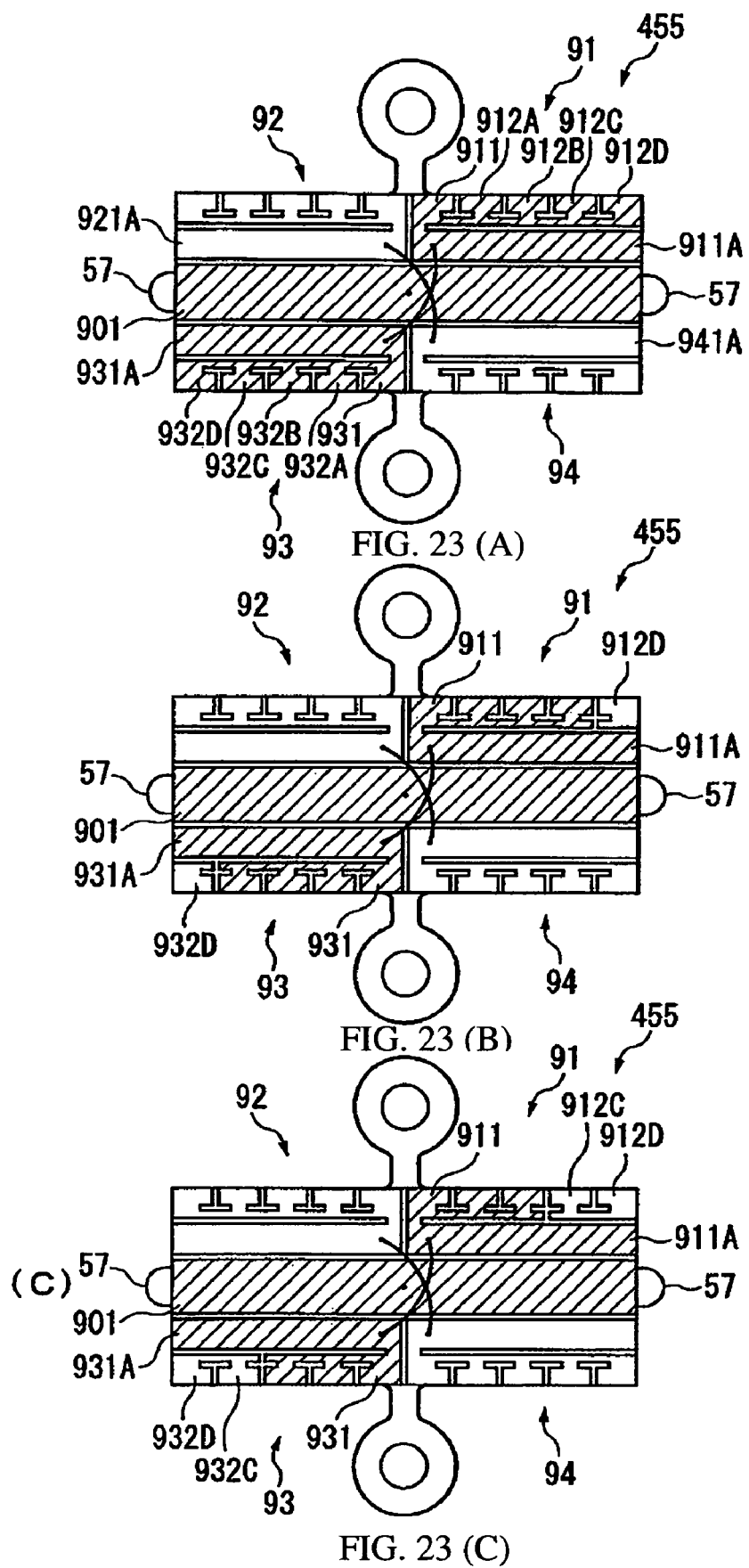
FIG. 23 is a diagram showing an example of adjusting the characteristic frequencies in the vibrator of the same embodiment.

FIG. 23 shows an example of adjusting the characteristic frequencies of the vibrator 455. FIG. 23(A) shows the vibrator 455 before adjustment, and FIG. 23(B) shows a state in which the conductive parts 73 (FIG. 22) of the adjustment electrodes 912D and 932D disposed at the corners of the vibrator 455 have been cut from among the adjustment electrodes 912A through 912D and 932A through 932D in the bending areas 91 and 93, on the basis of the preset Δfr adjustments.

In FIG. 23(C), the conductive part 73 of the adjustment electrode 912C in the bending area 91 has been cut, the adjustment electrodes 912C and 912D are insulated from the drive electrode 911, and the conductive part 73 of the adjustment electrode 932C in the bending area 93 has also been cut, whereby the adjustment electrodes 932C and 932D are insulated from the drive electrode 931.

FIG. 23 shows only an example of adjusting the adjustment electrodes in the bending areas 91 and 93 that correspond to the forward mode, but the result is the same in the bending areas 92 and 94.

When the adjustment electrodes in the bending areas 91 and 93 are electrically cut off from the drive electrode 911 as in FIGS. 23(B) and (C), the dimensions of the voltage application area in the longitudinal direction of the vibrator 455 decrease. Therefore, the expansion and contraction of the piezoelectric element 52 on both sides of the vibrator 455 in the width direction needed to induce bending vibration cannot be sufficiently obtained, and the degree of imbalance of expansion and contraction in the piezoelectric element 52 in the overall behavior of the vibrator 455 decreases, while in the present embodiment, expansion and contraction in the piezoelectric element 52 in the drive electrodes 911A and 931A succeeds, and this imbalance can be maintained.

In the present embodiment, cutting between the linear grooves 75 and the grooves 166 makes it possible to establish insulation between the drive electrode 911A and the drive electrode 911, whereby adjustment is possible in five stages with one drive electrode and four adjustment electrodes in the bending areas 91 through 94.

According to the present embodiment, the following effects are obtained in addition to the effects described in the fourth embodiment. (13) By providing the drive electrodes 911A through 941A that extend in the longitudinal direction of the bending areas 91 through 94 of the vibrator 455, an imbalance of expansion and contraction is maintained in the piezoelectric element 52 on both sides in the width direction of the vibrator 455 needed to induce bending vibration, and the vibrator 455 is induced to operate in a mixed mode involving both longitudinal vibration and bending vibration. The elliptical trajectories E1 and E2 of the protuberances 57 can therefore be created.

Sixth Embodiment

Next, the sixth embodiment of the present invention will be described. The present embodiment differs from vibrators of the fourth and fifth embodiments in terms of the division of electrodes.

Figure 24:
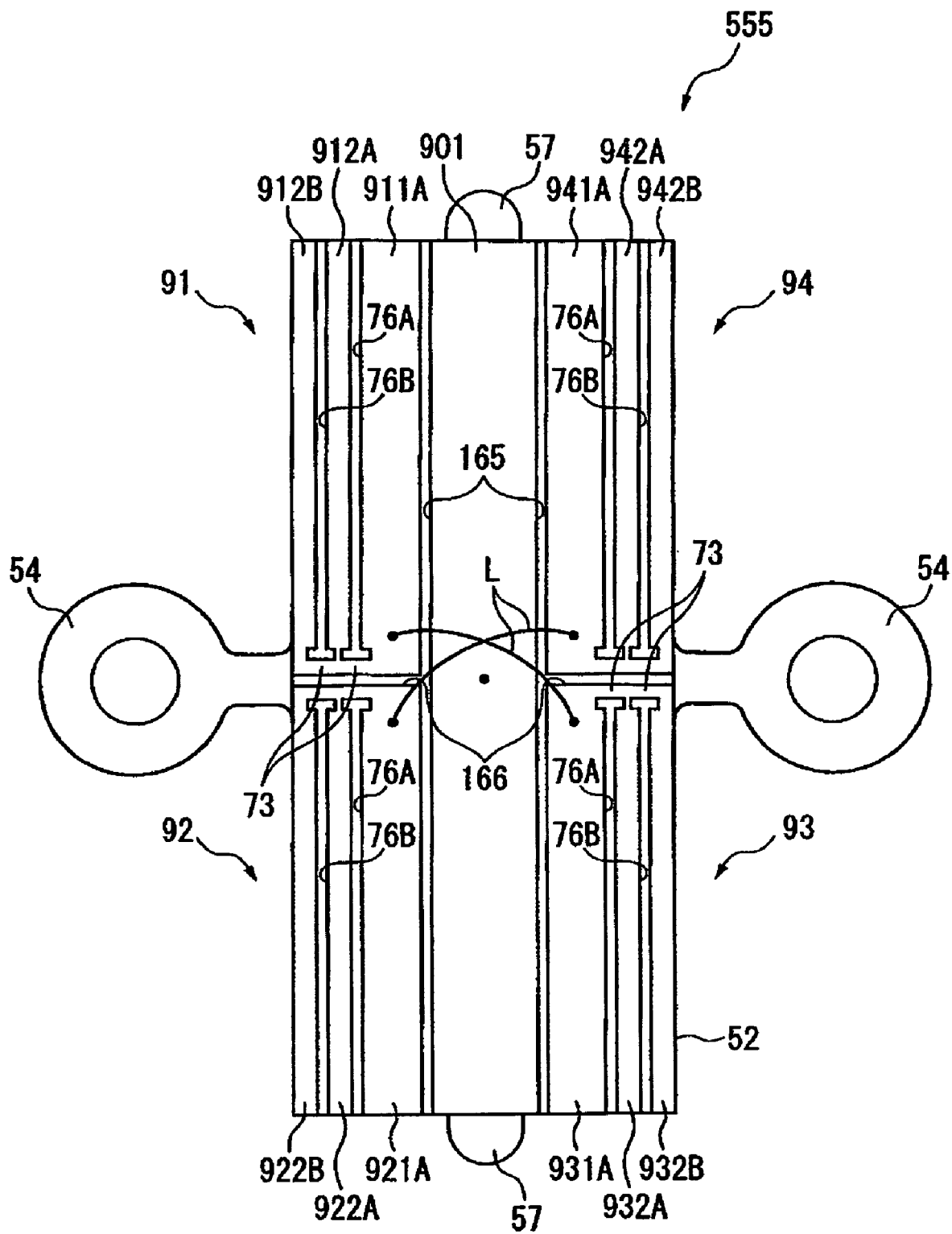
FIG. 24 is a plan view showing the piezoelectric actuator in the sixth embodiment of the present invention.

FIG. 24 shows a vibrator 555 in the present embodiment. In the bending areas 91 through 94 of the vibrator 555, two T-shaped grooves 76A and 76B near the grooves 166 are formed extending from each end of the vibrator 555 in the longitudinal direction, and the spaces between the T-shaped grooves 76A and the longitudinal grooves 165 constitute drive electrodes 911A, 921A, 931A, and 941A. Also, two adjustment electrodes 912A, 912B, and the like are disposed adjacent to each of these drive electrodes 911A and the like. The width of the drive electrodes 911A and the like is substantially half of the width of the bending area 91.

Figure 25:
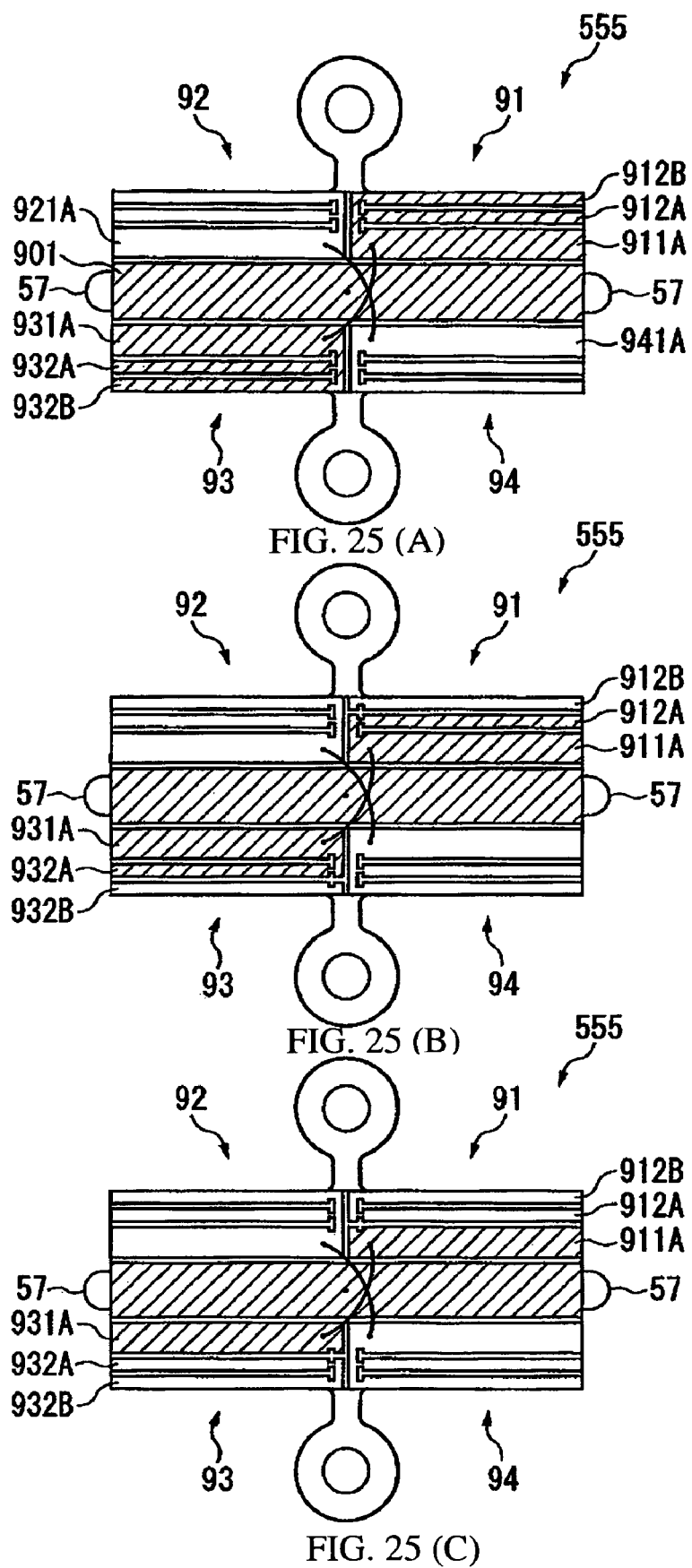
FIG. 25 is a diagram showing an example of adjusting the characteristic frequencies of the vibrator in the same embodiment.

FIG. 25 shows an example of adjusting the characteristic frequencies of the vibrator 555.

FIG. 25(A) shows the vibrator 555 before adjustment, and FIG. 25(B) shows a state in which the conductive parts 73 (FIG. 24) of the adjustment electrode 912B and the adjustment electrode 932B disposed at the ends of the vibrator 555 have been cut on the basis of the preset adjusted amounts of Δfr.

In FIG. 25(C), the conductive part 73 of the adjustment electrode 912A in the bending area 91 has been cut, the adjustment electrodes 912A and 912B are insulated from the drive electrode 911A, and the conductive part 73 of the adjustment electrode 932A in the bending area 93 has also been cut, whereby the adjustment electrodes 932A and 932B are insulated from the drive electrode 931A. FIG. 25 shows only an example of selecting the adjustment electrodes in the bending areas 91 and 93 that correspond to the forward mode, but the result is the same in the bending areas 92 and 94.

In the present embodiment, similar to the fifth embodiment, the drive electrodes 911A, 921A, 931A, and 941A are provided, so an imbalance of expansion and contraction is maintained in the piezoelectric element 52 on both sides of the vibrator 555 in the width direction, and bending vibration can be reliably induced to form the elliptical trajectories E1 and E2 in the protuberances 57.

According to the present embodiment, the same effects as those described in the fifth embodiment are obtained.

Seventh Embodiment

Next, the seventh embodiment of the present invention will be described. The electrodes of the vibrators in the fourth through sixth embodiments are generally divided into five parts, but the electrode of the vibrator in the present embodiment is generally divided into four parts.

Figure 26:
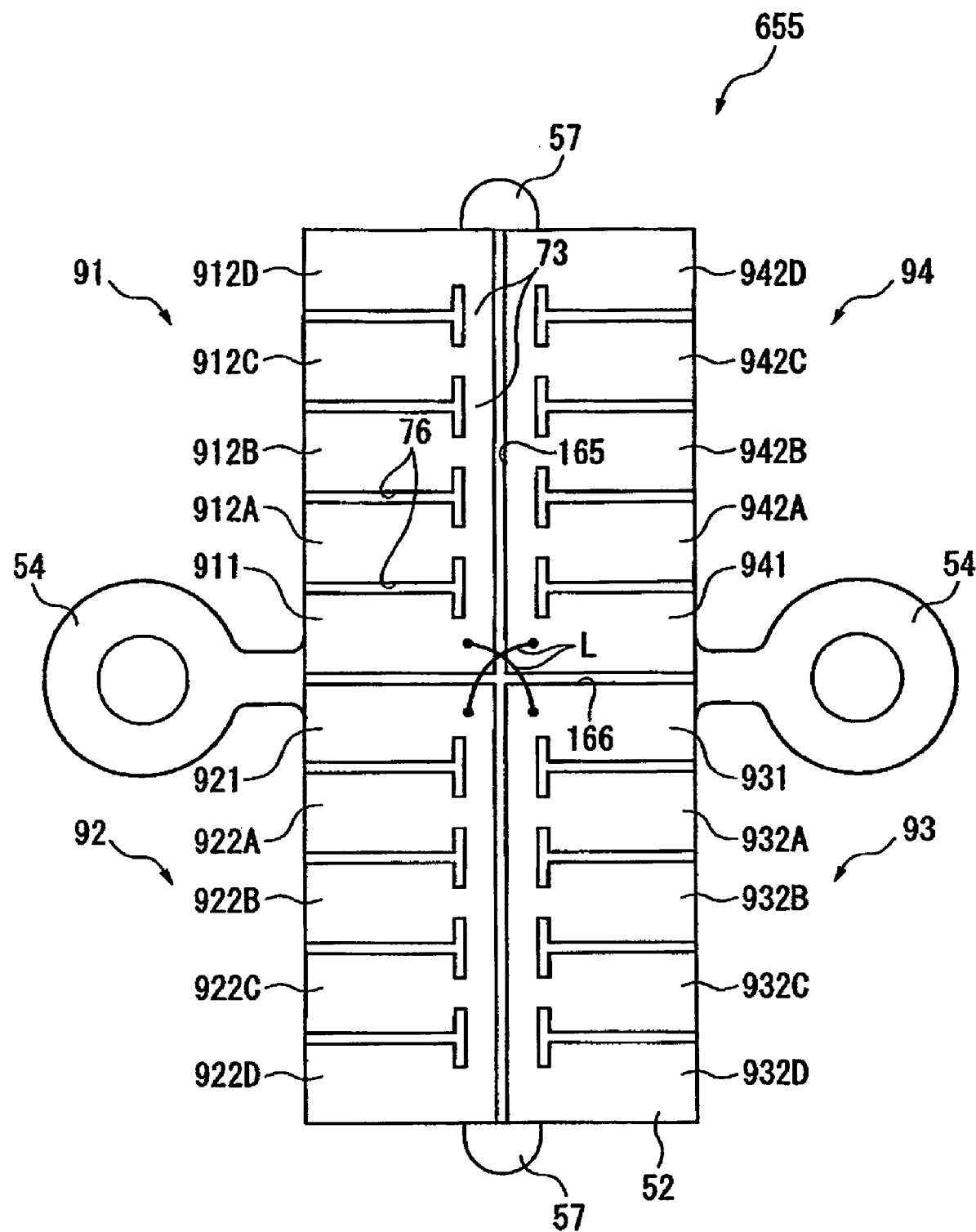
FIG. 26 is a plan view showing the piezoelectric actuator in the seventh embodiment of the present invention.

FIG. 26 is a plan view of a vibrator 655 in the present embodiment. The electrode of the vibrator 655 is divided into four equal parts by grooves 165 and 166 running lengthwise and crosswise, forming the bending areas 91 through 94.

Drive electrodes and adjustment electrodes are formed in the bending areas 91 through 94 similar to the fourth embodiment, and, using the bending area 91 as an example, one drive electrode 911 and four adjustment electrodes 922A through 922D are formed.

In this vibrator 655, similar to the previous descriptions, a rotor or another such driven object can be driven in the forward direction by applying voltage to the bending areas 91 and 93, and the rotor or another such driven object can be rotated in the reverse direction by applying voltage to the bending areas 92 and 94.

Figure 27:
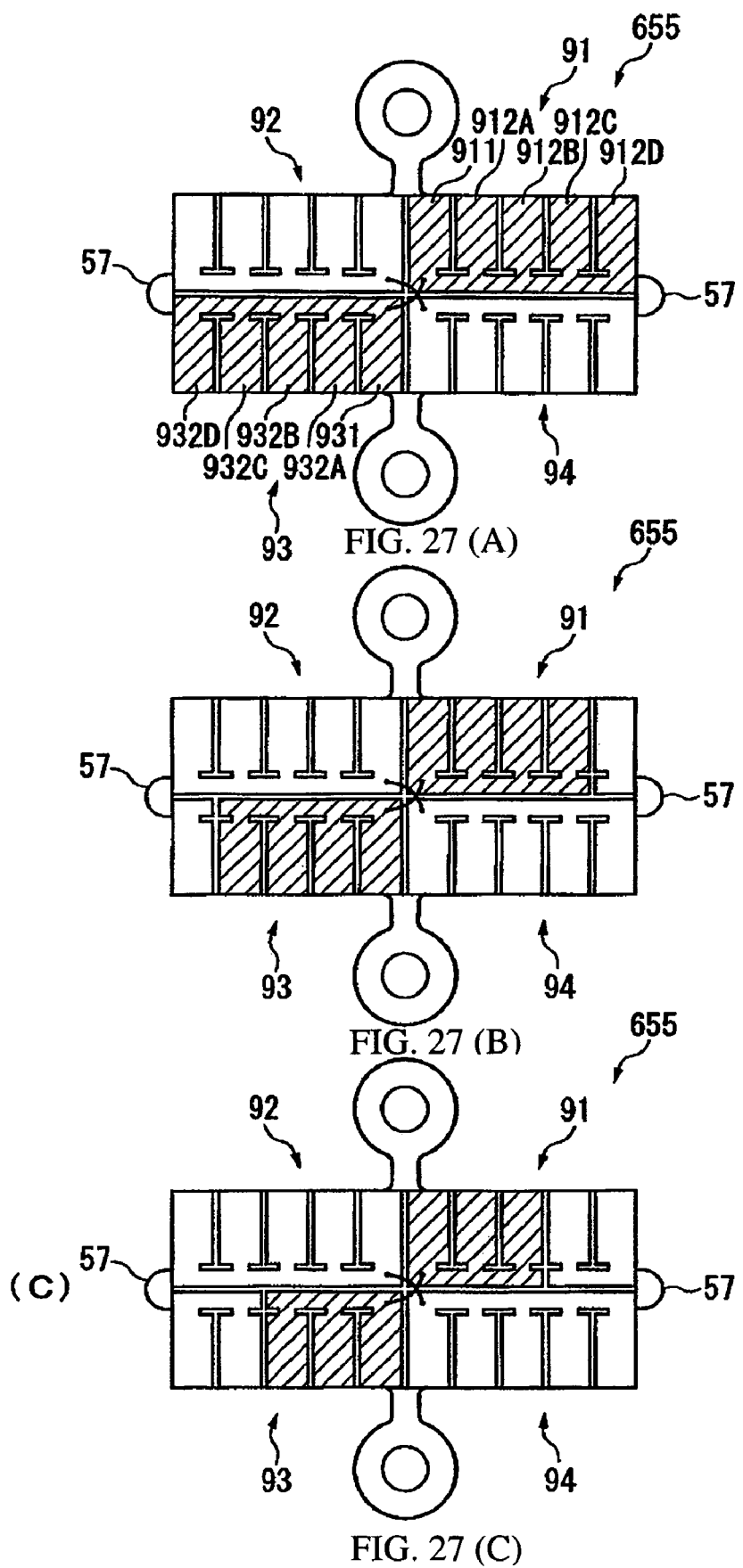
FIG. 27 is a diagram showing an example of adjusting the characteristic frequencies of the vibrator in the same embodiment.

FIG. 27 shows an example of adjusting the characteristic frequencies of the vibrator 655. In this case, similar to the previous descriptions, the necessary number of adjustment electrodes 912A through 912D and the like are insulated from the drive electrodes 911 and the like on the basis of the Δfr adjustment, and Δfr in the forward mode and Δfr in the reverse mode are made to substantially coincide. Nonuniformities in the drive properties in the forward and reverse modes can thereby be corrected.

According to the present embodiment, the same effects as those described in the fourth embodiment are obtained.

Eighth Embodiment

Next, the eighth embodiment of the present invention will be described. The present embodiment involves applying the method of dividing adjustment electrodes shown in the sixth embodiment to a vibrator in which the electrode is divided into approximately four areas, similar to the seventh embodiment.

Figure 28:
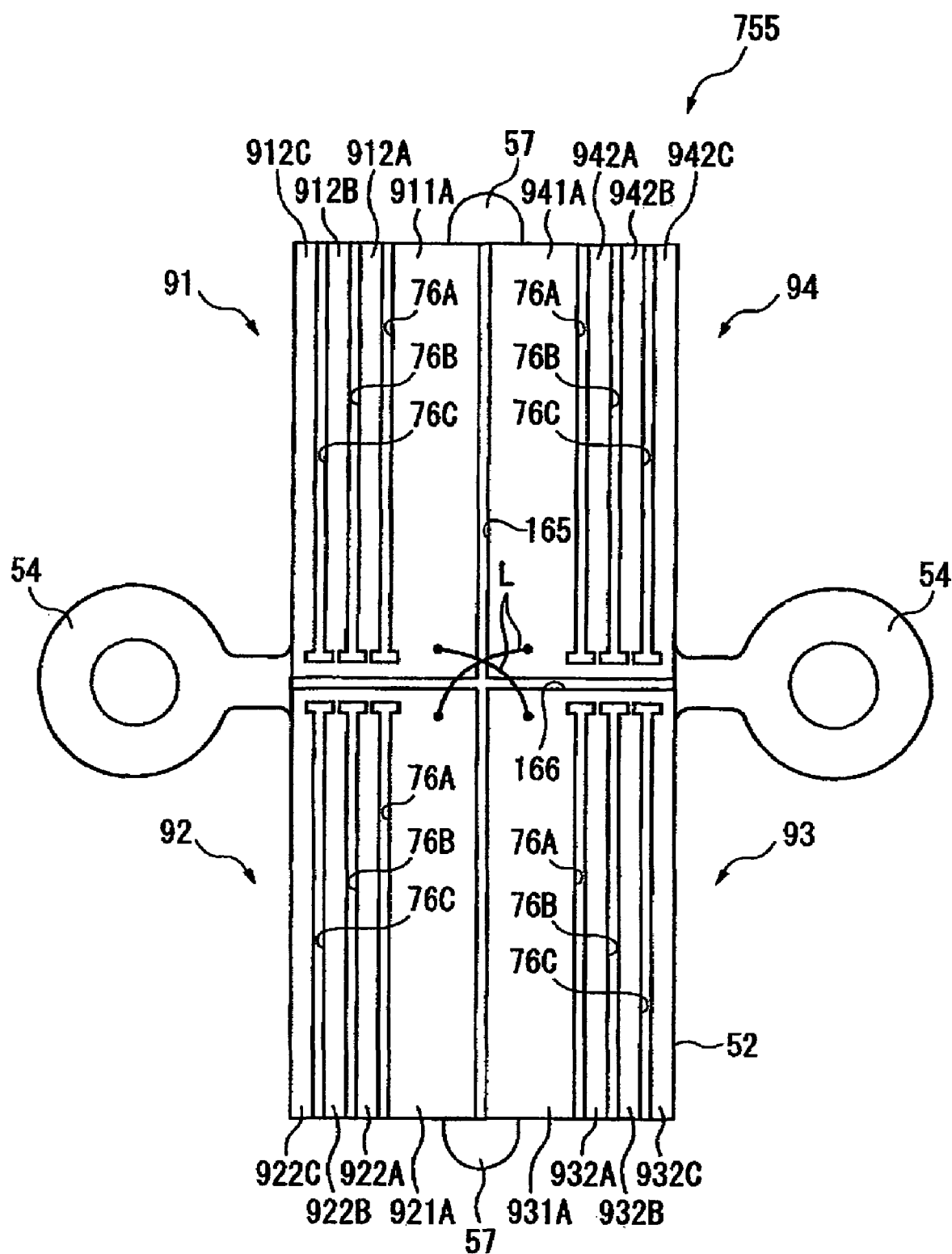
FIG. 28 is a plan view showing the piezoelectric actuator in the eighth embodiment of the present invention.

FIG. 28 is a plan view of a vibrator 755. In the bending areas 91 through 94 of the vibrator 755, three T-shaped grooves 76A, 76B, and 76C near the grooves 166 are formed extending from each end of the vibrator 555 in the longitudinal direction, and the spaces between the T-shaped grooves 76A and the grooves 165 constitute drive electrodes 911A, 921A, 931A, and 941A. Also, three adjustment electrodes 912A, 912B, 912C, and the like are disposed adjacent to each of these drive electrodes 911A etc.

The adjustment of the characteristic frequencies in the vibrator 755 is substantially similar to the sixth embodiment, and a description thereof is omitted. In the vibrator 755 of the present embodiment, drive electrodes 911A, 921A, 931A, and 941A of greater width than the vibrator in the fourth through sixth embodiments are provided. Therefore, the degree of imbalance in the expansion and contraction in the piezoelectric element 52 on both sides of the vibrator 755 in the width direction can be increased, and bending vibration can be reliably induced.

(Modifications)

The present invention is not limited to the embodiments described above. Specifically, the present invention is particularly illustrated and described primarily with respect to the specified embodiments, but those skilled in the art can make various modifications to the shapes, materials, amounts, and other specific features of the embodiments described above without deviating from the scope of the technological ideas and objects of the present invention.

For example, in the first and second embodiments, the conductive parts 63 and 73 were cut by Joule heat based on electric conduction to the conductive parts 63 and 73, but the method for cutting the conductive parts is not limited thereto.

Figure 29:
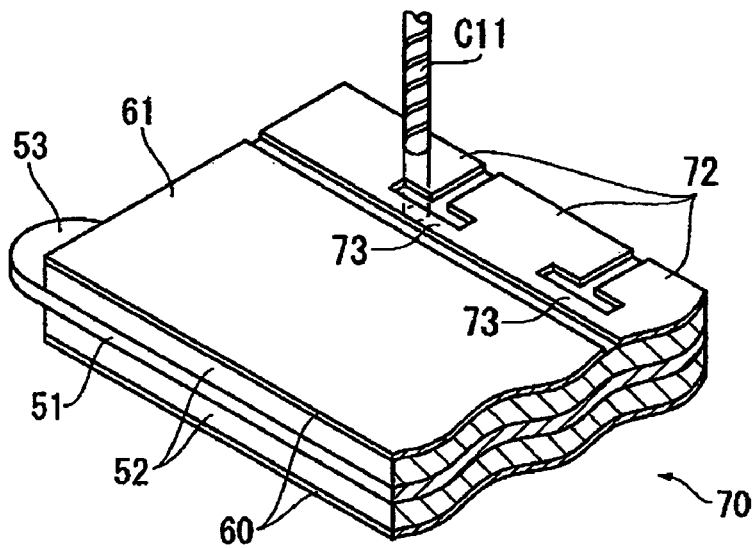
FIG. 29 is a diagram showing three methods for cutting the conductive parts in modifications of the present invention.
Figure 29:
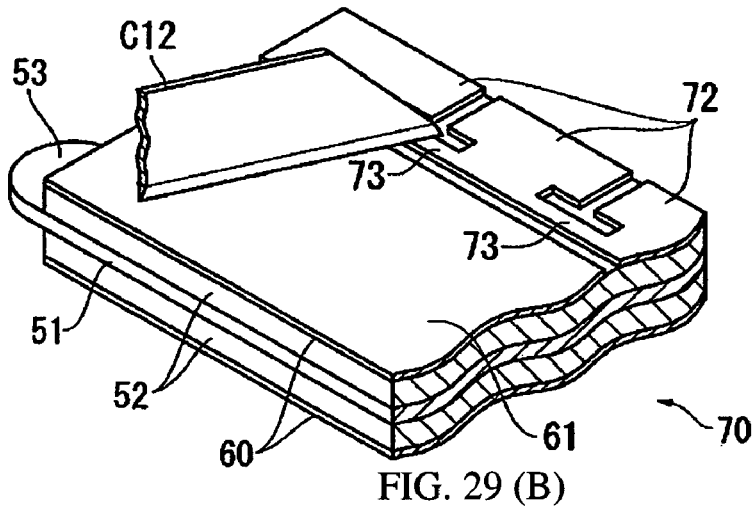
Figure 29:
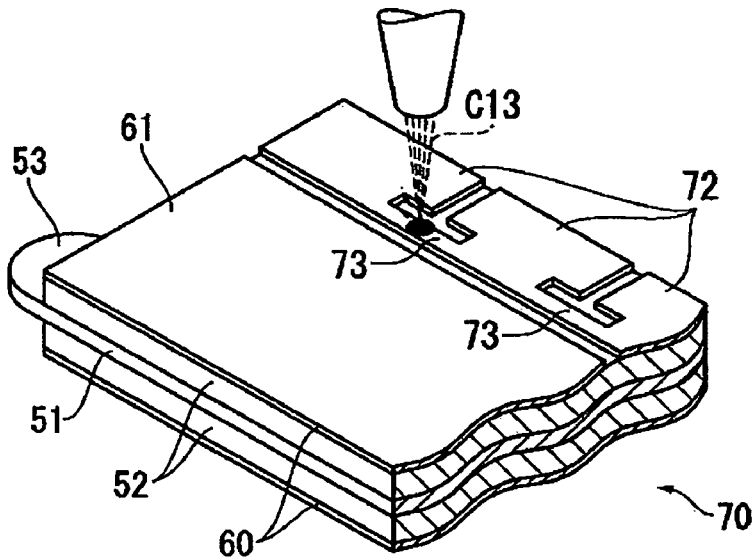

FIGS. 29(A) through (C) show three examples of methods for cutting the conductive parts 73. The conductive parts 73 are cut with a small end mill C11 in (A), with an ultrasonic cutter C12 in (B), and with a laser C13 in (C). In addition, it is also possible to cut the conductive parts 73 by sandblasting, with a grindstone, or with a cutting tool. With any of these methods, the cycle time can be shortened and equipment expenditures can be reduced because it is possible to cut only the portion of the electrodes 60 on the surface of the vibrator 70. Using the laser C13 has advantages of being able to cut the conductive parts 73 without contact.

Possible examples of the type of laser C13 that can be used include a YAG laser, an excimer laser, a femtosecond laser, or the like. If an excimer laser is used, the heat damage to the vibrator 70 can be greatly reduced.

Also, when a plurality of adjustment electrodes are aligned in a specific direction and the adjustment electrodes and the drive electrodes are insulated by cutting the conductive parts, the method of ensuring conduction between the adjustment electrodes and the drive electrodes is not limited to those of the second and third embodiments.

Figure 30:
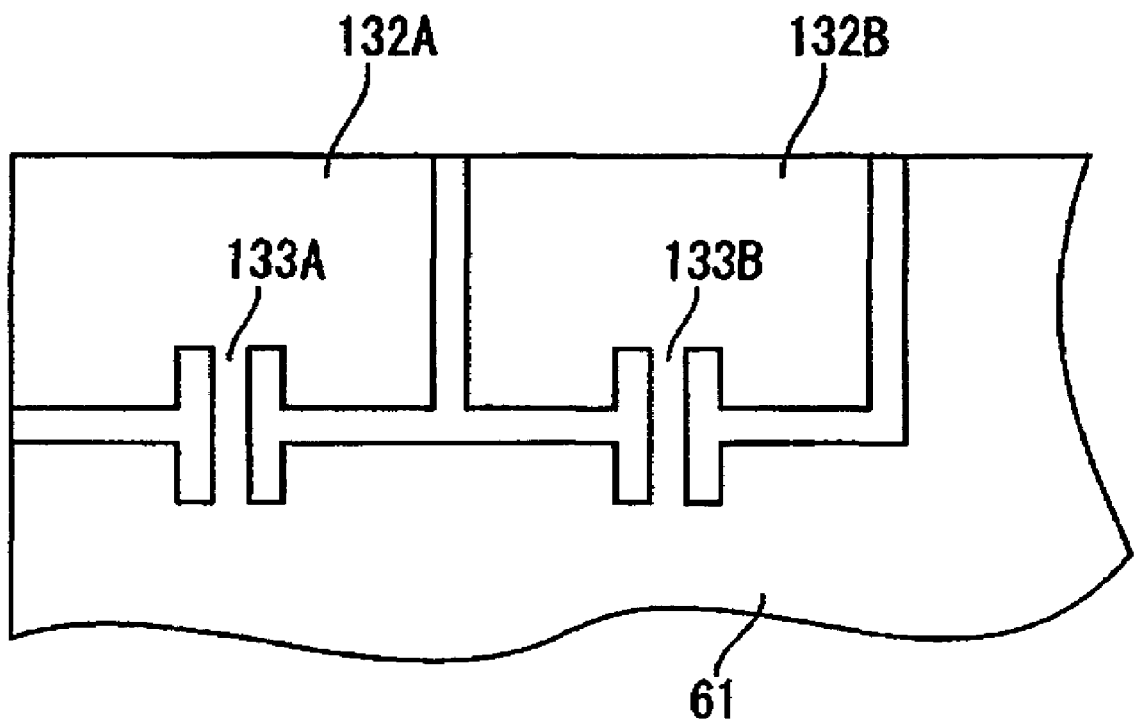
FIG. 30 is a diagram showing a case in which a plurality of adjustment electrodes are connected in parallel with a drive electrode and a case in which they are connected in series in modifications of the present invention.
Figure 30:
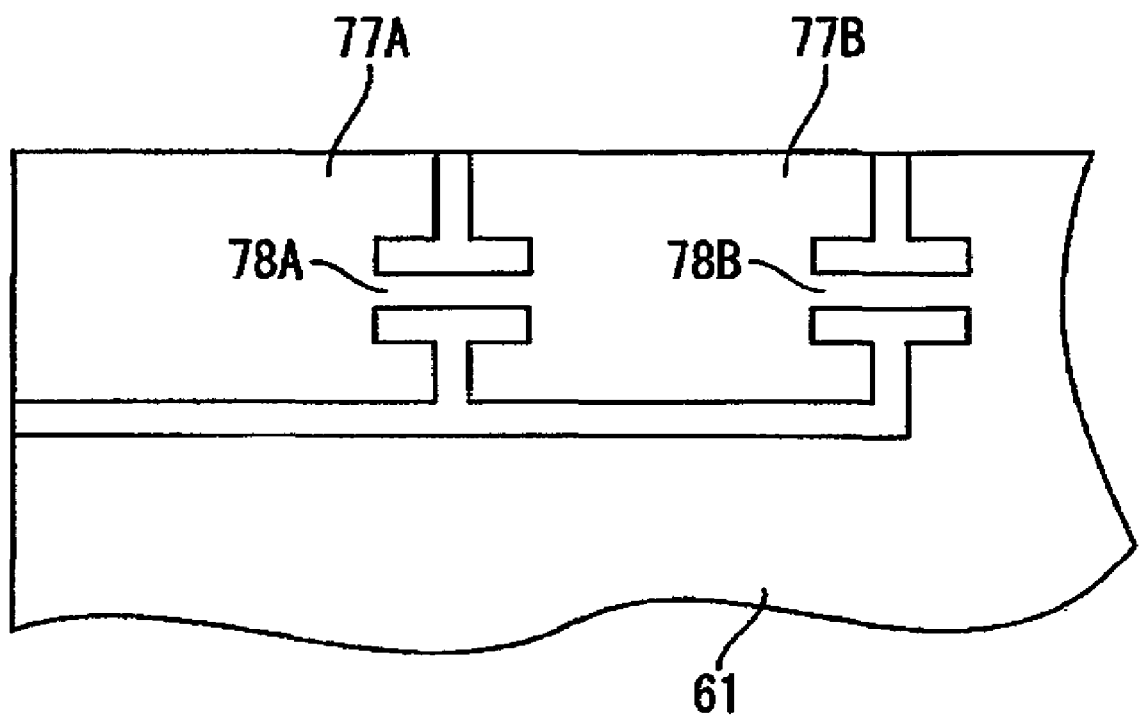

FIG. 30 shows the method of ensuring conduction between a plurality of adjustment electrodes and a drive electrode, and in FIG. 30(A), two adjustment electrodes 132A and 132B have conductive parts 133A and 133B at positions adjacent to the drive electrode 61. Thus, the adjustment electrodes 132A and 132B and the drive electrode 61 can be connected in parallel (in series). In this configuration, since the adjustment electrodes 132A and 132B are both connected to the drive electrode 61, the two conductive parts 133A and 133B must be cut when the two adjustment electrodes 132A and 132B are insulated from the drive electrode 61.

Also, FIG. 30(B) shows an example in which two adjustment electrodes 77A and 77B are connected serially (in series) with the drive electrode 61. In this example, one adjustment electrode 77B has a conductive part 78B at a position adjacent to the drive electrode 61, and the other adjustment electrode 77A has a conductive part 78A at a position adjacent to the adjustment electrode 77B. This configuration is similar to that of the conductive parts 73A through 73C in the second embodiment. Such a serial connection has advantages in that the conductive part 78B need only be cut in one location when the two adjustment electrodes 77A and 77B are insulated from the drive electrode 61.

Also, the structure for supporting the piezoelectric vibrator is not limited to the previous embodiments.

Figure 31:
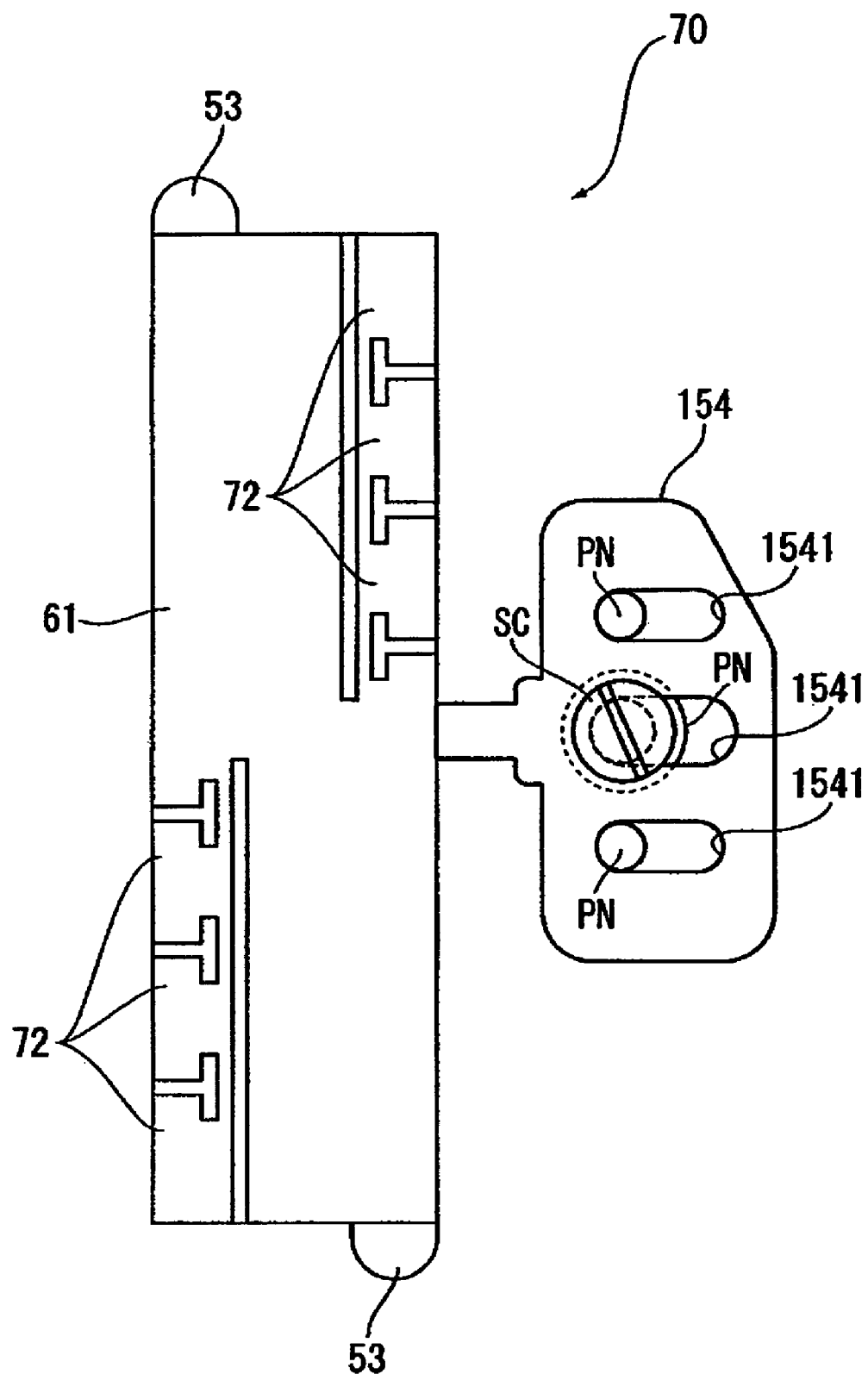
FIG. 31 is a diagram showing the structure for supporting the piezoelectric vibrator in a modification of the present invention.

The vibrator 70 shown in FIG. 31 is configured by stacking a piezoelectric element and a reinforcing plate (refer to FIG. 4), similar to the first embodiment, and has three long holes 1541 that correspond to three pins PN protruding from the main plate 23 and are formed in the arm 154 of the reinforcing plate. These long holes 1541 extend in the longitudinal direction of the vibrator 70, and the major axes of the long holes 1541 all run in the width direction of the vibrator 70. A screw SC is inserted through one of the long holes 1541, and this screw SC is threaded through a screw hole formed in the pin PN.

Since the vibrator 70 is supported and fixed in place in portions of the long holes 1541, the fixed positions of the vibrator 70 can be moved in the direction of the major axes of the long holes 1541 in relation to the pins PN. FIG. 31 shows a state with the smallest possible distance between the pins PN and the vibrator 70, and in FIG. 31, the vibrator 70 can be moved to the left and fixed in place farther away from the pins PN. As the distance between the pins PN and the vibrator 70 grows smaller, bending vibration is restricted and the characteristic frequency of bending vibration increases. Specifically, it is believed that since the characteristic frequencies of the vibrator 70 can be varied and adjusted by changing the fixed positions, the characteristic frequencies mentioned herein can be adjusted in addition to the characteristic frequencies described in the previous embodiments.

Figure 32:
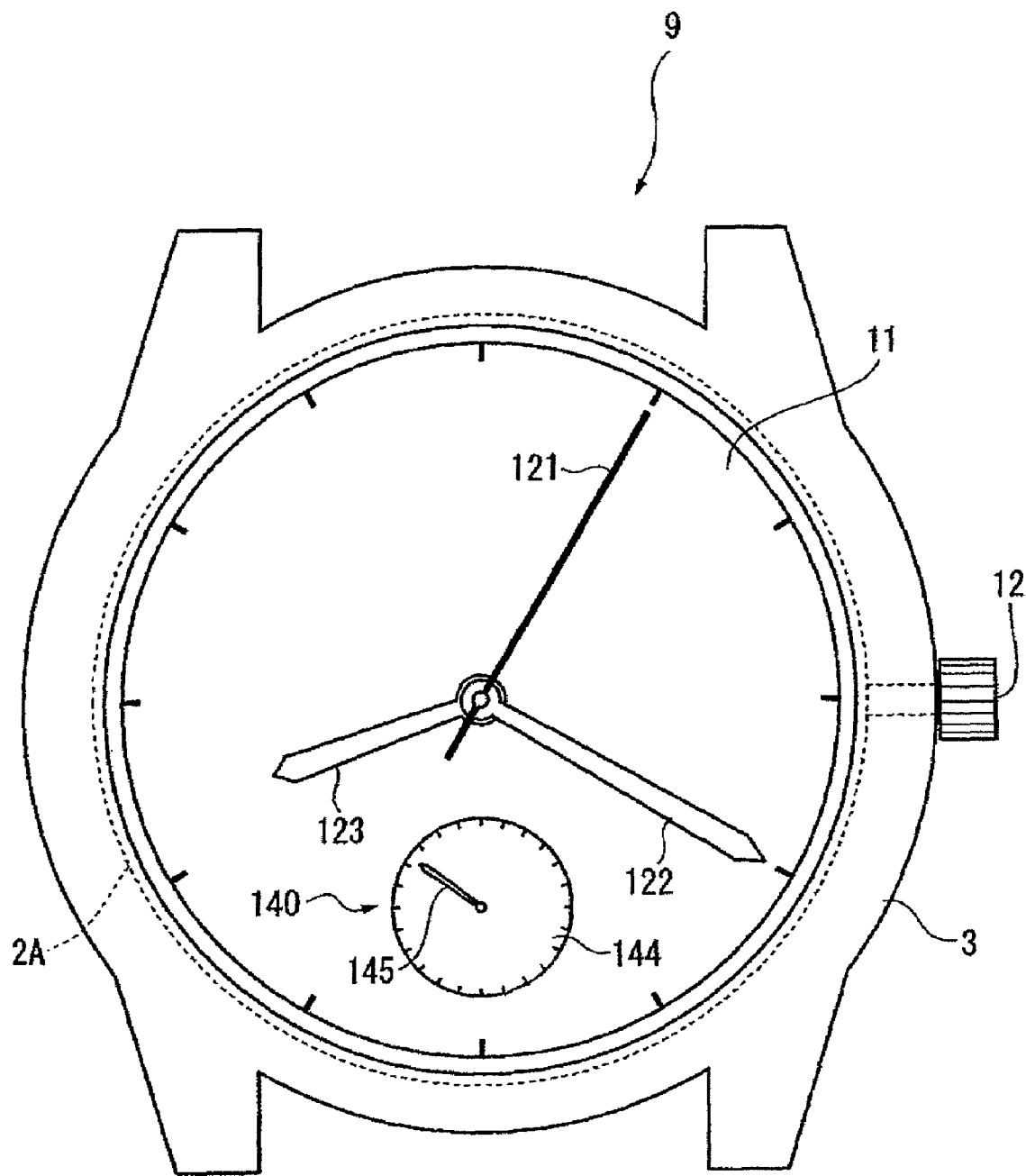
FIG. 32 is an external view of a timepiece in a modification of the present invention.
Figure 33:
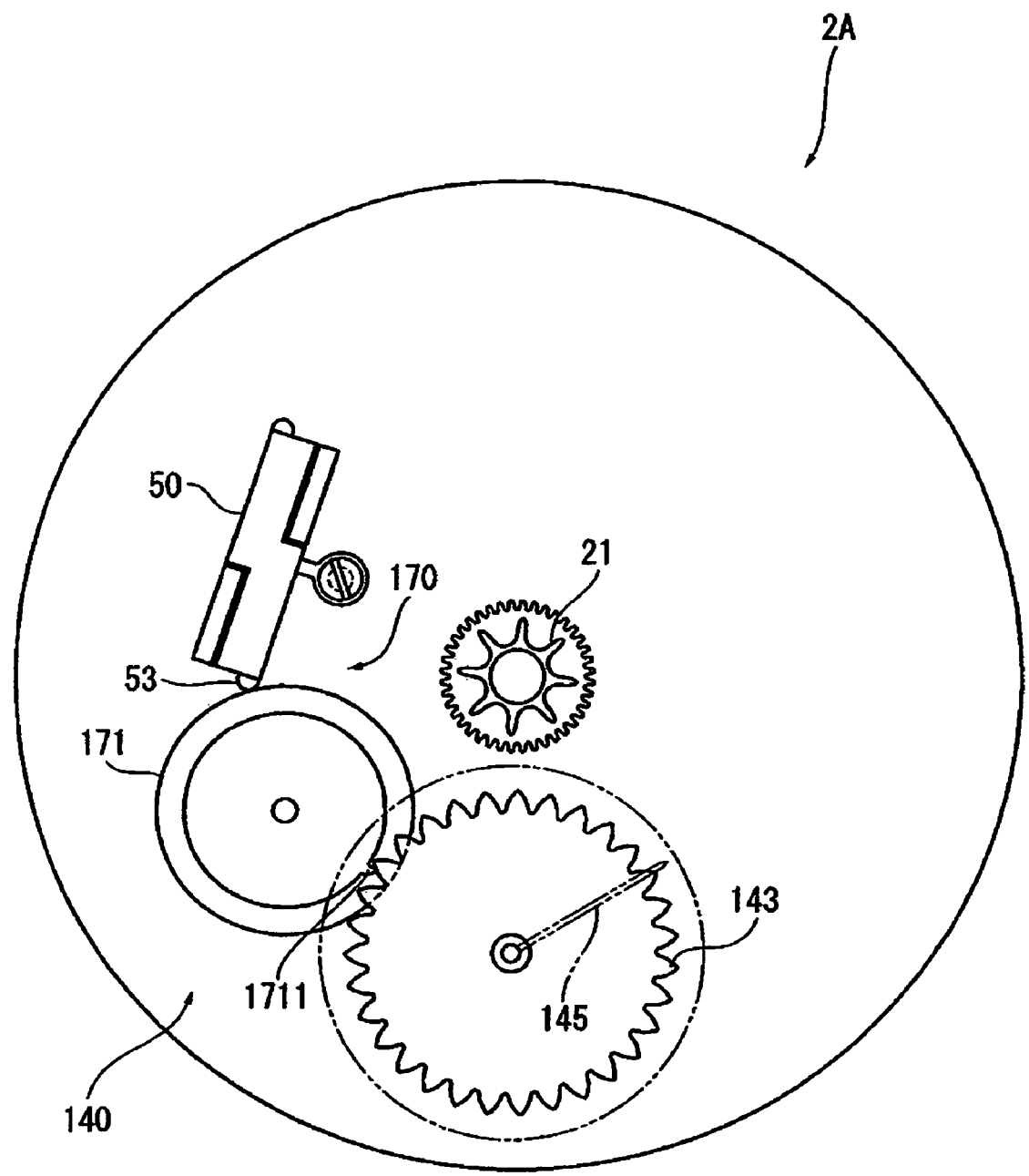
FIG. 33 is a plan view showing a piezoelectric actuator incorporated into the movement of the timepiece in the same modification.

Next, in another modification of the present invention, a circular display unit 144 is provided to the dial 11 in the timepiece 9 shown in FIG. 32, and a calendar is displayed by the rotation of a date hand 145 in the display unit 144. This calendar display uses a different system than the display having the ring-shaped date indicator 33 in the timepiece 1 of the first embodiment, but a date display device 140 including an actuator 170 substantially similar to the actuator 40 in the first embodiment is incorporated into the movement 2A of the timepiece 9, as shown in FIG. 33. In FIG. 33, the reference numeral 21 indicates an hour wheel.

The date display device 140 is configured from a display unit 144 (FIG. 32) and date hand 145, as well as a date indicator 143 on which the date hand 145 is mounted, and an actuator 170 for driving the date indicator 143.

The date indicator 143 is a gear (31 teeth) that rotates once every 31 days, and the date hand 145 is mounted on the axis thereof.

The actuator 170 is configured from a rotor 171 for driving the date indicator 143, and a vibrator 50 similar to the first embodiment.

The rotor 171 is a diskoid rotating member disposed between the date indicator 143 and the vibrator 50 that is turned with the change of the date, and has a turning pawl 1711 that turns the date indicator 143 by one tooth each day. A protuberance 53 of the vibrator 50 is in contact with the outer periphery of the rotor 171, whereby the vibration of the vibrator 50 is transmitted.

In this date display device 140, similar to the previous descriptions, a plurality of modes involving both longitudinal vibration and bending vibration are induced in the vibrator 50, and the rotor 171 is repeatedly pressed by part of the elliptical trajectory of the protuberance 53, whereby the rotor 171 rotates in a specific direction. The date indicator 143 is then turned one tooth every day by the rotation of the rotor 171, and the date hand 145 sequentially indicates gradations 941 in the display unit 144 (FIG. 1), whereby the date is displayed.

In the previous embodiments, the piezoelectric vibrator had a rectangular plate shape, but the shape is not limited to a rectangle, and may be a trapezoid or a parallelogram, and is also not limited to a plate, and may be a rod or a pillar.

Furthermore, in the previous embodiments, piezoelectric elements 52 were provided to both sides of the reinforcing plate 51, but another possibility is to provide a piezoelectric element 52 to only one side of the reinforcing plate 51. It is then possible to provide adjustment electrodes 62 to only one side, even if piezoelectric elements 52 are provided to both sides of the reinforcing plate 51. Furthermore, the vibrator may be configured from a single piezoelectric element 52 without affixing the piezoelectric element 52 to the reinforcing plate 51.

Also, the sizes and shapes of the adjustment electrodes may be either the same or different when a plurality of adjustment electrodes are provided.

Furthermore, in the second and third embodiments, the plurality of adjustment electrodes 72 and 82 were aligned in the longitudinal direction of the vibrators 70 and 80, but another possibility is to dispose the plurality of adjustment electrodes in alignment in a direction that intersects the longitudinal direction of the vibrators 70 and 80. Aligning the adjustment electrodes in the longitudinal direction of the vibrators 70 and 80 allows greater adjustments to be made.

Also, the plurality of adjustment electrodes need not be aligned in a specific direction as in the previous embodiments. Another possibility, for example, is to dispose the adjustment electrodes at the four corners of the electrode provided to a rectangular piezoelectric element.

As previously described, the number, size, arrangement, and other such features of the adjustment electrodes are suitably determined according to the adjustments of the characteristic frequencies.

In the vibrator shown in the above-described fourth through eighth embodiments, the adjustment electrodes were in a state of conduction with the drive electrode before the characteristic frequencies were adjusted, and the characteristic frequencies were adjusted by electrically cutting off the adjustment electrodes from the drive electrode by cutting the conductive parts, but in the fourth through eighth embodiments, the adjustment method shown in the third embodiment may be applied. In this case, the adjustment electrodes are insulated from the drive electrode before the characteristic frequencies are adjusted, and $\Delta fr$ can be adjusted in the above-described manner by a method in which the adjustment electrodes appropriately selected in view of the adjusted amounts of $\Delta fr$ are made conductive with the drive electrode using a wire, an electrically conductive paste, or the like.

As described in detail above, the characteristic frequencies are adjusted according to whether or not the adjustment electrodes are made conductive with the drive electrode, but the adjustment of characteristic frequencies is not limited to the adjustment example exemplified in the previous embodiments, and various other methods are possible. In the previous embodiments, an example was shown in which $\Delta fr$ as the difference between the resonance frequency of longitudinal vibration and the resonance frequency of bending vibration was adjusted to a specific stipulated value, but the present invention is not limited thereto, and another possibility is to determine the stipulated value for the characteristic frequency of longitudinal vibration and the stipulated value for the characteristic frequency of bending vibration, and to separately adjust the characteristic frequency of longitudinal vibration and the characteristic frequency of bending vibration.

Also, in the case of a piezoelectric vibrator that operates in a plurality of operating modes with different vibration trajectories, the characteristic frequency (specifically, the difference $\Delta fr$ between fr1 and fr2) in either the forward mode or reverse mode was used in the fourth through eighth embodiments as a stipulated value, only the characteristic frequency (the same $\Delta fr$) in the other mode was adjusted, and the characteristic frequencies in both modes were assumed, but the adjustment method is not limited thereto. Specifically, the stipulated value of the characteristic frequency in the forward mode and the stipulated value of the characteristic frequency in the reverse mode may be determined, and the characteristic frequencies of both modes may be separately adjusted using these stipulated values as the targets.

Furthermore, in the fourth through eighth embodiments, the adjustment was performed so as to eliminate the difference in $\Delta fr$ between the forward mode and the reverse mode, but adjustment is not limited to having $\Delta fr$ in both modes coincide, and it is also effective to perform adjustment so that the difference in $\Delta fr$ reaches a specific value, that is, so that a specific difference is achieved between $\Delta fr$ in the forward mode and $\Delta fr$ in the reverse mode.

Furthermore, another possibility is to determine specific $\Delta fr$ stipulated values in both the forward and reverse modes, and to perform adjustment so that $\Delta fr$ reaches the specific stipulated value for each operating mode. Specifically, the vibration characteristics in each operating mode can be adjusted.

The timepiece in the previous embodiments was an electronic timepiece that had a battery, but the timepiece is not limited thereto, and may be configured as a power generating electronic timepiece having a secondary battery and a power generator. The timepiece may also be a solar power generating or heat power generating type.

A timepiece that stores generated electricity in a secondary battery has restrictions in that an excessive electric current cannot be passed in order to avoid voltage loss due to the internal resistance of the capacitor, but the piezoelectric actuator of the present invention can transmit the desired drive properties at a low output, and is therefore suitable as a configuration for a timepiece having a secondary battery.

The piezoelectric vibrator of the present invention can be used widely in piezoelectric actuators, timepieces that have piezoelectric actuators, and cameras and other such electronic devices. Also, a drive mechanism can be configured from a single piezoelectric vibrator, which can be used as an oscillator or the like in an electronic circuit.

This application claims priority to Japanese Patent Application Nos. 2005-034211 and 2005-356637. The entire disclosure of Japanese Patent Application Nos. 2005-034211 and 2005-356637 are hereby incorporated herein by reference.

What is claimed is:

1. A piezoelectric vibrator for driving a driven object comprising:
   a pair of piezoelectric elements having electrodes, the piezoelectric vibrator vibrating by application of voltage to the electrodes:
   a reinforcing plate being configured between the pair of piezoelectric elements; and
   a protuberance being configured at a an end of the reinforcing plate to contact with the driven object,
   the electrodes including a drive electrode to which the voltage is applied and an adjustment electrode being adjacent to the drive electrode,
   the adjustment electrode including a conductive part that is conductive with the drive electrode in a portion adjacent to the drive electrode, the conductive part being cuttable,
   the characteristic frequency being adjusted, if the conductive part is cut.

2. A piezoelectric vibrator for driving a driven object comprising:
   a pair of piezoelectric elements having electrodes, the piezoelectric vibrator vibrating by application of voltage to the electrodes;
   a reinforcing plate being configured between the pair of piezoelectric elements; and
   a protuberance being configured at a an end of the reinforcing plate to contact with the driven object,
   the electrodes including a drive electrode to which the voltage is applied and an adjustment electrode being adjacent to the drive electrode with an interposed space,
   the characteristic frequency being adjusted as a result of providing a conductive member between the drive electrode and the adjustment electrode and establishing conduction between the drive electrode and the adjustment electrode by means of the conductive member.

3. The piezoelectric vibrator according to claim 1, wherein a plurality of adjustment electrodes are provided.

4. The piezoelectric vibrator according to claim 1 or 2, wherein
   the vibration trajectory is switchable among a plurality of mutually differing operating modes,
   the piezoelectric element has a plurality of adjustment areas which are provided for each operating mode and in which voltage application and voltage non-application are switched according to the operating mode,
   the drive electrodes and the adjustment electrodes are provided individually to the adjustment areas, and
   the characteristic frequencies are adjusted in each operating mode.

5. The piezoelectric vibrator according to claim 1 or 2, wherein
   the vibration trajectory is switchable among a plurality of mutually differing operating modes,
   the piezoelectric element has a plurality of adjustment areas which are provided for each operating mode and in which voltage application and voltage non-application are switched according to the operating mode,
   the drive electrodes and the adjustment electrodes are provided individually to the adjustment areas, and
   the difference in characteristic frequencies between the operating modes is adjusted by adjusting the characteristic frequencies.

6. The piezoelectric vibrator according to claim 5, wherein
   the vibrator is substantially rectangular when viewed in a plane and performs longitudinal vibration and bending vibration, and
   the adjustment area corresponding to one operating mode and the adjustment area corresponding to the other operating mode are disposed in line symmetry in relation to a center line running in the longitudinal direction that passes through the centroid of the vibrator.

7. The piezoelectric vibrator according to claim 1, wherein
   the piezoelectric vibrator vibrates in a plurality of vibrating modes, and
   the difference in the resonance frequencies among the plurality of vibrating modes is adjusted by adjusting the characteristic frequencies.

8. The piezoelectric vibrator according to claim 7, wherein
   the piezoelectric vibrator is formed into a plate shape, and
   the piezoelectric vibrator vibrates so that longitudinal vibration and bending vibration are superposed, and
   the difference in resonance frequencies in the longitudinal vibration and the bending vibration is adjusted by adjusting the characteristic frequencies.

9. The piezoelectric vibrator according to claim 8, wherein
   the piezoelectric vibrator is substantially rectangular when viewed in a plane, and
   the adjustment electrodes are provided to diagonal positions in the planar substantial rectangle.

10. The piezoelectric vibrator according to claim 1, wherein
    the conductive part is cut by Joule heat generated when an electric current is passed through the piezoelectric vibrator.

* * * * *